United States Patent
Motomi et al.

[11] Patent Number: 6,156,477
[45] Date of Patent: *Dec. 5, 2000

[54] POLYMERS AND CHEMICALLY AMPLIFIED POSITIVE RESIST COMPOSITIONS

[75] Inventors: Kiyoshi Motomi; Osamu Watanabe; Satoshi Watanabe; Shigehiro Nagura; Toshinobu Ishihara, all of Nakakubiki-gun, Japan

[73] Assignee: Shin-Etsu Chemical Co., Ltd., Japan

[*] Notice: This patent is subject to a terminal disclaimer.

[21] Appl. No.: 09/013,270

[22] Filed: Jan. 26, 1998

[30] Foreign Application Priority Data

Jan. 24, 1997 [JP] Japan ................................ 9-026026

[51] Int. Cl.[7] .................................................. G03F 7/004
[52] U.S. Cl. ...................... 430/270.1; 430/905; 430/910; 526/313
[58] Field of Search ................................ 430/270.1, 905, 430/910; 526/313

[56] References Cited

U.S. PATENT DOCUMENTS

| | | | |
|---|---|---|---|
| 4,845,008 | 7/1989 | Nishioka et al. | 430/165 |
| 5,712,078 | 1/1998 | Huang et al. | 430/270.1 |
| 5,942,367 | 8/1999 | Watanabe et al. | 430/170 |

FOREIGN PATENT DOCUMENTS

| | | |
|---|---|---|
| 62-115440 | 5/1987 | Japan . |
| 63-27829 | 2/1988 | Japan . |
| 2-27660 | 6/1990 | Japan . |
| 3223858 | 10/1991 | Japan . |
| 4211258 | 8/1992 | Japan . |
| 6100488 | 4/1994 | Japan . |

OTHER PUBLICATIONS

JP–A 814660 (English abstract).
JP–A 6100488 (English abstract).
JP–A 4211258 (English abstract).
JP–A 3223858 (English abstract).
JP–A 62115440 (English abstract).
JP–A 6327829 (English abstract).
JP–B 227660 (English abstract).

*Primary Examiner*—John S. Chu
*Attorney, Agent, or Firm*—Millen, White, Zelano & Branigan, P.C.

[57] ABSTRACT

A polymer comprising recurring units of formula (1) is provided wherein some hydrogen atoms of phenolic hydroxyl groups and/or carboxyl groups are replaced by acid labile groups. The polymer is crosslinked with a crosslinking group having a C—O—C linkage resulting from reaction of some of the remaining phenolic hydroxyl groups and/or carboxyl groups with an alkenyl ether compound or halogenated alkyl ether compound. The amount of the acid labile group and the crosslinking group combined is on the average from more than 0 mol % to 80 mol % of the entirety of the phenolic hydroxyl group and carboxyl group. The polymer has Mw of 1,000–500,000.

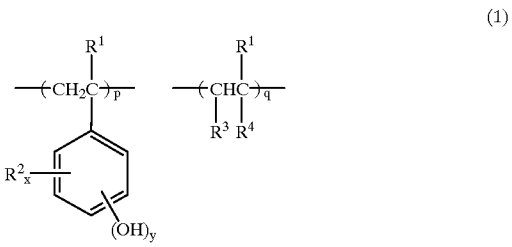

(1)

$R^1$ is H or methyl, $R^2$ is $C_1$–$C_8$ alkyl, $R^3$ is H, $R^4$ is —COOR$^5$, $C_1$–$C_5$ alkyl or phenyl, or $R^3$ and $R^4$, taken together, may form —COOCO—, $R^5$ is H or $C_1$–$C_8$ alkyl, x and y are integers satisfying $x+y \leq 5$, p and q are positive numbers satisfying $p+q=1$ and $0 < q/(p+q) \leq 0.9$. A chemically amplified positive resist composition comprising the polymer as a base resin has high sensitivity and resolution and forms resist patterns having plasma etching resistance, heat resistance, overhang prevention, and dimensional controllability.

24 Claims, No Drawings

POLYMERS AND CHEMICALLY AMPLIFIED POSITIVE RESIST COMPOSITIONS

BACKGROUND OF THE INVENTION

1. Field of the Invention

This invention relates to a polymer having acid labile groups of at least one type and crosslinked with a crosslinking group having a C—O—C linkage within a molecule and/or between molecules. It also relates to a chemically amplified positive resist composition comprising the polymer as a base resin which has a high alkali dissolution contrast before and after exposure, high sensitivity and high resolution and is thus suitable as a fine pattern forming material for use in the manufacture of ultra-LSIs.

2. Prior Art

As the LSI technology tends toward higher integration and higher speed, further refinement of pattern rules is required. Under such circumstances, deep-ultraviolet lithography is regarded promising as the next generation of fine patterning technology. The deep-UV lithography is capable of working on the order of 0.5 $\mu$m or less and makes it possible to form a resist pattern having a side wall nearly perpendicular to the substrate if a less light absorbing resist material is used.

A number of chemically amplified positive working resist materials using acid catalysts were recently developed as disclosed in JP-B 27660/1990, JP-A 27829/1988, U.S. Pat. Nos. 4,491,628 and 5,310,619. They utilize a high illuminance KrF excimer laser as a deep-UV source. Since these materials have high sensitivity, resolution and dry etching resistance, they are promising as resist materials especially suited for deep-UV lithography.

The chemically amplified, positive resist materials being known include those of the two-component system comprising a base resin and a photoacid generator and those of the three-component system comprising a base resin, a photoacid generator, and a dissolution inhibitor having an acid labile group.

JP-A 115440/1987 discloses a resist composition comprising poly-4-tert-butoxystyrene and a photoacid generator. Similarly, JP-A 223858/1991 discloses a two-component system resist composition comprising a resin having a tert-butoxy group in its molecule and a photoacid generator and JP-A 211258/1992 discloses a two-component system resist composition comprising a polyhydroxystyrene containing a methyl, isopropyl, tert-butyl, tetrahydropyranyl or trimethylsilyl group in its molecule and a photoacid generator.

Furthermore, JP-A 100488/1994 proposes a resist composition comprising a polydihydroxystyrene derivative such as poly[3,4-bis(2-tetrahydropyranyloxy)styrene], poly[3,4-bis(tert-butoxycarbonyloxy)styrene], and poly[3,5-bis(2-tetrahydropyranyloxy)styrene] and a photoacid generator.

The base resins used in these resist compositions have an acid labile group in a side chain. If the acid labile group is a strong acid-decomposable one such as a tert-butyl and tert-butoxycarbonyl group, the acid labile group is deactivated through reaction with air-borne basic compounds and becomes unlikely to decompose. Such a resist composition tends to form a pattern having a T-top profile. On the other hand, if the acid labile group is an alkoxyalkyl group such as ethoxyethyl which is decomposable with weak acid, the resist composition is little affected by air-borne basic compounds, but forms a pattern which will become extremely thin with the lapse of time from exposure to heat treatment. The inclusion of a bulky group in a side chain can detract from heat resistance. The composition is less satisfactory in sensitivity and resolution. None of the resist compositions thus far proposed are practically satisfactory. There is a desire to overcome these problems.

Also, a resist composition comprising a (meth)acrylate copolymer is proposed in JP-A 146610/1996 as providing high transparency, firm adhesion to the substrate and improved footing to the substrate. However, resist compositions of this type are less heat resistant.

SUMMARY OF THE INVENTION

Therefore, an object of the invention is to provide a polymer suitable as a base resin of a chemically amplified positive resist composition. Another object of the invention is to provide a chemically amplified positive resist composition comprising the polymer as a base resin which has superior sensitivity, resolution, exposure latitude, process adaptability, and plasma etching resistance to conventional resist compositions and forms a resist pattern having heat resistance.

We have found that a novel polymer bearing at least one acid labile group, crosslinked within a molecule and/or between molecules with a crosslinking group having a C—O—C linkage, and having a weight average molecular weight of 1,000 to 500,000 can be produced by a method to be described later and is useful as a base resin. By blending this novel polymer as a base resin with a photoacid generator and optionally, a dissolution regulator and a basic compound, there is obtained a chemically amplified positive resist composition which is improved in that the dissolution contrast of a resist film is increased, especially a dissolution rate after exposure is increased. By further blending an aromatic compound having a group ≡C—COOH in a molecule, there is obtained a chemically amplified positive resist composition which is improved in that the resist is improved in PED stability and edge roughness on a nitride film substrate is improved. By further blending an acetylene alcohol derivative, the resist composition is improved in coating and storage stability, forms resists having high resolution, improved latitude of exposure, and improved process adaptability, and is well suited for practical use and advantageously used in precise fine patterning, especially in ultra-LSI manufacture.

In a first aspect, the present invention provides a polymer comprising recurring units of the following general formula (1). Some of the hydrogen atoms of phenolic hydroxyl groups and/or carboxyl groups are replaced by acid labile groups of at least one type. The polymer is crosslinked within a molecule and/or between molecules with a crosslinking group having a C—O—C linkage resulting from reaction of some of the remaining phenolic hydroxyl groups and/or carboxyl groups with an alkenyl ether compound or halogenated alkyl ether compound. The amount of the acid labile group and the crosslinking group combined is on the average from more than 0 mol % to 80 mol % of the entirety of the phenolic hydroxyl group and carboxyl group in formula (1). The polymer has a weight average molecular weight of 1,000 to 500,000,

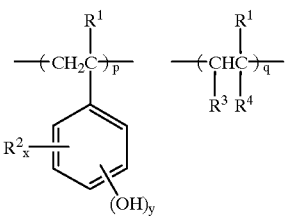

(1)

R¹ is hydrogen or methyl, R² is a normal, branched or cyclic alkyl group of 1 to 8 carbon atoms, R³ is hydrogen, R⁴ is a group —COOR⁵, an alkyl group of 1 to 5 carbon atoms or a halogen or cyano-substituted or unsubstituted phenyl group, or R³ and R⁴, taken together, may form —COOCO—, R⁵ is hydrogen or a normal, branched or cyclic alkyl group of 1 to 8 carbon atoms, letter x is 0 or a positive integer, y is a positive integer, the sum of x+y is up to 5, letters p and q are positive numbers satisfying p+q=1 and 0<q/(p+q)≦0.9.

In one preferred embodiment, the polymer is defined as comprising recurring units of the following general formula (2). The polymer is crosslinked within a molecule and/or between molecules with a crosslinking group having a C—O—C linkage resulting from reaction of some of the phenolic hydroxyl groups and/or carboxyl groups represented by R with an alkenyl ether compound or halogenated alkyl ether compound. The amount of the acid labile group and the crosslinking group combined is on the average from more than 0 mol % to 80 mol % of the entirety of the phenolic hydroxyl group and carboxyl group in formula (1). The polymer has a weight average molecular weight of 1,000 to 500,000.

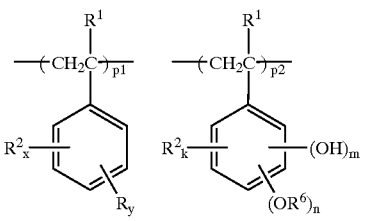

(2)

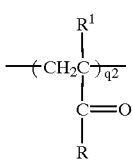

R is a hydroxyl group or OR⁶, at least one of R groups is a hydroxyl group, R¹ is hydrogen or methyl, R² is a normal, branched or cyclic alkyl group of 1 to 8 carbon atoms, R³ is hydrogen, R⁴ is a group —COOR⁵, an alkyl group of 1 to 5 carbon atoms or a halogen or cyano-substituted or unsubstituted phenyl group, or R³ and R⁴, taken together, may form —COOCO—, R⁵ is hydrogen or a normal, branched or cyclic alkyl group of 1 to 8 carbon atoms, R⁶ is an acid labile group, letter x is 0 or a positive integer, y is a positive integer, the sum of x+y is up to 5, letters k and m are 0 or positive integers, n is a positive integer, the sum of k+m+n is up to 5, letters p1 and p2 are positive numbers, q1 and q2 are 0 or positive numbers, q1 and q2 are not equal to 0 at the same time, and p1, p2, q1 and q2 satisfy 0<p1/(p1+p2+q1+q2)<0.8, 0<p2/(p1+p2+q1+q2)<0.8, 0<p2/(p1+q2)/(p1+p2+q1+q2)<0.8, and p1+p2+q1+q2=1.

In a further preferred embodiment, the polymer is defined as comprising recurring units of the following general formula (3). Some hydrogen atoms are eliminated from phenolic hydroxyl groups and/or carboxyl groups represented by R to leave oxygen atoms which are crosslinked with a crosslinking group having a C—O—C linkage of the following general formula (4a) or (4b) within a molecule and/or between molecules. The amount of the acid labile group and the crosslinking group combined is on the average from more than 0 mol % to 80 mol % of the entirety of the phenolic hydroxyl group and carboxyl group in formula (1). The polymer has a weight average molecular weight of 1,000 to 500,00,

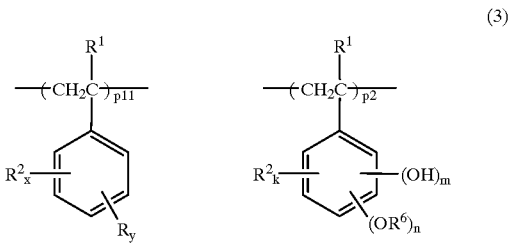

(3)

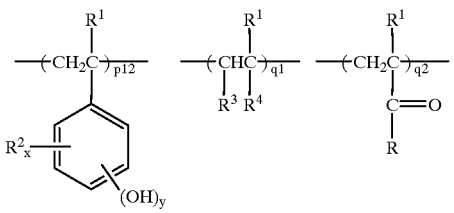

R is a hydroxyl group or OR⁶, R¹ is hydrogen or methyl, R² is a normal, branched or cyclic alkyl group of 1 to 8 carbon atoms, R³ is hydrogen, R⁴ is a group —COOR⁵, an alkyl group of 1 to 5 carbon atoms or a halogen or cyano-substituted or unsubstituted phenyl group, or R³ and R⁴, taken together, may form —COOCO—, R⁵ is hydrogen or a normal, branched or cyclic alkyl group of 1 to 8 carbon atoms, R⁶ is a group of the following general formula (5), a group of the following general formula (6), a tertiary alkyl group of 4 to 20 carbon atoms, a trialkylsilyl group whose alkyl groups each have 1 to 6 carbon atoms or an oxoalkyl group of 4 to 20 carbon atoms, letters p11, p12 and p2 are positive numbers, q1 and q2 are 0 or positive numbers, q1 and q2 are not equal to 0 at the same time, and p11, p12, p2, q1 and q2 satisfy 0<p11/(p11+p12+p2+q1+q2)<0.8, 0<p2/(p11+p12+p2+q1+q2)<0.8, 0<(p11+p12+q2)/(p11+p12+p2+q1+q2)<0.8, and p11+p12+p2+q1+q2=1, letter x is 0 or a positive integer, y is a positive integer, the sum of x+y is up to 5, letters k and m are 0 or positive integers, n is a positive integer, the sum of k+m+n is up to 5.

(4a)

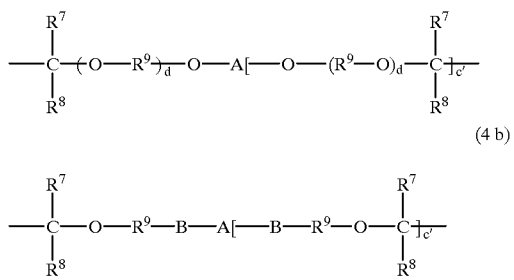

(4b)

R$^7$ and R$^8$ each are hydrogen or a normal, branched or cyclic alkyl group of 1 to 8 carbon atoms, or R$^7$ and R$^8$, taken together, may form a ring, with the proviso that each of R$^7$ and R$^8$ is a normal or branched alkylene group of 1 to 8 carbon atoms when they form a ring, R$^9$ is a normal or branched alkylene group of 1 to 10 carbon atoms, letter d is 0 or an integer of 1 to 10, A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c is an integer of 2 to 8, and c' is an integer of 1 to 7.

(5)

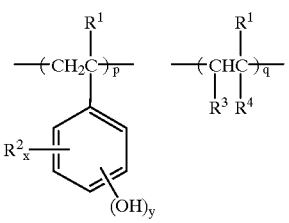

(6)

—(CH$_2$)$_a$—C—OR$^{13}$
         ‖
         O

R$^{10}$ and R$^{11}$ each are hydrogen or a normal, branched or cyclic alkyl group of 1 to 8 carbon atoms, R$^{12}$ is a monovalent hydrocarbon group of 1 to 18 carbon atoms which may have a hetero atom, or R$^{10}$ and R$^{11}$, R$^{10}$ and R$^{12}$, or R$^{11}$ and R$^{12}$, taken together, may form a ring, with the proviso that each of R$^{10}$, R$^{11}$ and R$^{12}$ is a normal or branched alkylene group of 1 to 18 carbon atoms when they form a ring, R$^{13}$ is a tertiary alkyl group of 4 to 20 carbon atoms, a trialkylsilyl group whose alkyl groups each have 1 to 6 carbon atoms, an oxoalkyl group of 4 to 20 carbon atoms or a group of formula (5), and letter a is an integer of 0 to 6.

Preferably, the crosslinking group having a C—O—C linkage represented by the general formula (4a) or (4b) is represented by the following general formula (4a''') or (4b'''):

(4a''')

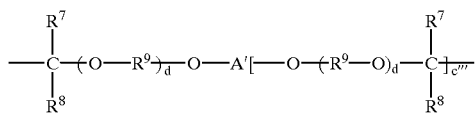

(4b''')

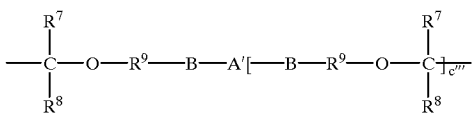

wherein R$^7$ and R$^8$ each are hydrogen or a normal, branched or cyclic alkyl group of 1 to 8 carbon atoms, or R$^7$ and R$^8$, taken together, may form a ring, with the proviso that each of R$^7$ and R$^8$ is a normal or branched alkylene group of 1 to 8 carbon atoms when they form a ring, R$^9$ is a normal or branched alkylene group of 1 to 10 carbon atoms, letter d is 0 or an integer of 1 to 5, A' is a c''-valent normal or branched alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or fluorine atom, B is —CO—O—, —NCHO—O— or —NHCONH—, letter c'' is an integer of 2 to 4, and c''' is an integer of 1 to 3.

In a second aspect, the present invention provides a chemically amplified positive resist composition comprising (A) an organic solvent,
(B) a base resin in the form of the polymer defined above, and
(C) a photoacid generator.

The resist composition may further contain (D) another base resin in the form of a polymer comprising recurring units of the following general formula (1), some of the hydrogen atoms of phenolic hydroxyl groups and/or carboxyl groups being replaced by acid labile groups of at least one type in an average proportion of 0 mol % to 80 mol % of the entirety, said polymer having a weight average molecular weight of 3,000 to 300,000, (1)

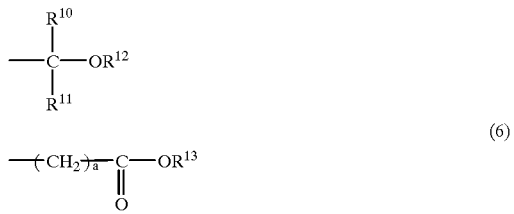

wherein R$^1$, R$^2$, R$^3$, R$^4$, x, y, p and q are as defined above.

The resist composition may further contain at least one of (E) a dissolution regulator, (F) a basic compound, (G) an aromatic compound having a group: ≡C—COOH in a molecule, (H) a UV absorber, and (I) an acetylene alcohol derivative.

When the polymer defined above is blended in a resist composition as a base resin, advantages of a significant dissolution inhibitory effect and a greater dissolution contrast after exposure are obtained especially by virtue of the crosslinking through a crosslinking group having a C—O—C linkage.

In the case of a polymer having an alkoxyalkyl group attached simply to a side chain, formation of a T-top profile is avoided because deblocking reaction takes place with weak acid. However, since that polymer is sensitive to acid, the pattern configuration is significantly thinned with the lapse of time from exposure to heat treatment. Since the alkali dissolution inhibitory effect is low, a high substitution product must be used to insure dissolution contrast at the sacrifice of heat resistance. On the other hand, a polymer wherein a phenolic hydroxyl group on a side chain is protected with a tert-butoxycarbonyl group, when blended in a resist material, has advantages that the alkali dissolution inhibitory effect is improved, a high dissolution contrast is obtained with a low degree of substitution, and heat resistance is good. In order to eliminate the protective group to render the polymer alkali soluble, a photoacid generator capable of generating a strong acid such as trifluoromethanesulfonic acid is necessary. The use of such acid leads to the undesirable tendency to form a T-top profile.

In contrast to these polymers, a polymer crosslinked within a molecule and/or between molecules with a crosslinking group having a C—O—C linkage as obtained by reacting some phenolic hydroxyl groups and/or carboxyl groups with an alkenyl ether compound or halogenated alkyl ether compound is advantageous in that a resist composition having the crosslinked polymer blended therein overcomes the drawback of low heat resistance of a polymer comprising (meth)acrylate units in its backbone and having a side chain protected with an acetal group and the drawback of T-top profile forming tendency of a polymer protected with a tert-butoxycarbonyl group.

The polymer used in the chemically amplified positive resist composition according to the invention has further advantages. Since the inventive polymer is crosslinked with a crosslinking group having an acid labile C—O—C linkage and protected with an acid labile group, unexposed areas of a resist film remain unchanged with respect to weight average molecular weight and solubility in alkaline developer whereas the weight average molecular weight of exposed areas is restored to the weight average molecular weight of alkali soluble base resin prior to the protection with the crosslinking and acid labile groups, through decomposition by the generated acid and further through elimination of the acid labile group. Then the rate of alkali dissolution in the exposed areas is significantly increased as compared with the unexposed areas, resulting in an increased dissolution contrast. As a consequence, high resolution is achieved.

When a crosslinking group having a C—O—C linkage is decomposed with an acid, alcohol compounds (including diol, triol and polyol compounds) are formed. Hydrophilic groups of the alcohol compounds improve affinity to alkali developer. As a consequence, high resolution is achieved.

Further, on the design of a resist composition, a variety of polymers having a varying alkali dissolution rate are required so as to comply with the type and amount of a particular photoacid generator and additive. It is also required to prepare such a polymer in a reproducible manner. The use of the inventive polymer allows a freedom of design by eliminating the limit on the selection of an acid labile group and crosslinking group and the limit on a degree of substitution.

More specifically, a chemically amplified positive resist composition using the inventive polymer as a base resin minimizes the problems of T-top profile forming tendency, pattern configuration thinning and low heat resistance found in the prior art and increases the dissolution contrast of a resist film. As a consequence, the chemically amplified positive resist composition has high sensitivity, high resolution, allows the size and configuration of a pattern to be controlled in terms of composition, and offers improved process adaptability and reproducibility.

DETAILED DESCRIPTION OF THE INVENTION

Polymer

The novel polymer of the present invention is a high molecular weight compound which has at least one type of acid labile group, is crosslinked within a molecule and/or between molecules with a crosslinking group having a C—O—C linkage, and has a weight average molecular weight of 1,000 to 500,000.

Specifically, the inventive polymer is a polymer having recurring units of the following general formula (1), wherein the hydrogen atom of some phenolic hydroxyl groups and/or carboxyl groups is partially replaced by an acid labile group. The polymer is crosslinked within a molecule and/or between molecules with a crosslinking group having a C—O—C linkage resulting from reaction between some of the remaining phenolic hydroxyl groups and/or carboxyl groups and an alkenyl ether compound or a halogenated alkyl ether compound.

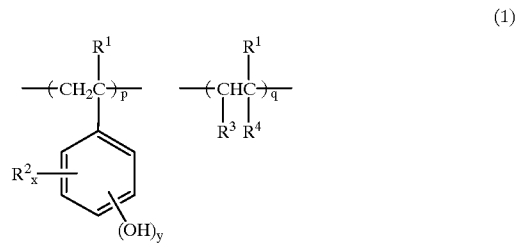

(1)

In formula (1), $R^1$ is a hydrogen atom or methyl group. $R^2$ is a normal, branched or cyclic alkyl group having 1 to 8 carbon atoms, preferably 1 to 5 carbon atoms, more preferably 1 to 3 carbon atoms. Examples of the normal, branched or cyclic alkyl group include methyl, ethyl, propyl, isopropyl, n-butyl, iso-butyl, tert-butyl, cyclohexyl and cyclopentyl. $R^3$ is hydrogen. $R^4$ is a group —COOR$^5$, an alkyl group of 1 to 5 carbon atoms (e.g., methyl, ethyl and tert-butyl), an unsubstituted phenyl group or a phenyl group substituted with a halogen (e.g., chlorine, bromine, iodine and fluorine) or cyano group, wherein $R^5$ is hydrogen or a normal, branched or cyclic alkyl group of 1 to 8 carbon atoms. Alternatively, $R^3$ and $R^4$, taken together, may form —COOCO—. Letter x is 0 or a positive integer, y is a positive integer, the sum of x+y is up to 5. Preferably y is an integer of 1 to 3, especially 1 or 2. Letters p and q are positive numbers satisfying p+q=1 and 0<q/(p+q)≦0.9.

More particularly, the inventive polymer is a polymer having recurring units of the following general formula (2), which is crosslinked within a molecule and/or between molecules with a crosslinking group having a C—O—C linkage resulting from reaction of some of the phenolic hydroxyl groups and/or carboxyl groups represented by R with an alkenyl ether compound or halogenated alkyl ether compound.

(2)

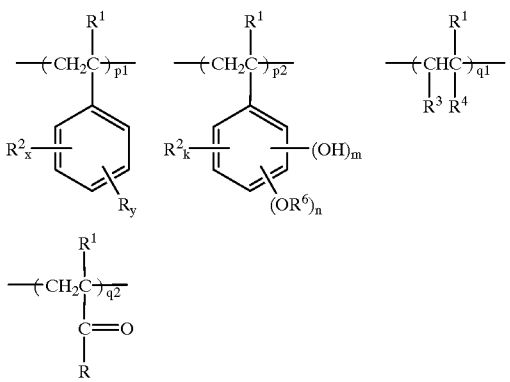

In formula (2), R is a hydroxyl group or OR$^6$, and at least one of R groups is a hydroxyl group. R$^1$ is hydrogen or methyl. R$^2$ is a normal, branched or cyclic alkyl group of 1 to 8 carbon atoms. R$^3$ is hydrogen. R$^4$ is a group —COOR$^5$, an alkyl group of 1 to 5 carbon atoms or a halogen or cyano-substituted or unsubstituted phenyl group, wherein R$^5$ is hydrogen or a normal, branched or cyclic alkyl group of 1 to 8 carbon atoms. Alternatively, R$^3$ and R$^4$, taken together, may form —COOCO—. R$^6$ is an acid labile group. Letter x is 0 or a positive integer, y is a positive integer, and the sum of x+y is up to 5. Letters k and m are 0 or positive integers, n is a positive integer, the sum of k+m+n is up to 5. Letters p1 and p2 are positive numbers, q1 and q2 are 0 or positive numbers, q1 and q2 are not equal to 0 at the same time. Letters p1, p2, q1 and q2 satisfy 0<p1/(p1+p2+q1+q2)<0.8, 0<p2/(p1+p2+q1+q2)<0.8, 0<(p1+q2)/(p1+p2+q1+q2)<0.8, and p1+p2+q1+q2=1. It is noted that p1+p2=p and q1+q2=q, and p and q are as defined above.

Illustrative examples of R$^1$ and R$^2$ and the preferred range of y are as described above in connection with formula (1). Preferably, n is equal to 1 or 2 and m is equal to 0 or 1.

The acid labile group which substitutes for the hydrogen atom of a phenolic hydroxyl group or which is represented by R$^6$ may be selected from a variety of acid labile groups, preferably from groups of the following formulae (5) and (6), tert-alkyl groups of 4 to 20 carbon atoms, trialkylsilyl groups whose alkyl groups each have 1 to 6 carbon atoms, and oxoalkyl groups of 4 to 20 carbon atoms.

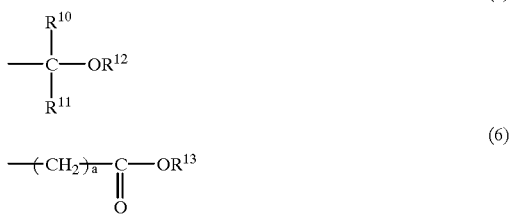

In formulae (5) and (6), R$^{10}$ and R$^{11}$ each are a hydrogen atom or normal, branched or cyclic alkyl group having 1 to 8 carbon atoms, preferably 1 to 6 carbon atoms, more preferably 1 to 5 carbon atoms. R$^{12}$ is a monovalent hydrocarbon group of 1 to 18 carbon atoms, preferably 1 to 10 carbon atoms, more preferably 1 to 8 carbon atoms, which may have a hetero atom such as oxygen. Alternatively, R$^{10}$ and R$^{11}$, R$^{10}$ and R$^{12}$, or R$^{11}$ and R$^{12}$, taken together, may form a ring, with the proviso that R$^{10}$, R$^{11}$ and R$^{12}$ each are a normal or branched alkylene group having 1 to 18 carbon atoms, preferably 1 to 10 carbon atoms, more preferably 1 to 8 carbon atoms, when they form a ring. R$^{13}$ is a tertiary alkyl group having 4 to 20 carbon atoms, preferably 4 to 15 carbon atoms, more preferably 4 to 10 carbon atoms, a trialkylsilyl group whose alkyl groups each have 1 to 6 carbon atoms, an oxoalkyl group of 4 to 20 carbon atoms, preferably 4 to 15 carbon atoms, more preferably 4 to 10 carbon atoms, or a group of formula (5). Letter a is an integer of 0 to 6.

Examples of the normal, branched or cyclic alkyl group of 1 to 8 carbon atoms represented by R$^{10}$ and R$^{11}$ are as described for R$^2$.

Examples of the hydrocarbon group represented by R$^{12}$ include normal, branched or cyclic alkyl groups, substituted or unsubstituted aryl groups such as phenyl, p-methylphenyl, p-ethylphenyl, and alkoxyphenyl groups (e.g., p-methoxyphenyl), and aralkyl groups such as benzyl and phenethyl, as well as modified ones of these groups, for example, alkyl groups in which an oxygen atom intervenes, the hydrogen atom attached to a carbon atom is replaced by a hydroxyl group, or two hydrogen atoms are replaced by an oxygen atom to form a carbonyl group, as shown below.

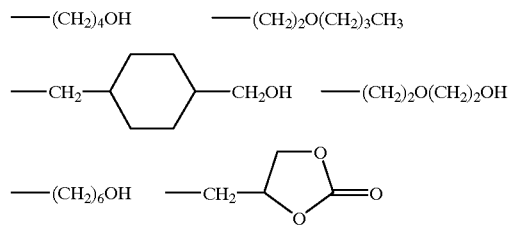

Examples of the tertiary alkyl group of 4 to 20 carbon atoms represented by R$^{13}$ include tert-butyl, 1-methylcyclohexyl, 2-(2-methyl)adamantyl and tert-amyl groups.

Examples of the trialkylsilyl group whose alkyl groups each have 1 to 6 carbon atoms include trimethylsilyl, triethylsilyl and dimethyl-tert-butyl groups. Examples of the oxoalkyl group of 4 to 20 carbon atoms include 3-oxocyclohexyl and groups of the following formulae.

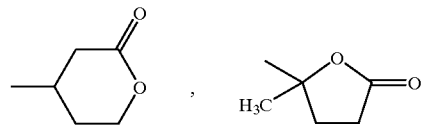

Examples of the acid labile group of formula (5) include linear or branched acetal groups such as 1-methoxyethyl, 1-ethoxyethyl, 1-n-propoxyethyl, 1-iso-propoxyethyl, 1-n-butoxyethyl, 1-iso-butoxyethyl, 1-sec-butoxyethyl, 1-tert-butoxyethyl, 1-tert-amyloxyethyl, 1-ethoxy-n-propyl, 1-cyclohexyloxyethyl, methoxypropyl, ethoxypropyl, 1-methoxy-1-methylethyl, and 1-ethoxy-1-methylethyl; and cyclic acetal groups such as tetrahydrofuranyl and tetrahydropyranyl, with the ethoxyethyl, butoxyethyl and ethoxypropyl groups being preferred. Examples of the acid labile group of formula (6) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl, and 2-tetrahydrofuranyloxycarbonylmethyl groups.

The crosslinking group having a C—O—C linkage is exemplified by groups of the following general formulae (4a) and (4b).

(4a)
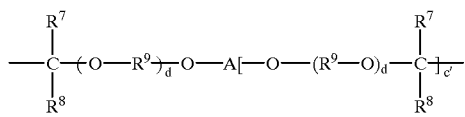

(4b)
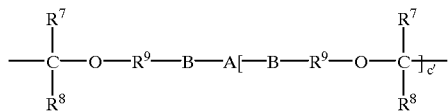

In these formulae, $R^7$ and $R^8$ each are hydrogen or a normal, branched or cyclic alkyl group of 1 to 8 carbon atoms. Alternatively, $R^7$ and $R^8$, taken together, may form a ring, with the proviso that each of $R^7$ and $R^8$ is a normal or branched alkylene group of 1 to 8 carbon atoms when they form a ring. $R^9$ is a normal or branched alkylene group of 1 to 10 carbon atoms. Letter d is 0 or an integer of 1 to 10. A is a c-valent aliphatic or alicyclic saturated hydrocarbon group, aromatic hydrocarbon group or heterocyclic group of 1 to 50 carbon atoms (preferably, normal or branched alkylene, alkyltriyl and alkyltetrayl groups of 1 to 20 carbon atoms or arylene groups of 6 to 30 carbon atoms), which may have an intervening hetero atom and in which the hydrogen atom attached to a carbon atom may be partially replaced by a hydroxyl group, carboxyl group, acyl group or fluorine atom. B is —CO—O—, —NCHO—O— or —NHCONH—. Letter c is an integer of 2 to 8, and c' is an integer of 1 to 7.

The normal, branched or cyclic alkyl groups of 1 to 8 carbon atoms are as exemplified above. Examples of the group represented by A are described later. These crosslinking groups of formulae (4a) and (4b) originate from alkenyl ether compounds and halogenated alkyl ether compounds to be described later.

As understood from the value of c' in formula (4a) or (4b), the crosslinking group is not limited to a divalent one and trivalent to octavalent groups are acceptable. For example, the divalent crosslinking group is exemplified by groups of the following formulae (4a') and (4b') and the trivalent crosslinking group is exemplified by groups of the following formulae (4a'') and (4b'').

(4a')
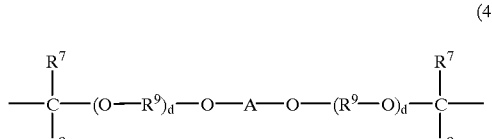

(4b')
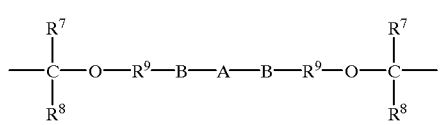

(4a'')
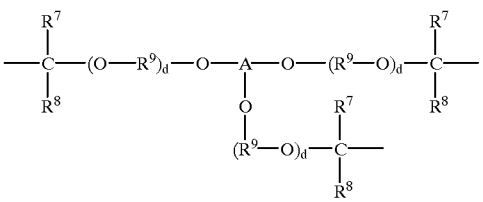

(4b'')
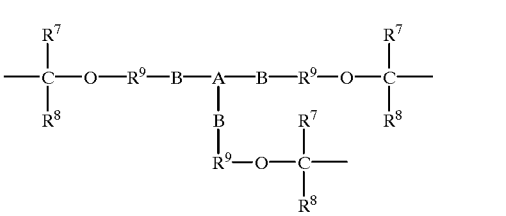

Preferred crosslinking groups are of the following formulae (4a''') and (4b'''):

(4a''')

$$\begin{array}{c} R^7 \\ | \\ -C-(O-R^9)_d-O-A'[-O-(R^9-O)_d-C-]_{c'''} \\ | \\ R^8 \end{array} \quad \begin{array}{c} R^7 \\ | \\ \\ | \\ R^8 \end{array}$$

(4b''')

$$\begin{array}{c} R^7 \\ | \\ -C-O-R^9-B-A'[-B-R^9-O-C-]_{c'''} \\ | \\ R^8 \end{array} \quad \begin{array}{c} R^7 \\ | \\ \\ | \\ R^8 \end{array}$$

wherein $R^7$ and $R^8$ each are hydrogen or a normal, branched or cyclic alkyl group of 1 to 8 carbon atoms, or $R^7$ and $R^8$, taken together, may form a ring, with the proviso that each of $R^7$ and $R^8$ is a normal or branched alkylene group of 1 to 8 carbon atoms when they form a ring, $R^9$ is a normal or branched alkylene group of 1 to 10 carbon atoms, letter d is 0 or an integer of 1 to 5, A' is a c''-valent normal or branched alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or fluorine atom, B is —CO—O—, —NCHO—O— or —NHCONH—, letter c'' is an integer of 2 to 4, and c''' is an integer of 1 to 3.

More specifically, the inventive polymer is a polymer having recurring units of the following general formula (3) which is crosslinked within a molecule and/or between molecules through the mechanism that hydrogen atoms are eliminated from phenolic hydroxyl groups represented by R to leave oxygen atoms which are connected by a crosslinking group having a C—O—C linkage of the general formula (4a) or (4b).

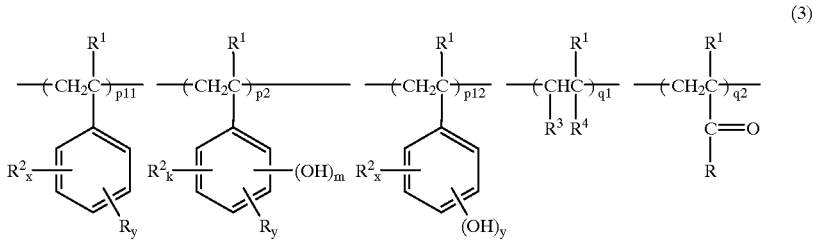

(3)

In formula (3), R is a hydroxyl group or $OR^6$, with at least one of R groups being a hydroxyl group. $R^1$ is hydrogen or methyl. $R^2$ is a normal, branched or cyclic alkyl group of 1 to 8 carbon atoms. $R^3$ is hydrogen. $R^4$ is a group —$COOR^5$, an alkyl group of 1 to 5 carbon atoms or a halogen or cyano-substituted or unsubstituted phenyl group, wherein $R^5$ is hydrogen or a normal, branched or cyclic alkyl group of 1 to 8 carbon atoms. Alternatively, $R^3$ and $R^4$, taken together, may form —COOCO—. $R^6$ is a group of the following general formula (5), a group of the following general formula (6), a tertiary alkyl group of 4 to 20 carbon atoms, a trialkylsilyl group whose alkyl groups each have 1 to 6 carbon atoms or an oxoalkyl group of 4 to 20 carbon atoms. Letters p11, p12 and p2 are positive numbers, q1 and q2 are 0 or positive numbers, q1 and q2 are not equal to 0 at the same time, p11+p12=p1, p11+p12+p2=p, and q1+q2=q. Letters p11, p12, p2, q1 and q2 satisfy 0<p11/(p11+p12+p2+q1+q2)<0.8, 0<p2/(p11+p12+p2+q1+q2)<0.8, 0<(p11+p12+q2)/(p11+p12+p2+q1+q2)<0.8, and p11+p12+p2+q1+q2=1. Letters x, y, k, m and n are as defined above.

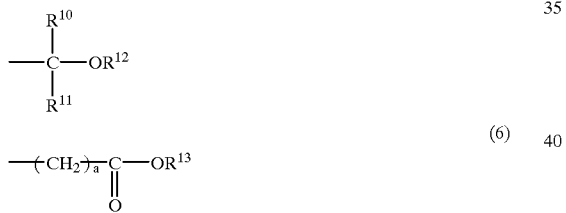

In formulae (5) and (6), $R^{10}$ and $R^{11}$ each are a hydrogen atom or normal, branched or cyclic alkyl group having 1 to 8 carbon atoms. $R^{12}$ is a monovalent hydrocarbon group of 1 to 18 carbon atoms which may have a hetero atom. Alternatively, $R^{10}$ and $R^{11}$, $R^{10}$ and $R^{12}$, or $R^{11}$ and $R^{12}$, taken together, may form a ring, with the proviso that $R^{10}$, $R^{11}$ and $R^{12}$ each are a normal or branched alkylene group having 1 to 18 carbon atoms when they form a ring. $R^{13}$ is a tertiary alkyl group having 4 to 20 carbon atoms, a trialkylsilyl group whose alkyl groups each have 1 to 6 carbon atoms, an oxoalkyl group of 4 to 20 carbon atoms, or a group of formula (5). Letter a is an integer of 0 to 6.

Illustrative examples of R, $R^1$ to $R^{13}$ and the preferred ranges of b, x, y, k, m, n and a are as described above.

Letters p11, p12, p2, q1 and q2 are numbers as defined above, preferably satisfying the following ranges:

$$0 < \frac{p11}{p11+p12+p2+q1+q2} \leq 0.4,$$

$$\text{especially } 0.002 \leq \frac{p11}{p11+p12+p2+q1+q2} \leq 0.2$$

$$0.4 < \frac{p12}{p11+p12+p2+q1+q2} < 0.8,$$

$$\text{especially } 0.5 \leq \frac{p12}{p11+p12+p2+q1+q2} \leq 0.7$$

$$0 < \frac{p2}{p11+p12+p2+q1+q2} \leq 0.6,$$

$$\text{especially } 0.1 \leq \frac{p2}{p11+p12+p2+q1+q2} \leq 0.4$$

$$0 \leq \frac{q1}{p11+p12+p2+q1+q2} \leq 0.5,$$

$$\text{especially } 0 \leq \frac{q1}{p11+p12+p2+q1+q2} \leq 0.3,$$

$$0 \leq \frac{q2}{p11+p12+p2+q1+q2} \leq 0.3,$$

$$\text{especially } 0 \leq \frac{q2}{p11+p12+p2+q1+q2} \leq 0.2$$

Illustrative, non-limiting examples of the inventive polymer are represented by the following formulae (3'-1) to (3'-4).

(3'-1)
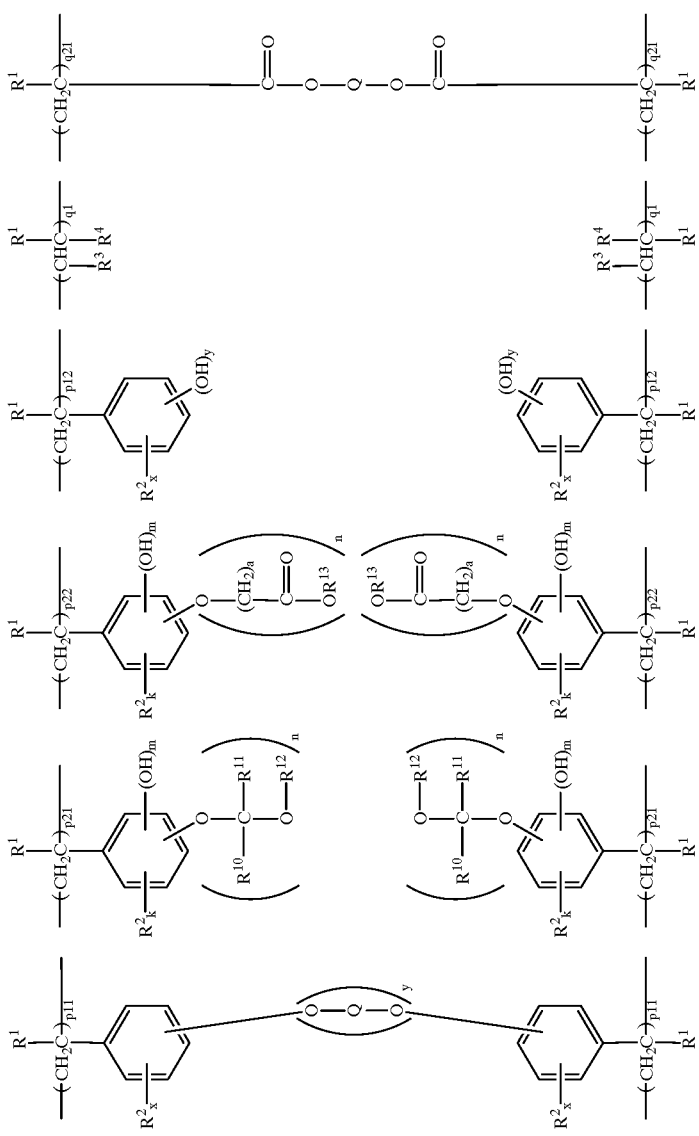

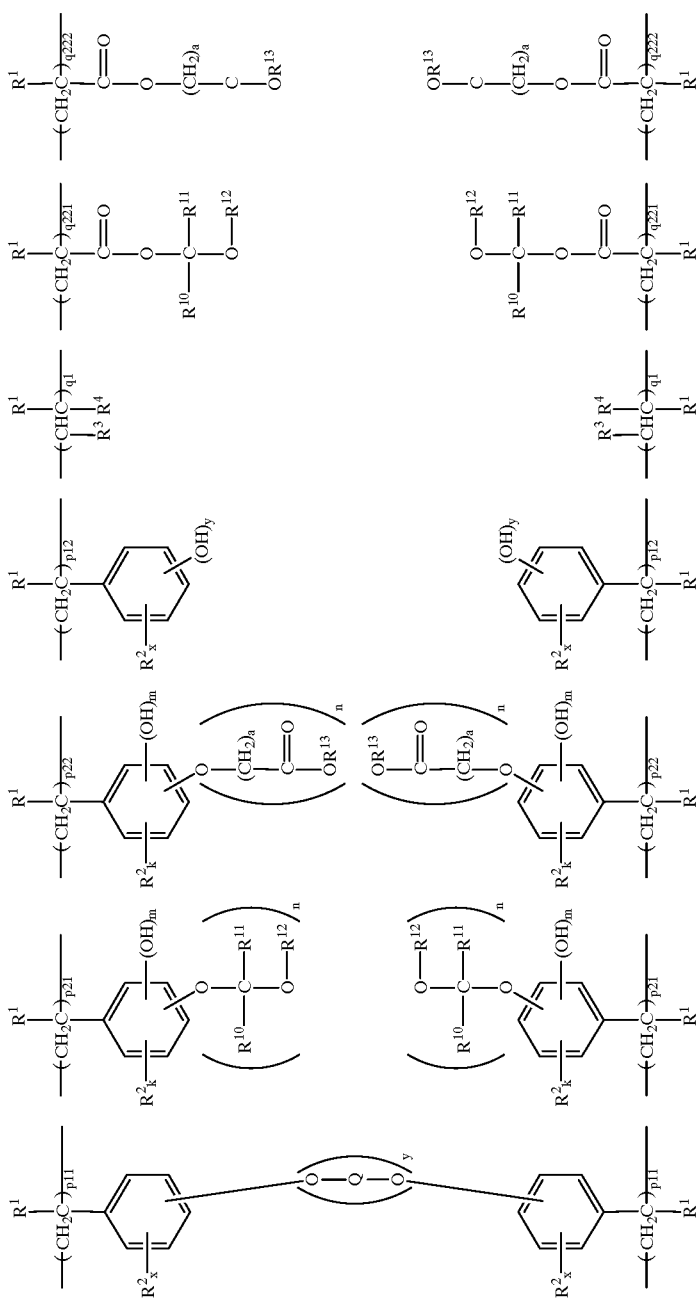
(3′-2)

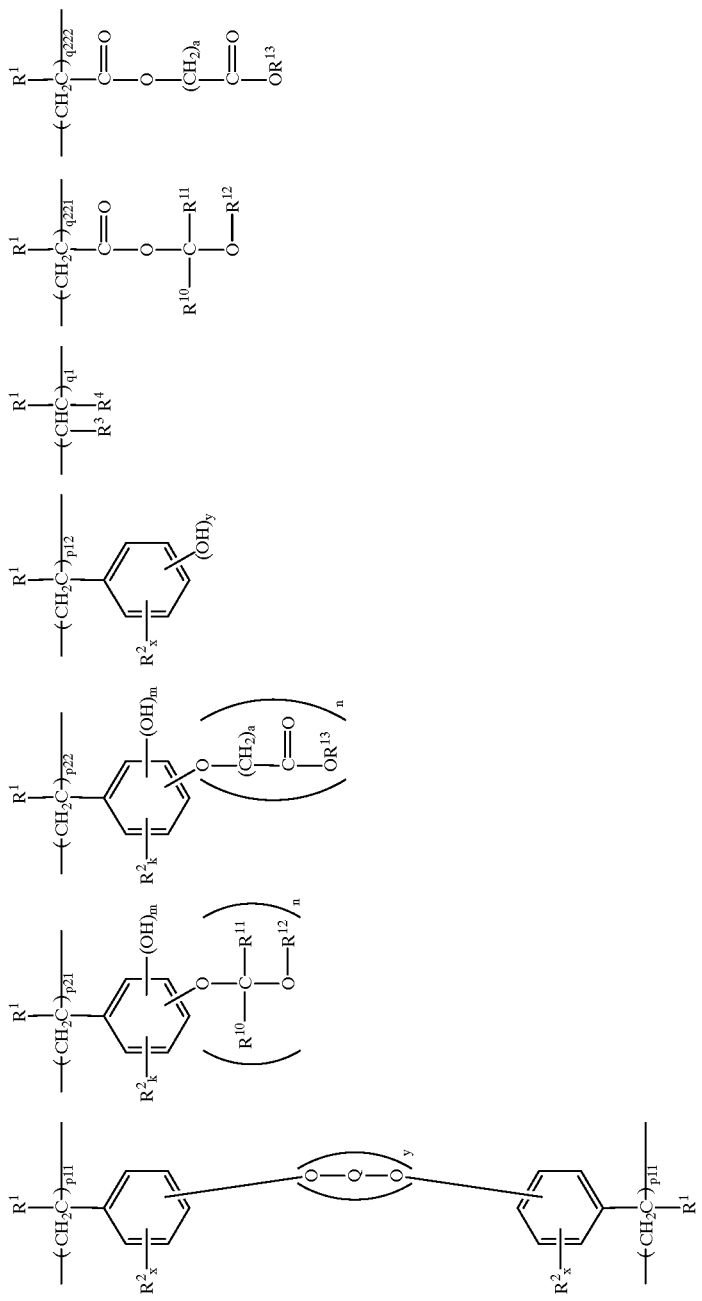

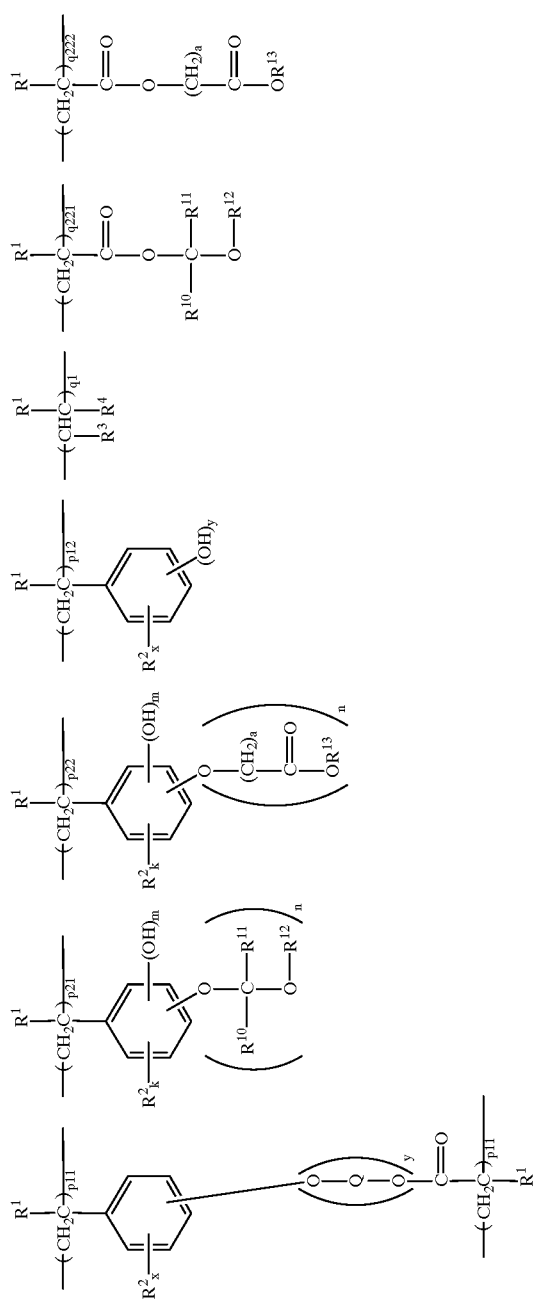

In the above formulae, $R^1$ to $R^4$, $R^{10}$ to $R^{14}$, p11, p12, q1, x, y, k, m, and n are as defined above. Letters p21 and p22 are positive numbers, q21, q221 and q222 are 0 or positive numbers, satisfying p21+p22=p2 and q21+q221+q222=q2.

Herein, each of p11 and q21 represents the proportion of units having a crosslinking group, and each of p2(=p21+p22) and q22(=q221+q222) represents the proportion of units having an acid labile group. The value of (p21+q221)/(p21+p22+q221+q222) preferably ranges from 0.1 to 1, more preferably from 0.5 to 1, most preferably from 0.7 to 1. Q is a crosslinking group having a C—O—C linkage, typically a crosslinking group of formula (4a) or (4b), preferably formula (4a'), (4b'), (4a") or (4b"), more preferably formula (4a''') or (4b'''). Where the crosslinking group is trivalent or more, Q is attached to at least three units of the following formulae in formula (3).

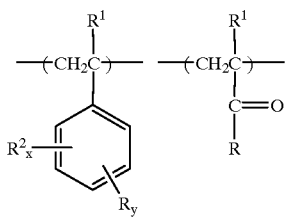

It is noted that formulae (3'-1) and (3'-2) show an intermolecular linkage and formulae (3'-3) and (3'-4) show an intramolecular linkage. They may be present alone or in admixture.

In the polymer of the present invention, the hydrogen atoms of some phenolic hydroxyl groups and/or carboxyl groups are replaced by an acid labile group and a crosslinking group having a C—O—C linkage as mentioned above. Preferably, the amount of the acid labile group and the crosslinking group combined is on the average from more than 0 mol % to 80 mol %, especially from 2 to 50 mol % of the entirety of the phenolic hydroxyl groups and carboxyl groups in formula (1).

In this regard, the average proportion of the crosslinking group having a C—O—C linkage is from more than 0 mol % to 80 mol %, especially from 0.2 to 20 mol % of the entirety of the phenolic hydroxyl groups and carboxyl groups in formula (1). With 0 mol %, no benefits of the crosslinking group are obtained, resulting in a reduced contrast of alkali dissolution rate and low resolution. With more than 80 mol %, a too much crosslinked polymer will gel, become insoluble in alkali, induce a film thickness change, internal stresses or bubbles upon alkali development, and lose adhesion to the substrate due to less hydrophilic groups.

The average proportion of the acid labile group is from more than 0 mol % to 80 mol %, especially from 10 to 50 mol % of the entirety of the phenolic hydroxyl groups and carboxyl groups in formula (1). With 0 mol %, no benefits of the acid labile group are obtained, resulting in a reduced contrast of alkali dissolution rate and low resolution. With more than 80 mol %, alkali solubility will be lost and the affinity to an alkaline developer becomes low, resulting in low resolution.

By properly selecting the amounts of the crosslinking group having a C—O—C linkage and the acid labile group within the above-defined ranges, the size and configuration of a resist pattern can be controlled as desired. In the polymer according to the invention, the contents of the crosslinking group having a C—O—C linkage and the acid labile group have substantial influence on the dissolution rate contrast of a resist film and govern the properties of a resist composition relating to the size and configuration of a resist pattern.

Differently stated, the polymer of the invention is a hydroxystyrene-(meth)acrylate copolymer wherein q1+q2(=q) representative of the proportion of (meth)acrylate units is preferably from more than 0 mol % to 90 mol %, especially from 2 to 60 mol % of the entirety: p1+p2+q1+q2 or p11+p12+p2+q1+q2(=p+q). If the proportion of q1+q2(=q) is 0 mol %, advantages including light transmission, adhesion to the substrate, and minimized footing are lost, and resolution becomes low. A proportion of q1+q2 (=q) in excess of 90 mol % would aggravate heat resistance and dry etching resistance.

The polymer of the invention should have a weight average molecular weight of 1,000 to 500,000, preferably 3,000 to 30,000. With a weight average molecular weight of less than 1,000, resists would be less resistant to heat. With a weight average molecular weight of more than 500,000, alkali solubility and resolution lowers.

It is understood that prior to crosslinking, a polymer having a wide molecular weight dispersity (Mw/Mn) contains more polymers of low molecular weight and high molecular weight. Such a wide dispersity obstructs the design of the number of crosslinks and it is rather difficult to produce resist materials having the same properties. The influence of a molecular weight and its dispersity becomes greater as the pattern rule becomes finer. In order that a resist material be advantageously used in patterning features to a finer size, the polymer should preferably be a monodisperse one having a molecular weight dispersity of 1.0 to 1.5, especially 1.0 to 1.3. However, the invention is not limited thereto, and it is, of course, acceptable to use a polymer having a dispersity of more than 1.5.

Next, the method for preparing the polymer of the invention is described. The compound of formula (1) or (2) can be prepared by radical polymerization or living anion polymerizing of monomers of the following general formulae (i), (ii), and (iii).

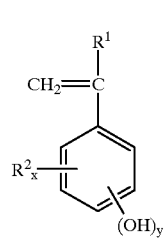

(i)

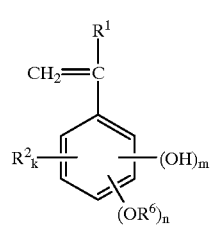

(ii)

-continued

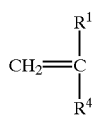
(iii)

wherein $R^1$, $R^2$, $R^4$, $R^6$, x, y, k, m, and n are as defined above.

When the polymer is applied to resist materials patternable to a finer pattern rule, a monodisperse polymer is preferred for the above-mentioned reason. Monodisperse polymers are generally prepared by fractionating a polymer formed by radical polymerization and having a wide molecular weight dispersity so as to collect the desired polymer fraction or by effecting living anion polymerization. Since the former process involving fractionation is complex, the latter process of living anion polymerization is advantageous. It is understood that some monomers are not amenable to living anion polymerization and in such cases, copolymers are prepared by radical polymerization.

The preparation of polymers of the invention by radical polymerization is now described. Radical polymerization of monomers of the above-defined formulae is first carried out in a conventional manner using a polymerization initiator. Any of conventional polymerization initiators may be used in a conventional amount. Preferred are organic peroxides, especially organic peroxides having a 10-hour half-life temperature of 40 to 90° C. such as lauroyl peroxide.

The radical polymerization is preferably carried out in organic solvents. Useful organic solvents include aromatic hydrocarbon, cyclic ether, aliphatic hydrocarbon solvents such as benzene, toluene, tetrahydrofuran (THF), dioxane, tetrahydropyran, dimethoxyethane, n-hexane, and cyclohexane and mixtures thereof. Acetone is most preferred. The organic solvents may be used so as to give a monomer concentration of 10 to 50% by weight.

Radical polymerization conditions may be properly adjusted. Typically, reaction is carried out for about 3 to 10 hours at a temperature which is 20 to 50° C. higher than the 10-hour half-life temperature of the organic peroxide.

Where polymers of the invention are prepared by living anion polymerization of monomers, well-known living anion polymerization initiators may be used. Particularly when it is desired to obtain a monodisperse polymer, organometallic compounds are preferably used among other living anion polymerization initiators. Useful organometallic compounds are organic alkali metal compounds such as n-butyllithium, sec-butyllithium, tert-butyllithium, naphthalene sodium, naphthalene potassium, anthracene sodium, α-methylstyrene-tetramer disodium, cumyl potassium, and cumyl cesium. The amount of living anion polymerization initiator added is determined from a design molecular weight (=weight of monomers/moles of initiator).

Living anion polymerization of the monomers is generally carried out in organic solvents. The organic solvents used herein are the same as mentioned for the radical polymerization, with tetrahydrofuran being especially preferred.

Adequate polymerization takes place when the monomers are present in a concentration of 1 to 30% by weight. Reaction is preferably carried out by agitating the reaction solution in high vacuum or in an inert gas atmosphere such as argon and nitrogen. The reaction temperature may be selected from a wide range from −78° C. to the boiling point of the reaction solution used. A temperature of −78° C. to 0° C. is preferred for the tetrahydrofuran solvent and room temperature is preferred for the benzene solvent.

Polymerization reaction proceeds for about 10 minutes to about 7 hours. Polymerization reaction can be stopped by adding a stopper such as methanol, water and methyl bromide to the reaction solution.

The living anion polymerization can produce a polymer having a molecular weight dispersity which is monodisperse, that is, Mw/Mn =1.0 to 1.5 because the monomers can be reacted 100% and the molecular weight be properly adjusted.

The polymer of formula (1) or (2) according to the invention can be prepared by effecting living anion polymerization of monomers of formulae (i), (ii) and (iii), hydrolyzing the resulting polymer, and partially protecting hydroxyl groups introduced by hydrolysis with an acid labile group through chemical reaction.

It is noted that the molecular structure of a polymer can be readily acknowledged by infrared (IR) absorption spectroscopy and $^1$H-NMR spectroscopy, and the molecular weight dispersity can be determined by gel permeation chromatography (GPC).

The polymer according to the invention may be prepared in various ways, for example, by a method of introducing an acid labile group of formula (5) into a phenolic hydroxyl group and/or carboxyl group of a polymer resulting from either of the above-mentioned polymerization process, isolating the polymer, and reacting it with an alkenyl ether compound or halogenated alkyl ether compound whereby the polymer is crosslinked within a molecule and/or between molecules with a crosslinking group having a C—O—C linkage; a method of reacting a polymer resulting from either of the above-mentioned polymerization process with an alkenyl ether compound or halogenated alkyl ether compound whereby the polymer is crosslinked within a molecule and/or between molecules with a crosslinking group having a C—O—C linkage, isolating the polymer, and introducing an acid labile group of formula (5) therein; or a method of carrying out reaction with an alkenyl ether compound or halogenated alkyl ether compound and introduction of an acid labile group of formula (5) together. The last-mentioned combination method is preferred. It is possible to further introduce into the thus obtained polymer an acid labile group of formula (6), tert-alkyl, trialkylsilyl or oxoalkyl group, if necessary.

More illustratively, the polymer of the invention may be prepared by either a first method using a polymer comprising recurring units of formula (1'), an alkenyl ether compound of formula (I) or (II), and a compound of formula (5a) or a second method using a polymer comprising recurring units of formula (1'), a halogenated alkyl ether compound of formula (VII) or (VIII), and a compound of formula (5b).

First method

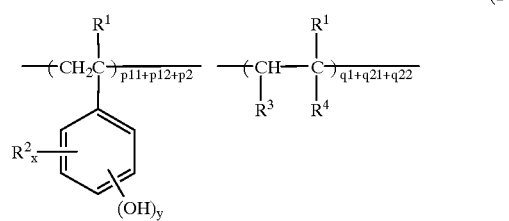
(1')

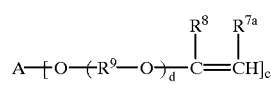
(I)

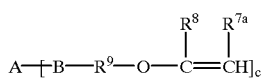

(II)

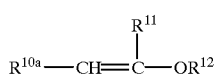

(5a)

Here, $R^1$, $R^2$, $R^3$, $R^4$, $R^8$, $R^9$, $R^{12}$, x, y, p11, p12, p2, q1, and q2 are as defined above, and p11+p12+p2+q1+q2= 1. $R^{7a}$ and $R^{10a}$ each are hydrogen or a normal, branched or cyclic alkyl group of 1 to 7 carbon atoms.

In formula (I) or (II) representing the vinyl ether compound, A is a c-valent aliphatic saturated hydrocarbon, alicyclic saturated hydrocarbon, aromatic hydrocarbon or heterocyclic group having 1 to 50 carbon atoms, B is —CO—O—, —NCHO—O— or —NHCONH—, and $R^9$ is a normal or branched alkylene group of 1 to 10 carbon atoms. Letter c is an integer of 2 to 8, and d is 0 or an integer of 1 to 10.

The c-valent (divalent to octavalent) aliphatic or alicyclic saturated hydrocarbon and aromatic hydrocarbon groups represented by A include hydrocarbon groups, for example, substituted or unsubstituted alkylene groups having 1 to 50 carbon atoms, especially 1 to 40 carbon atoms, substituted or unsubstituted arylene groups having 6 to 50 carbon atoms, especially 6 to 40 carbon atoms, a combination of an alkylene group and an arylene group, and c"-valent groups obtained by eliminating one hydrogen atom attached to a carbon atom from the foregoing groups wherein c" is an integer of 3 to 8; and c-valent heterocyclic groups, and a combination of a heterocyclic group with any one of the foregoing hydrocarbon groups. In the alkylene and arylene groups, a hetero atom such as O, NH, N(CH$_3$), S and SO$_2$ may intervene and where substituted, the substituent is a hydroxyl, carboxyl, acyl group or fluorine atom.

The organic groups represented by A are exemplified below.

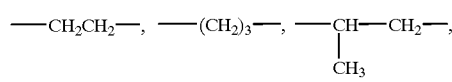

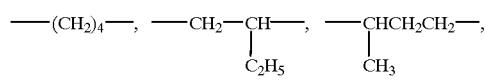

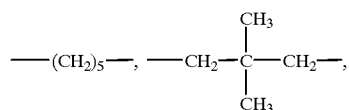

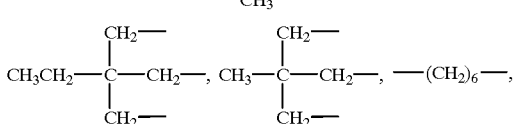

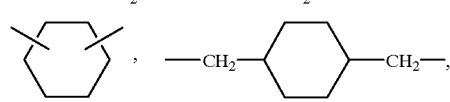

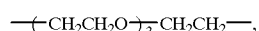

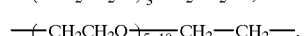

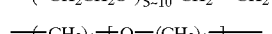

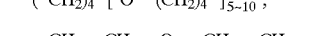

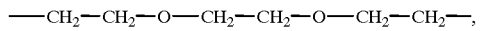

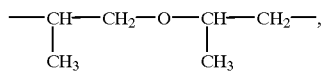

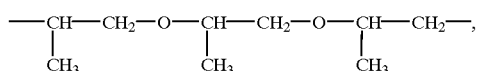

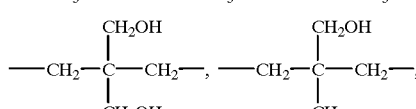

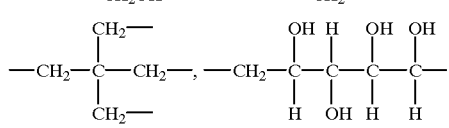

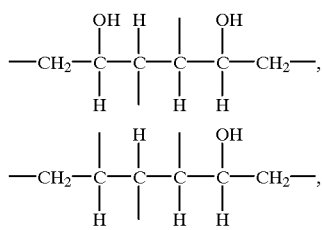

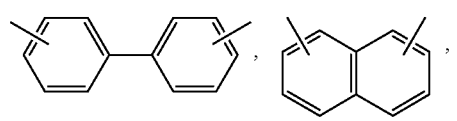

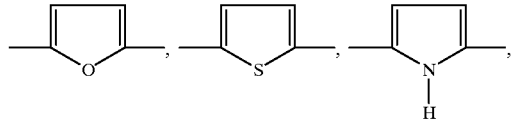

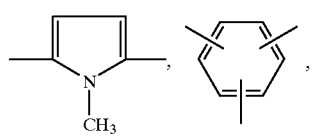

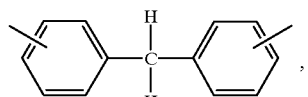

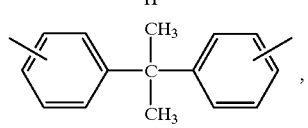

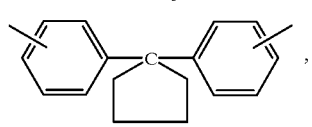

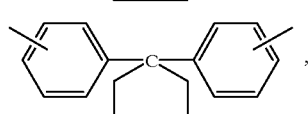

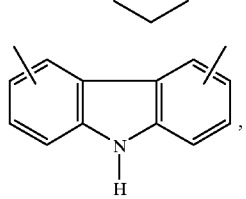

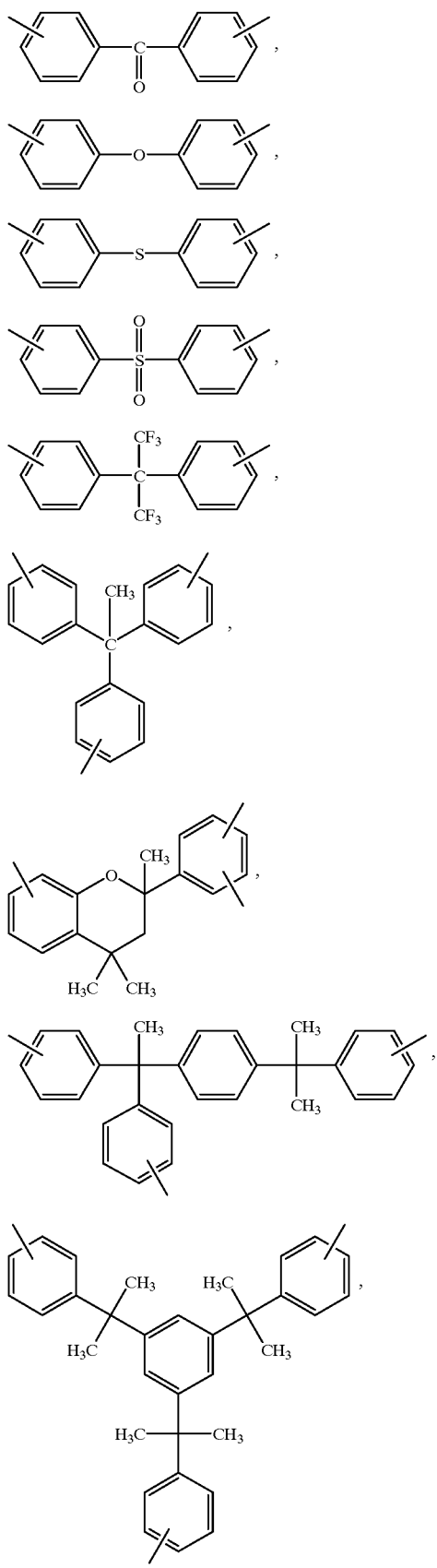
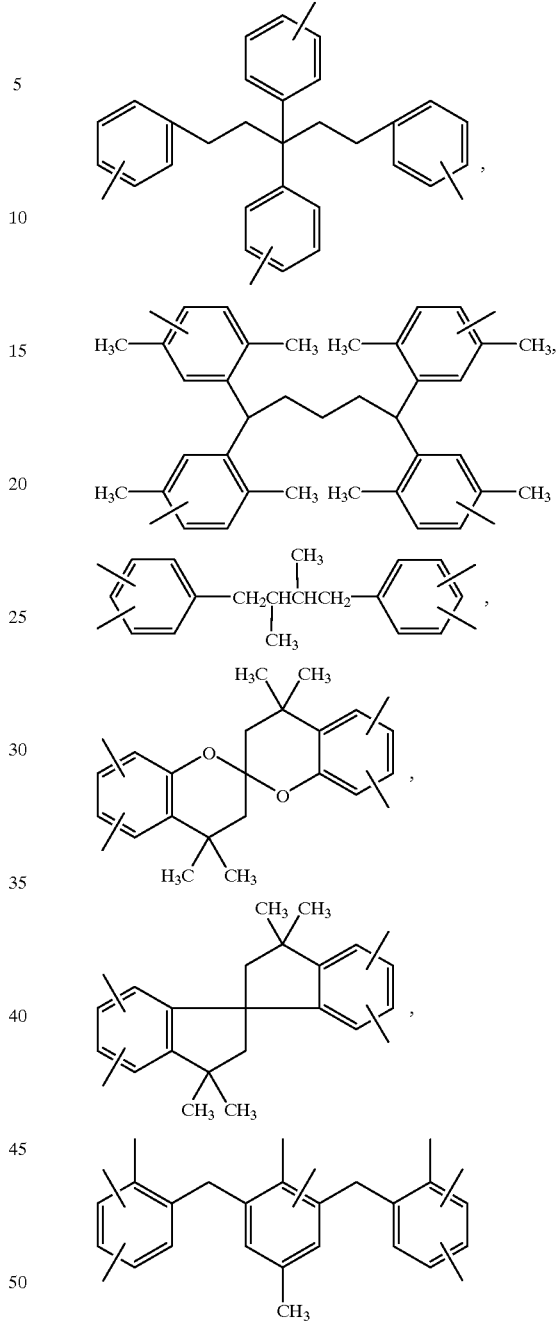

The compounds of formula (I) can be synthesized, for example, by the method described in Stephen C. Lapin, Polymers Paint Colour Journal, 179 (4237), 321 (1988), more specifically by reacting polyhydric alcohols or polyhydric phenols with acetylene or reacting polyhydric alcohols or polyhydric phenols with halogenated alkyl vinyl ethers.

Illustrative, non-limiting examples of the compound of formula (I) include ethylene glycol divinyl ether, triethylene glycol divinyl ether, 1,2-propane diol divinyl ether, 1,3-propane diol divinyl ether, 1,3-butane diol divinyl ether, 1,4-butane diol divinyl ether, tetramethylene glycol divinyl ether, neopentyl glycol divinyl ether, trimethylol propane trivinyl ether, trimethylol ethane trivinyl ether, hexane diol divinyl ether, 1,4-cyclohexane diol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylol propane triethylene vinyl ether, trimethylol propane diethylene vinyl ether, pentaerythritol diethylene vinyl ether, pentaerythritol triethylene vinyl ether, pentaerythritol tetraethylene vinyl ether as well as the compounds of the following formulae (I-1) through (I-31).

(I-1)

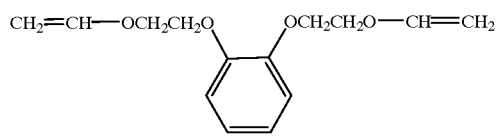
(I-2)

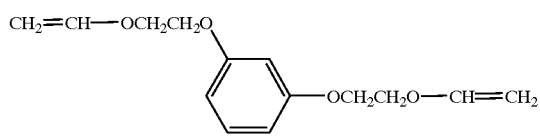
(I-3)

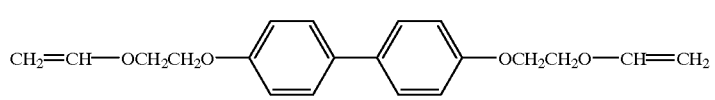
(I-4)

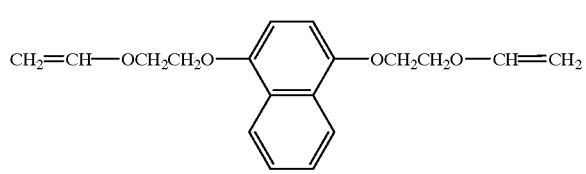
(I-5)

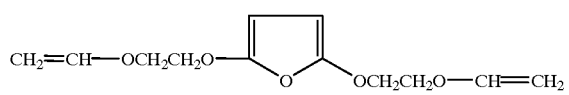
(I-6)

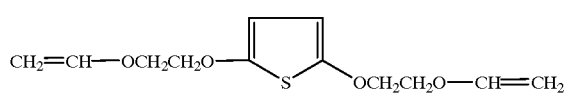
(I-7)

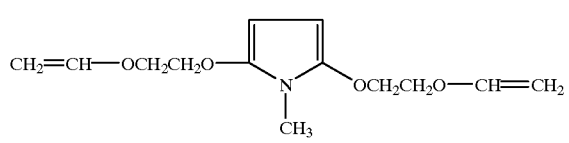
(I-8)

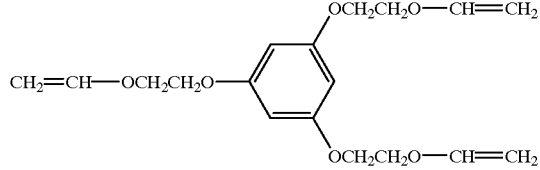
(I-9)

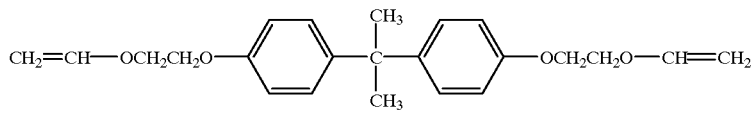
(I-10)

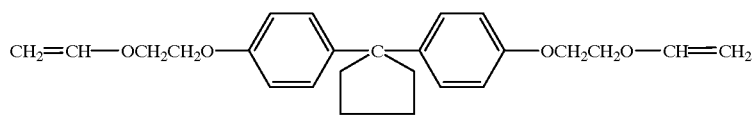
(I-11)
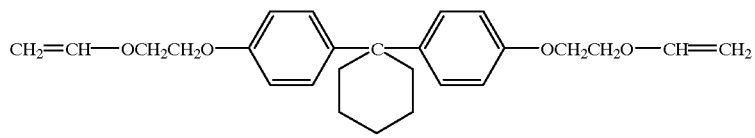
(I-12)
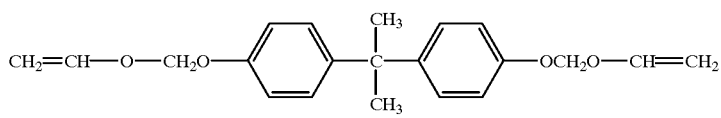
(I-13)
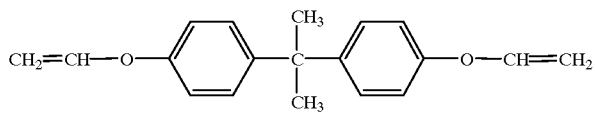
(I-14)
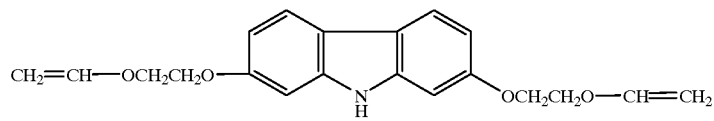
(I-15)
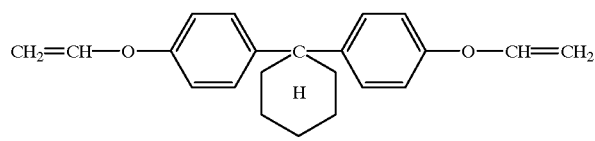
(I-16)
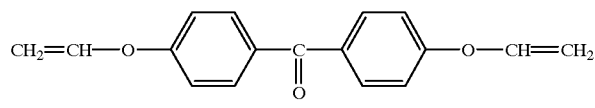
(I-17)
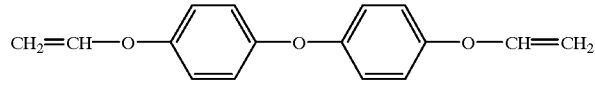
(I-18)
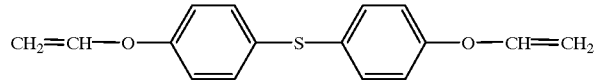
(I-19)
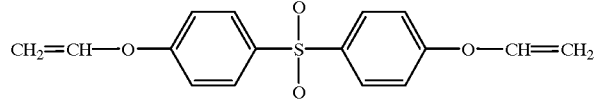
(I-20)
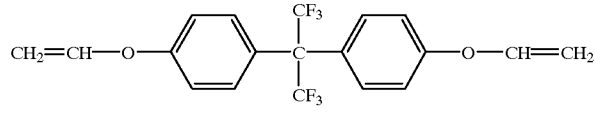
(I-21)

-continued
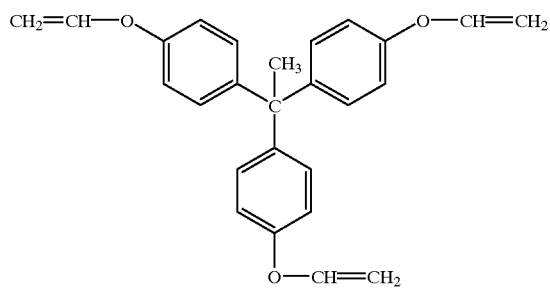
(I-22)
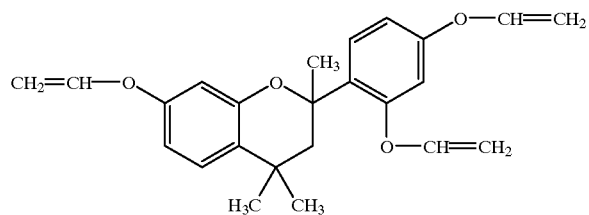
(I-23)
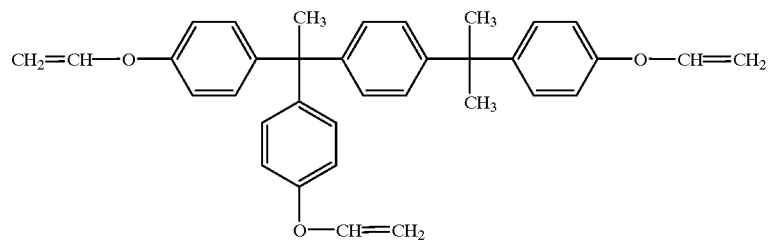
(I-24)
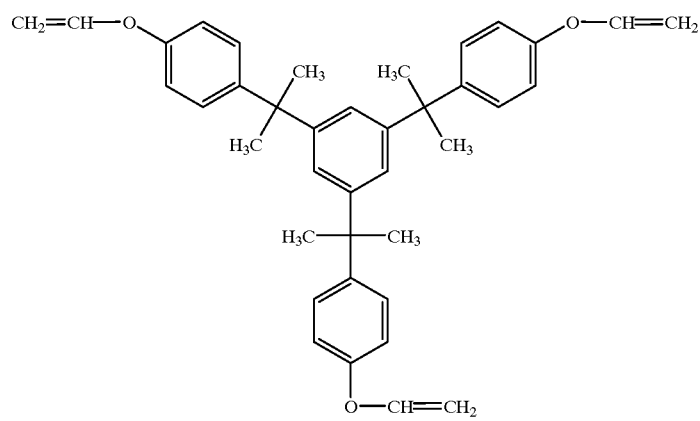
(I-25)
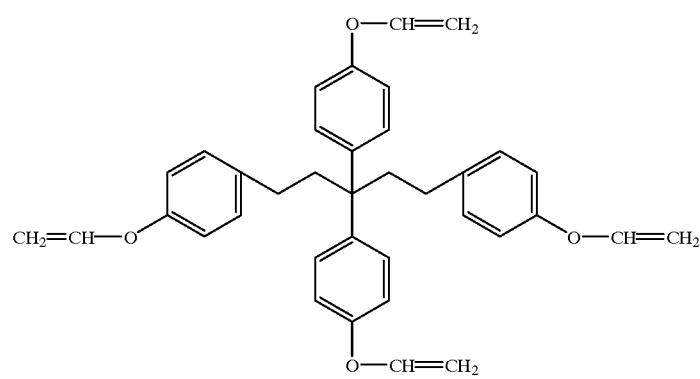
(I-26)

-continued

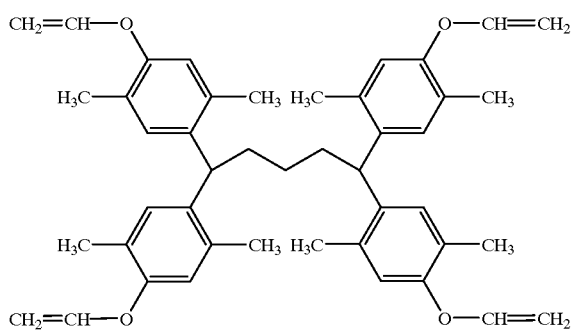

(I-27)

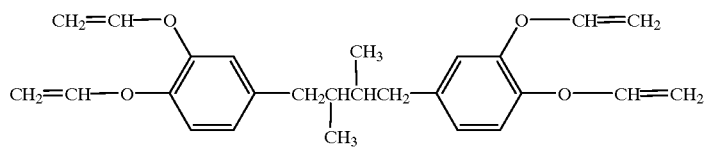

(I-28)

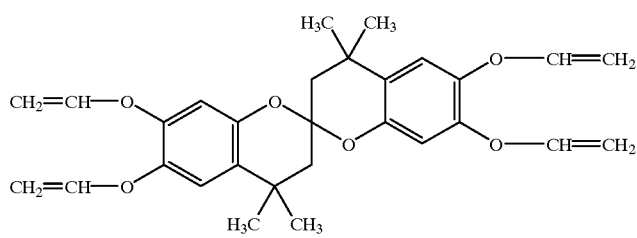

(I-29)

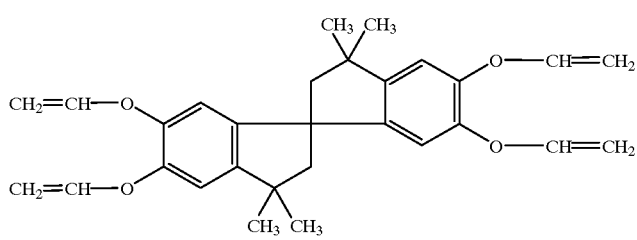

(I-30)

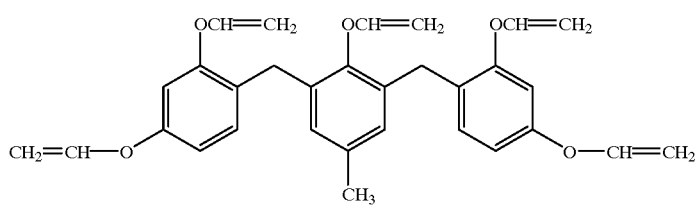

(I-31)

The compounds of formula (II) wherein B is —CO—O— can be synthesized by reacting polyvalent carboxylic acids with halogenated alkyl vinyl ethers. Illustrative, non-limiting examples include terephthalic diethylene vinyl ether, phthalic diethylene vinyl ether, isophthalic diethylene vinyl ether, phthalic dipropylene vinyl ether, terephthalic dipropylene vinyl ether, isophthalic dipropylene vinyl ether, maleic diethylene vinyl ether, fumaric diethylene vinyl ether, and itaconic diethylene vinyl ether.

Other useful alkenyl ether group-containing compounds which can be used herein are alkenyl ether group-containing compounds which are synthesized by reacting alkenyl ether compounds having active hydrogen as represented by the following formulae (III), (IV), and (V) with compounds having an isocyanato group.

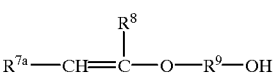 (III)

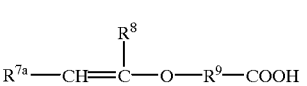 (IV)

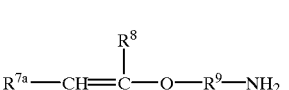 (V)

$R^{7a}$, $R^5$, and $R^9$ as defined above.

Where B is —NHCOO— or —NHCONH—, the compounds having an isocyanato group of formula (II) may be those compounds described in "Handbook of Crosslinking Agents," Taiseisha, 1981, for example. Exemplary are polyisocyanates such as triphenylmethane triisocyanate, diphenylmethane diisocyanate, tolylene diisocyanate, 2,4-tolylene diisocyanate dimer, naphthalene-1,5-diisocyanate, o-tolylene diisocyanate, polymethylene polyphenyl isocyanate, and hexamethylene diisocyanate; and polyisocyanate adducts such as an addition product of tolylene diisocyanate and trimethylolpropane, an addition product of hexamethylene diisocyanate and water, and an addition product of xylene diisocyanate and trimethylolpropane. By reacting isocyanato group-containing compounds with active hydrogen-containing vinyl ether compounds, there are obtained various compounds having an alkenyl ether group at an end. These compounds are exemplified by the following formulae (II-1) through II-11), though not limited thereto.

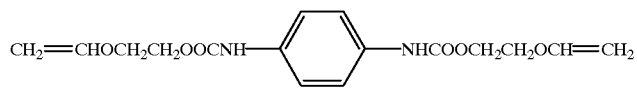
(II-1)

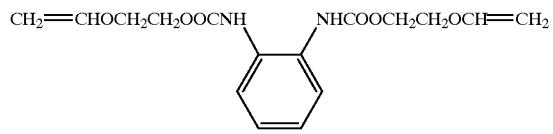
(II-2)

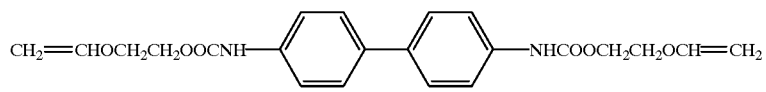
(II-3)

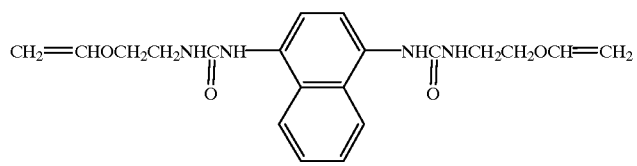
(II-4)

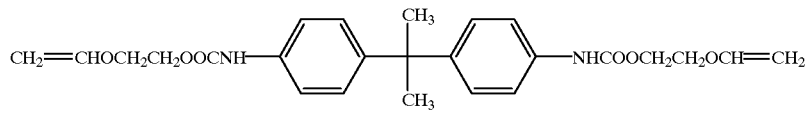
(II-5)

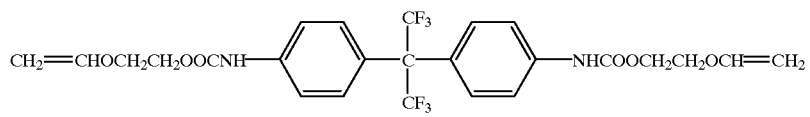
(II-6)

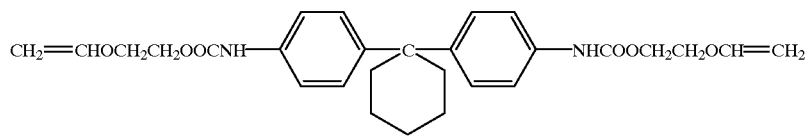
(II-7)

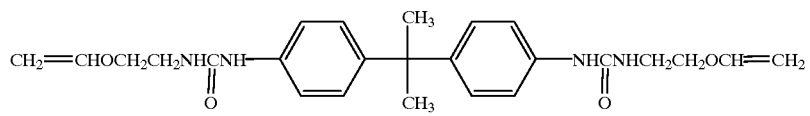
(II-8)

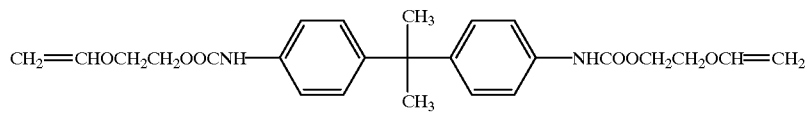
(II-9)

(II-10)
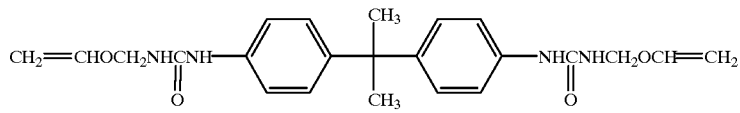

(II-11)
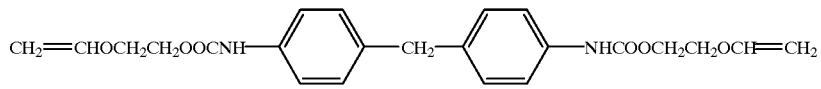

More particularly, in the first method, a polymer of formula (1') having a weight average molecular weight of 1,000 to 500,000 and preferably a dispersity of 1.0 to 1.5 is reacted with p11+q21 mol of an alkenyl ether compound of formula (I) or (II) and p2+q22(q221+q222) mol of a compound of formula (5a) per mol of the phenolic hydroxyl groups and carboxyl groups in the polymer of formula (1'), thereby forming a polymer having recurring units of the general formulae (3a'-1) to (3a'-4).

(3a'-1)
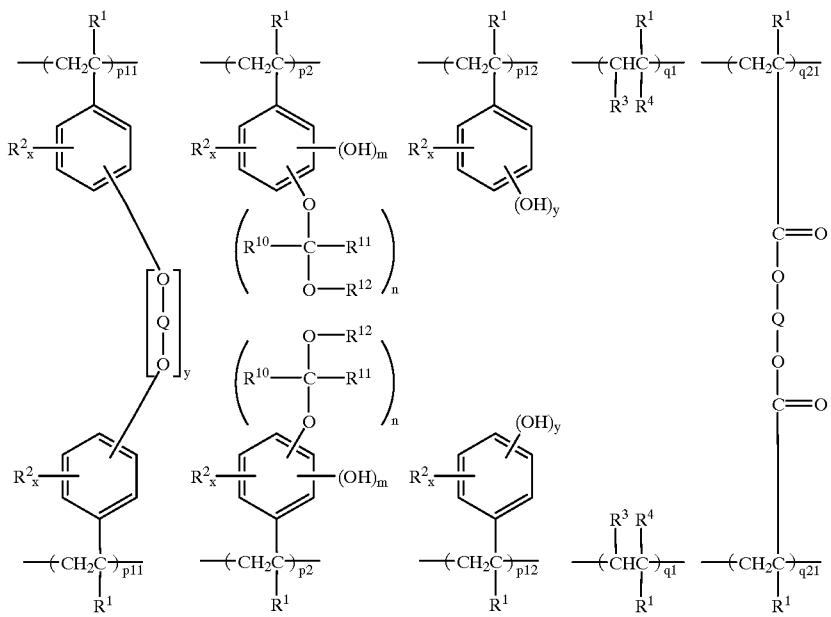

-continued
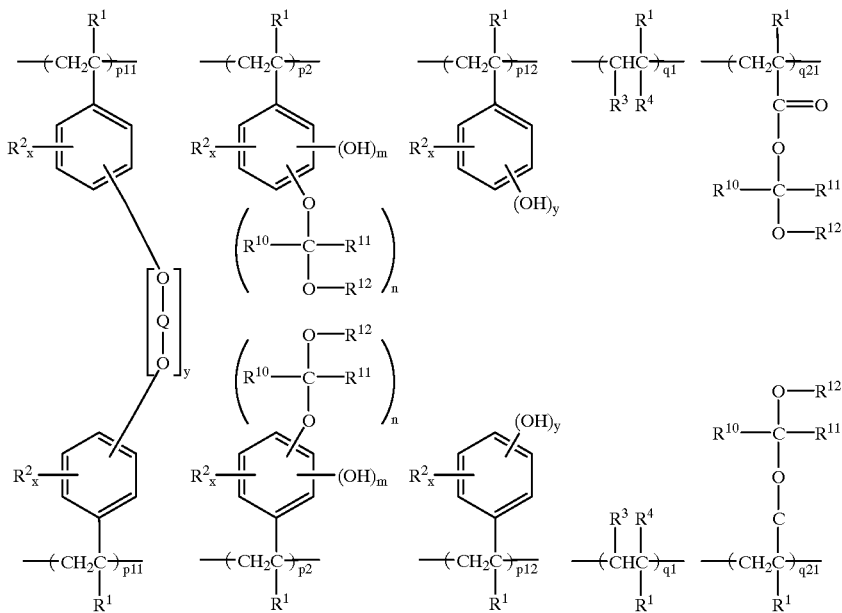
(3a'-2)
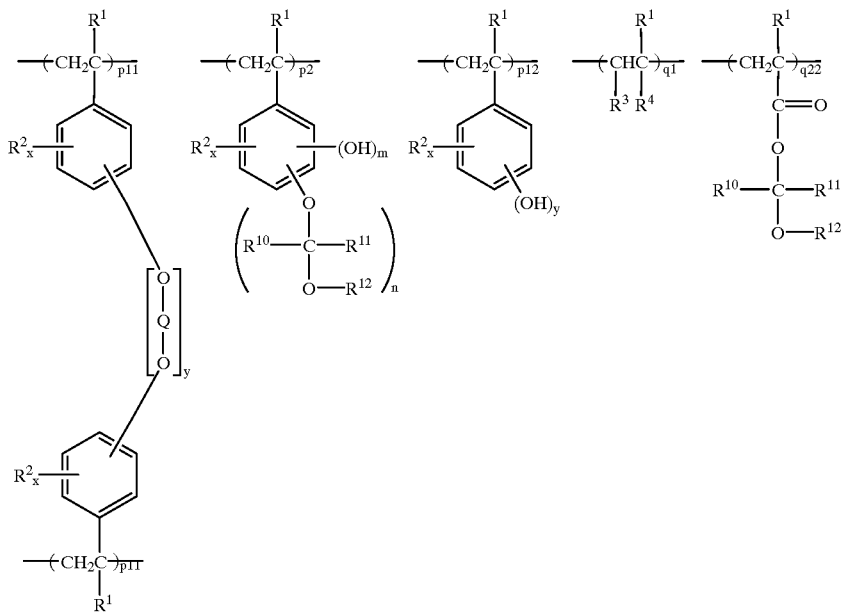
(3a'-3)

-continued (3a'-4)

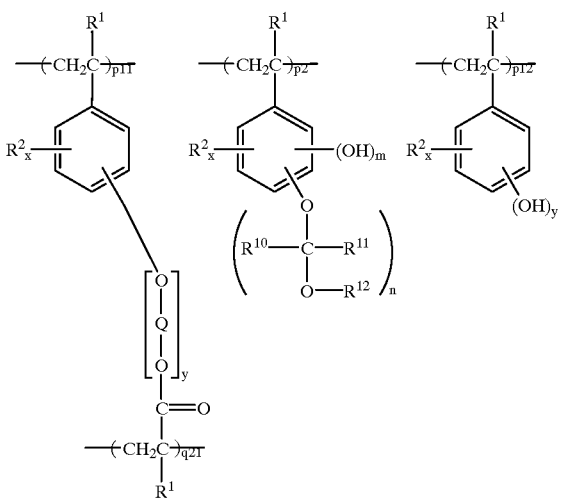

Here, m+n=y, letters m, n, x, y, p11, p12, p2, q1, q22, and groups $R^1$ to $R^4$, $R^{10}$ to $R^{12}$, and Q are as defined above.

In the first method, reaction is preferably carried out in a solvent in the presence of an acid. The reaction solvent used herein is preferably selected from aprotic polar solvents such as dimethylformamide, dimethylacetamide, tetrahydrofuran, and ethyl acetate, and mixtures thereof. The acid catalyst used herein is preferably selected from hydrochloric acid, sulfuric acid, trifluoromethanesulfonic acid, p-toluenesulfonic acid, methanesulfonic acid, trifluoroacetic acid, and pyridinium p-toluenesulfonate. The amount of the acid catalyst used is preferably 0.1 to 10 mol % based on the moles of the phenolic hydroxyl group and carboxyl group in the polymer of formula (1) to be reacted. Reaction is preferably carried out at a temperature of −20° C. to 100° C., more preferably 0° C. to 60° C. The reaction time is generally about 10 minutes to 100 hours, preferably ½ to 20 hours.

Where two types of reaction are carried out in a contiguous manner without once isolating an intermediate product, the order of addition of the alkenyl ether compound of formula (I) or (II) and the compound of formula (5a) is not critical. Preferably, the compound of formula (5a) is first added and after reaction proceeds to a full extent, the alkenyl ether compound of formula (I) or (II) is added. If the alkenyl ether compound of formula (I) or (II) and the compound of formula (5a) are simultaneously added or if the alkenyl ether compound of formula (I) or (II) is first added, then some of reactive sites of the alkenyl ether compound of formula (I) or (II) can be hydrolyzed with water in the reaction system whereby there is formed a polymer of complex structure which is difficult to control its physical properties.

Second method (1')

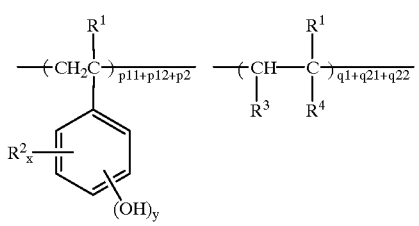

-continued (VI)

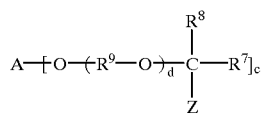

(VII)

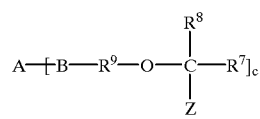

(5b)

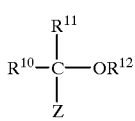

Here, $R^1$ to $R^4$, $R^7$ to $R^{12}$, x, y, p11, p12, p2, q1, q2, q22, A, B, c, and d are as defined above, and Z is a halogen atom such as Cl, Br and I.

It is understood that the compounds of formulae (VI), (VII) and (5b) can be produced by reacting the compounds of formulae (I), (II) and (5a) with hydrogen chloride, hydrogen bromide or hydrogen iodide, respectively.

In the second method, a polymer comprising recurring units of formula (1') and having a weight average molecular weight of 1,000 to 500,000 and preferably a dispersity of 1.0 to 1.5 is reacted with p11+q21 mol of a halogenated alkyl ether compound of formula (VI) or (VII) and p2+q22 mol of a compound of formula (5b) per mol of the phenolic hydroxyl group and carboxyl group in the polymer of formula (1') to be reacted, thereby forming a polymer having recurring units of the formulae (3a'-1) to (3a'-4) shown above.

In the second method, reaction is preferably carried out in a solvent in the presence of a base. The reaction solvent used herein is preferably selected from aprotic polar solvents such as acetonitrile, acetone, dimethylformamide dimethylacetamide, tetrahydrofuran, and dimethylsulfoxide, and mixtures thereof. The base used herein is preferably selected from triethylamine, pyridine, diisopropylamine and potassium carbonate. The amount of the base used is preferably at least (p1+q1) mol per mol of the phenolic hydroxyl group and carboxyl group in the polymer of formula (1) to be reacted. Reaction is preferably carried out at a temperature of −50° C. to 100° C., more preferably 0° C. to 60° C. The reaction time is generally about ½ to 100 hours, preferably 1 to 20 hours.

It is acceptable to take a reaction sequence of first reacting a polymer having recurring units of formula (1') with a compound of formula (5a) or (5b) to form a compound of the following general formula (1″), isolating the compound of formula (1″), and then crosslinking the compound of formula (1″) using a compound of formula (I), (II), (VI) or (VII).

Furthermore, by introducing another acid labile group into the polymers of formulae (3a'-1) to (3a'-4) obtained by the first or second method, polymers having recurring units of the following general formulae (3b'-1) to (3b'-4) can be produced if necessary. This is done by reacting the polymer of formula (3a'-1) to (3a'-4) with p22+q222 mol of a dialkyl dicarbonate compound or alkoxycarbonylalkyl halide per mol of the phenolic hydroxyl group and carboxyl group in the original polymer of formula (1') to introduce an acid labile group of the following general formula (6); or by reacting the polymer of formula (3a'-1) to (3a'-4) with a tert-alkyl halide, trialkylsilyl halide or oxoalkyl compound to introduce an acid labile group.

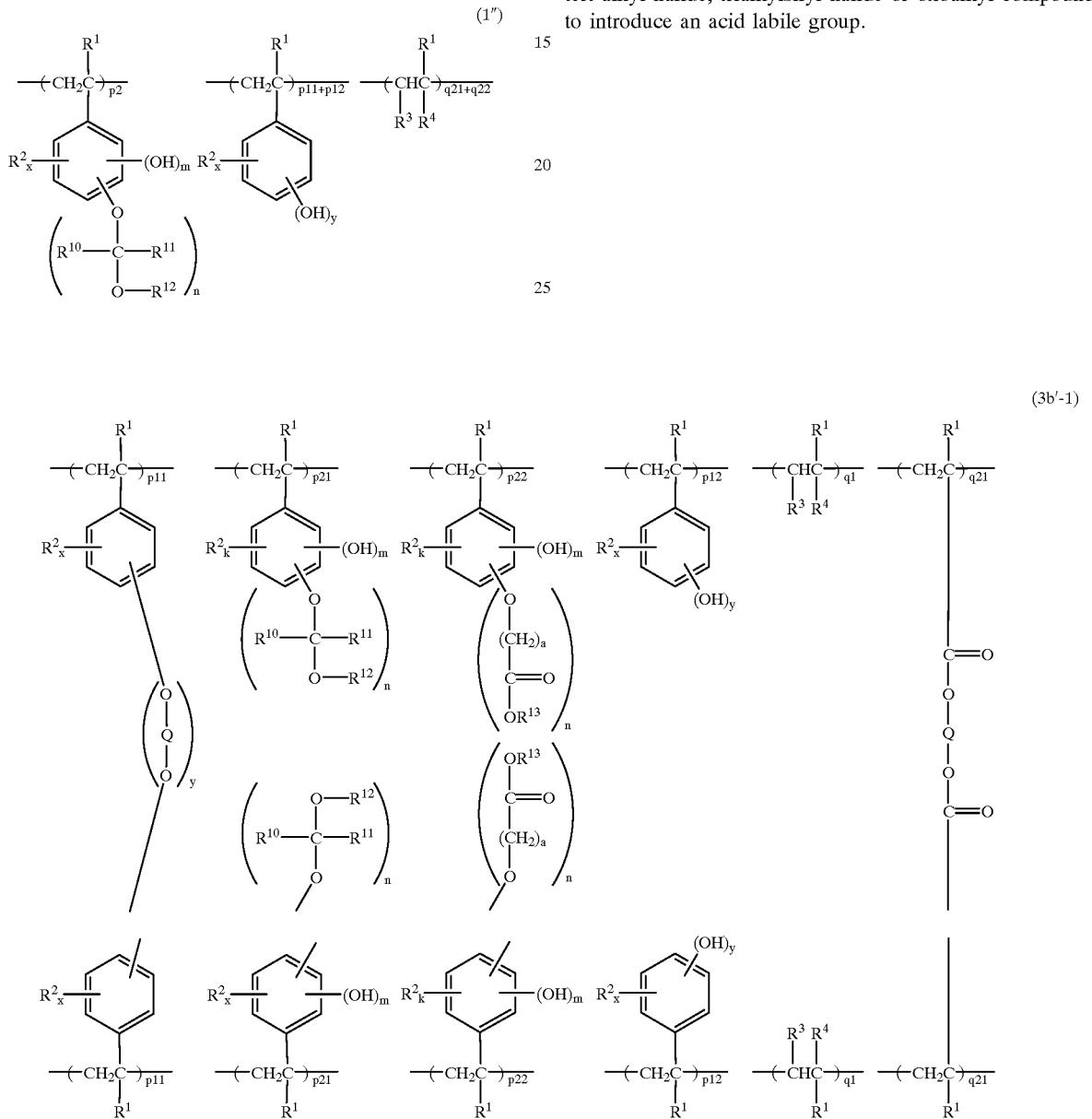

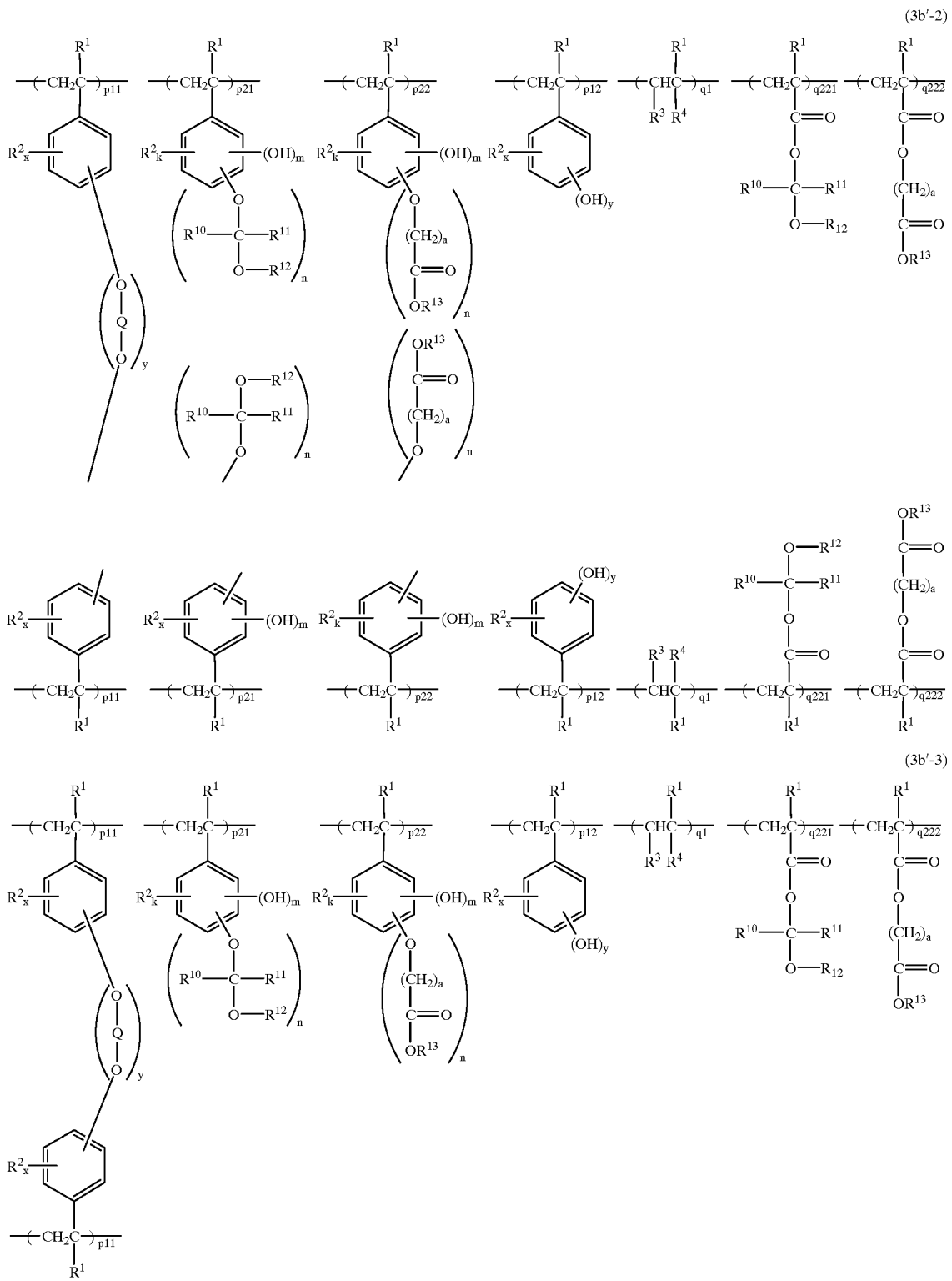

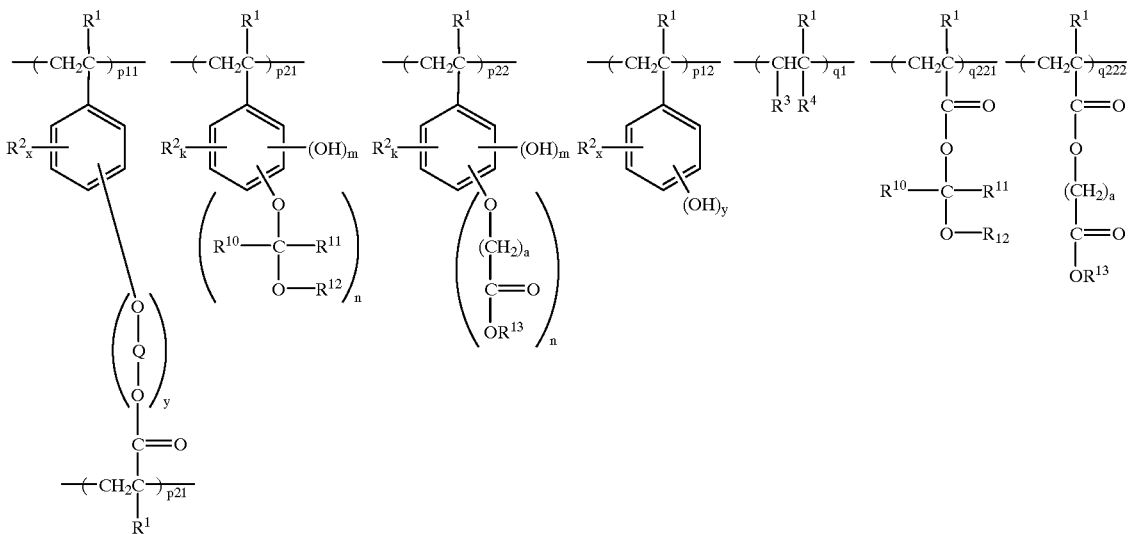

(3b'-4)

Here, $R^1$ to $R^4$, $R^{10}$ to $R^{13}$, p11, p12, p21, p22, q1, q21, q221, q222, x, y, m, n, a, and Q are as defined above.

Preferably the introduction of an acid labile group of formula (6) is carried out in a solvent in the presence of a base. The reaction solvent used herein is preferably selected from aprotic polar solvents such as acetonitrile, acetone, dimethylformamide, dimethylacetamide, tetrahydrofuran, and dimethylsulfoxide, and mixtures thereof. The base used herein is preferably selected from triethylamine, pyridine, imidazole, diisopropylamine and potassium carbonate. The amount of the base used is preferably at least q2 mol per mol of the phenolic hydroxyl group and carboxyl group in the original polymer of formula (1). Reaction is preferably carried out at a temperature of 0° C. to 100° C., more preferably 0° C. to 60° C. The reaction time is generally about 10 minutes to 100 hours, preferably 1 to 10 hours.

Examples of the dialkyl dicarbonate compound include di-tert-butyl dicarbonate and di-tert-amyl dicarbonate. Examples of the alkoxycarbonylalkyl halide include tert-butoxycarbonylmethyl chloride, tert-amyloxycarbonylmethyl chloride, tert-butoxycarbonylmethyl bromide, and tert-butoxycarbonylethyl chloride. Examples of the trialkylsilyl halide include trimethylsilyl chloride, triethylsilyl chloride, and dimethyl-tert-butylsilyl chloride.

Furthermore, if necessary, the polymer of formula (3a'-1) to (3a'-4) obtained by the first or second method can be tert-alkylated or oxoalkylated by reacting the polymer with q222 mol of a tert-alkylating compound or oxoalkyl compound per mol of the phenolic hydroxyl group and carboxyl group in the original polymer of formula (1').

Preferably this reaction is carried out in a solvent in the presence of an acid. The reaction solvent used herein is preferably selected from aprotic polar solvents such as dimethylformamide, dimethylacetamide, tetrahydrofuran, and ethyl acetate, and mixtures thereof. The acid used herein is preferably selected from hydrochloric acid, sulfuric acid, trifluoromethanesulfonic acid, p-toluenesulfonic acid, methanesulfonic acid, trifluoroacetic acid, and pyridinium p-toluenesulfonate. The amount of the acid catalyst used is preferably 0.1 to 10 mol % based on the moles of the phenolic hydroxyl group and carboxyl group in the original polymer of formula (1'). Reaction is preferably carried out at a temperature of −20° C. to 100° C., more preferably 0° C. to 60° C. The reaction time is generally about 10 minutes to 100 hours, preferably ½ to 20 hours.

Examples of the tert-alkylating compound include isobutene, 2-methyl-1-butene, and 2-methyl-2-butene. Examples of the oxoalkyl compound include α-angelica lactone, 2-cyclohexen-1-one, and 5,6-dihydro-2H-pyran-2-one.

Apart from the route of once forming a polymer of formula (3a'-1) to (3a'-4), it is possible to directly introduce an acid labile group of formula (6), tertiary alkyl group, trialkylsilyl group or oxoalkyl group into a polymer comprising recurring units of the following general formula (3c'-1) or (3c'-2) and optionally further introduce an acid labile group of formula (5).

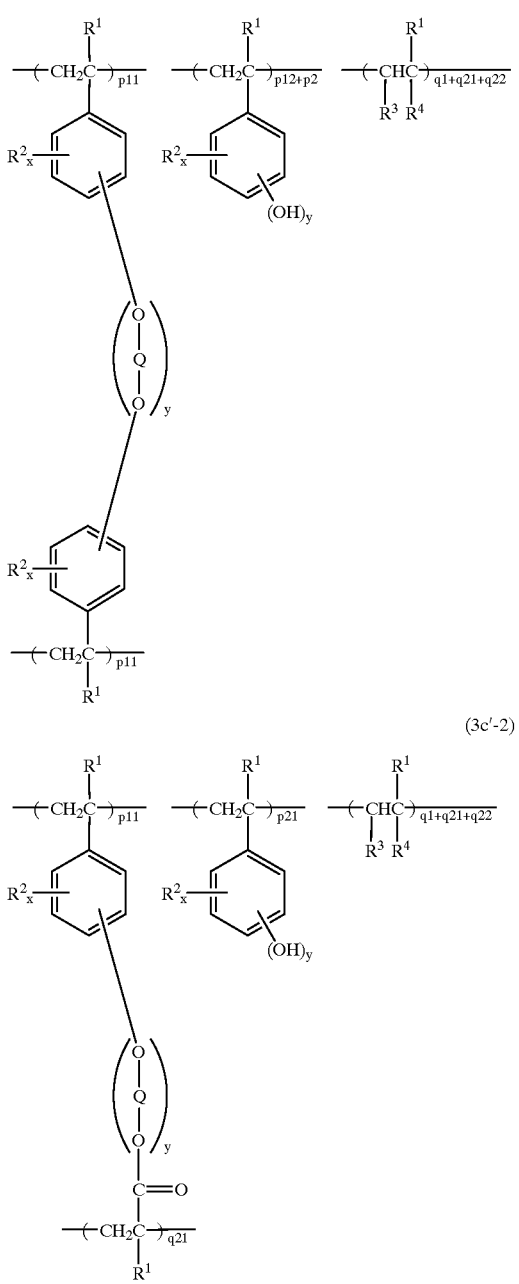

(3c'-1)

(3c'-2)

Here, $R^1, R^2, R^3, R^4, Q, p11, p12, p2, q1, q21, q22, x,$ and y are as defined above.

In the polymer of the invention, the acid labile group represented by $R^6$ is not limited to one type. Acid labile groups of two or more types can be introduced into the polymer. A polymer having acid labile groups of two or more types can be obtained by first introducing p21+q221 mol of a first acid labile group per mol of the entire hydroxyl groups in the polymer of formula (1') as above, then introducing p22+q222 mol of a second different acid labile group by the same procedure as above, and in the case of three or more types, repeating such introduction appropriate times. Resist The polymer of the invention is useful as a base resin of a chemically amplified positive resist composition. The present invention provides a chemically amplified positive resist composition using the above-defined polymer as a base resin. Illustratively, the resist composition contains (A) an organic solvent,
(B) a base resin in the form of a polymer of formula (1), preferably formula (2), more preferably formula (3), and
(C) a photoacid generator.

In addition to these components, the resist composition of the invention may further contain (D) another base resin, separately from the base resin (B), in the form of a polymer comprising recurring units of the following general formula (1), some of the hydrogen atoms of phenolic hydroxyl groups and/or carboxyl groups being replaced by acid labile groups in an average proportion of 0 mol % to 80 mol % of the entirety, the polymer having a weight average molecular weight of 3,000 to 300,000.

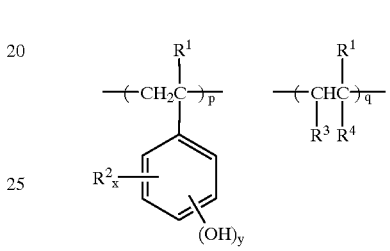

(1)

$R^1, R^2, R^3, R^4$, x, y, p and q are as defined above.

In addition to these components, the resist composition of the invention may further contain at least one of the following components (E) to (I):

(E) a dissolution regulator,
(F) a basic compound,
(G) an aromatic compound having a group ≡C—COOH in a molecule,
(H) a UV absorber, and
(I) an acetylene alcohol derivative.

The organic solvent (A) used herein may be any desired one of organic solvents in which the photoacid generator, base resin, and dissolution regulator are soluble. Illustrative, non-limiting examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate alone or in admixture of two or more. The preferred solvents are diethylene glycol dimethyl ether and 1-ethoxy-2-propanol ensuring the maximum solubility of photoacid generators and propylene glycol monomethyl ether acetate ensuring safety. These solvents may be used alone or in admixture of two or more.

The amount of the organic solvent used is preferably about 200 to 1,000 parts, more preferably about 400 to 800 parts by weight per 100 parts by weight of the base resin consisting of components (B) and (D) combined.

The photoacid generator (C) used herein is selected from onium salts of the following general formula (7), diazomethane derivatives of the following general formula (8), glyoxime derivatives of the following general formula (9), β-ketosulfone derivatives, disulfone derivatives, nitrobenzylsulfonate derivatives, sulfonate derivatives, and imideylsulfonate derivatives, for example.

$$(R^{60})_b M^+ K^-  \quad (7)$$

$R^{60}$ is a normal, branched or cyclic alkyl group of 1 to 12 carbon atoms, aryl group of 6 to 12 carbon atoms, or aralkyl group of 7 to 12 carbon atoms; $M^+$ is iodonium or sulfonium; $K^-$ is a non-nucleophilic counter ion; and letter b is equal to 2 or 3.

Examples of the alkyl group represented by $R^{60}$ include methyl, ethyl, propyl, butyl, cyclohexyl, 2-oxocyclohexyl, norbornyl, and adamantyl. Exemplary aryl groups are phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkyl phenyl groups such as 2-methylphenyl, 3-methylphenyl, 4-methylphenyl, ethylphenyl, 4-tert-butylphenyl, 4-butylphenyl, butylphenyl, and dimethylphenyl. Exemplary aralkyl groups are benzyl and phenethyl. Examples of the non-nucleophilic counter ion represented by $K^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

$$R^{61}-SO_2-\overset{\overset{N_2}{\|}}{C}-SO_2-R^{62} \quad (8)$$

$R^{61}$ and $R^{62}$ are normal, branched or cyclic alkyl groups of 1 to 12 carbon atoms which may be halogenated, aryl groups of 6 to 12 carbon atoms which may be halogenated, or aralkyl groups of 7 to 12 carbon atoms.

Examples of the alkyl group represented by $R^{61}$ and $R^{62}$ include methyl, ethyl, propyl, butyl, amyl, cyclopentyl, cyclohexyl, norbornyl, and adamantyl. Examples of the halogenated alkyl group include trifluoromethyl, 1,1,1-trifluoroethyl, 1,1,1-trichloroethyl, and nonafluorobutyl. Examples of the aryl group include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkyl phenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups are fluorobenzene, chlorobenzene, and 1,2,3,4,5-pentafluorobenzene. Exemplary aralkyl groups are benzyl and phenethyl.

$$R^{63}-SO_2-O-N=\overset{R^{64}}{\overset{|}{C}}-\overset{R^{65}}{\overset{|}{C}}=N-O-SO_2-R^{63} \quad (9)$$

$R^{63}$, $R^{64}$ and $R^{65}$ are normal, branched or cyclic alkyl groups of 1 to 12 carbon atoms which may be halogenated, aryl groups of 6 to 12 carbon atoms which may be halogenated, or aralkyl groups of 7 to 12 carbon atoms. Alternatively, $R^{64}$ and $R^{65}$, taken together, form a cyclic structure with the proviso that $R^{64}$ and $R^{65}$ each are a normal or branched alkylene group of 1 to 6 carbon atoms when they form a cyclic structure.

Examples of the alkyl, halogenated alkyl, aryl, halogenated aryl, and aralkyl groups represented by $R^{63}$, $R^{64}$ and $R^{65}$ are the same as described for $R^{61}$ and $R^{62}$. Examples of the alkylene group represented by $R^{64}$ and $R^{65}$ include methylene, ethylene, propylene, butylene, and hexylene.

Typical examples of the photoacid generator (C) are:
onium salts such as
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl) sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethanesulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate, and
dicyclohexylphenylsulfonium p-toluenesulfonate;

diazomethane derivatives such as bis(benzenesulfonyl)diazomethane, bis(p-toluenesulfonyl)diazomethane, bis-(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n- butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonate ester derivatives such as 1,2,3-tris (methanesulfonyloxy)benzene, 1,2,3-tris (trifluoromethanesulfonyloxy)benzene, and 1,2,3-tris (p-toluenesulfonyloxy)benzene; and imide-yl sulfonates such as phthalimide-yl triflate, phthalimide-yl tosylate, 5-norbornene-2,3-dicarboxyimide-yl triflate, 5-norbornene-2,3-dicarboxyimide-yl tosylate, and 5-norbornene-2,3-dicarboxyimide-yl n-butylsulfonate.

Preferred among these are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl) diazomethane, bis(p-toluenesulfonyl)diazomethane, bis (cyclohexylsulfonyl)diazomethane, bis(n-butylsulfonyl) diazomethane, bis(isobutylsulfonyl)diazomethane, bis(sec-butylsulfonyl)diazomethane, bis(n-propylsulfonyl) diazomethane, bis(isopropylsulfonyl)diazomethane, and bis (tert-butylsulfonyl)diazomethane; and glyoxime derivatives such as bis-o-(p-toluenesulfonyl)-α-dimethylglyoxime and bis-o-(n-butanesulfonyl)-α-diphenylglyoxime. It is noted that the photoacid generators mentioned above may be used alone or in admixture of two or more. The onium salts are effective for improving rectangularity while the diazomethane derivatives and glyoxime derivatives are effective for reducing standing wave. A combination of an onium salt with a diazomethane or glyoxime derivative allows for finer profile adjustment.

Desirably, the photoacid generator is added in an amount of about 0.5 to 15 parts, especially about 1 to 8 parts by weight per 100 parts by weight of the base resin. Sensitivity would be low with less than 0.5 part of the photoacid generator. More than 15 parts of the photoacid generator would lower an alkali dissolution rate to detract from resolution. Additionally heat resistance lowers because monomeric components become excessive.

Component (D) is another base resin in the form of a high molecular weight compound or polymer different from the crosslinked polymer defined as component (B). More preferably, component (D) is a polymer comprising recurring units of the following general formula (10) and having a weight average molecular weight of 3,000 to 300,000.

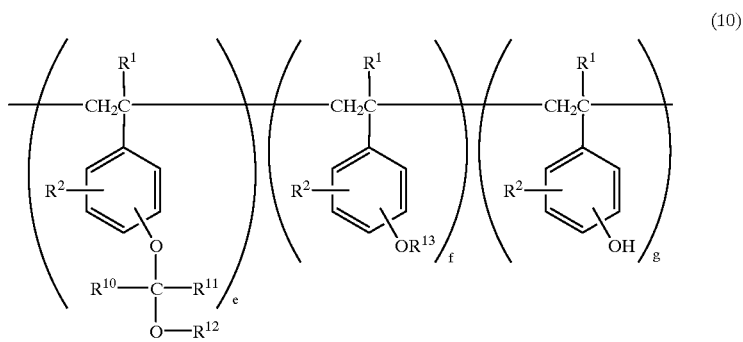

(10)

$R^1$, $R^2$, $R^{10}$, $R^{11}$, and $R^{12}$ are as defined above. $R^{13}$ is an acid labile group different from formula (5), for example, a group of the general formula (6), tert-alkyl group of 4 to 20 carbon atoms, trialkylsilyl group whose alkyl groups each have 1 to 6 carbon atoms, or oxoalkyl group of 4 to 20 carbon atoms. Letters e and f each are 0 or a positive number, e and f can be 0 at the same time, g is a positive number satisfying e+f+g=1. Their ratios are $0 \leq e/(e+f+g) \leq 0.5$, $0 \leq f/(e+f+g) \leq 0.5$ and $0.4 \leq g/(e+f+g) \leq 0.9$, preferably $0.1 \leq e/(e+f+g) \leq 0.4$, $0 \leq f/(e+f+g) \leq 0.2$ and $0.6 \leq g/(e+f+g) \leq 0.8$. If the proportion of e to the total (e+f+g) is more than 0.5, if the proportion of f to the total is more than 0.5, or if the proportion of g to the total is more than 0.9 or less than 0.4, then the contrast between alkali dissolution rates would lower to detract from resolution. By properly selecting the values of e, f and g within the above-defined range, the size and shape of a resist pattern can be controlled as desired.

The polymer has a weight average molecular weight (Mw) of 3,000 to 300,000, preferably 5,000 to 30,000. with Mw<3,000, a resist composition is less resistant to heat. With Mw>300,000, a resist composition becomes low in alkali dissolution and hence, resolution.

In the base resin as component (D), a wide molecular weight dispersity (Mw/Mn) means that there are present low molecular weight polymers and high molecular weight polymers. If low molecular weight polymers are predominant, heat resistance would be poor. If high molecular weight polymers are predominant, which means the presence of less alkali soluble components, a footing phenomenon occurs after pattern formation. As the pattern rule becomes finer, the influence of molecular weight and its dispersity becomes more significant. In order to provide a resist composition suitable for processing to fine pattern dimensions, the base resin is preferably a monodisperse polymer having a dispersity of 1.0 to 2.5, especially 1.0 to 1.5.

Preferably the base resin (D) is blended with the base resin (B) in the form of a crosslinked polymer in a weight ratio of from 0:100 to 90:10, more preferably from 0:100 to 50:50. If the base resin (D) is blended in excess of this weight ratio range relative to the base resin (B), the desired effect of the crosslinked polymer as base resin (B) would be somewhat lost.

In the resist composition of the invention, a dissolution regulator may be added as component (E).

The dissolution regulator (E) is a compound having an average molecular weight of 100 to 1,000, preferably 150 to 800 and at least two phenolic hydroxyl groups in a molecule, the hydrogen atom of the phenolic hydroxyl group being replaced by an acid labile group in an average proportion of 0% to 100% of the entire phenolic hydroxyl groups. The percent average replacement of the hydrogen atom of phenolic hydroxyl group by an acid labile group is 0 to 100 mol %, preferably 30 to 80 mol % of the entire phenolic hydroxyl groups.

The compound having at least two phenolic hydroxyl groups in a molecule as dissolution regulator (E) is exemplified by compounds of the following general formulae (i) to (xi):

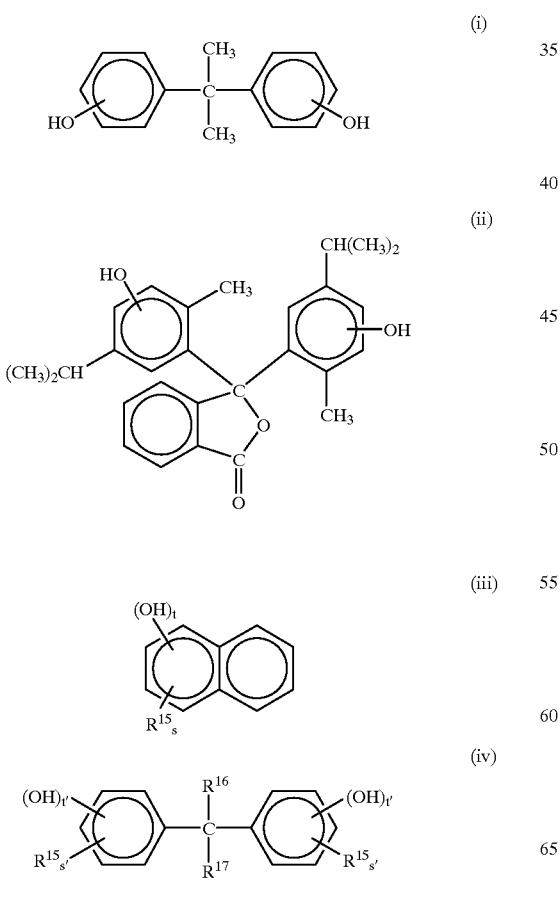

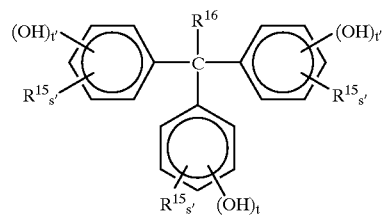

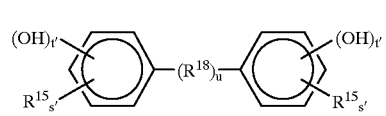

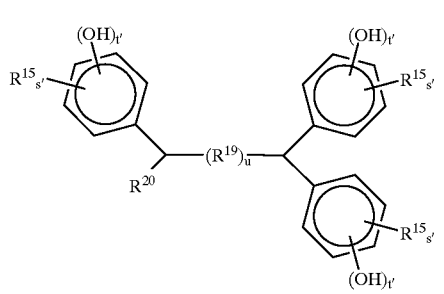

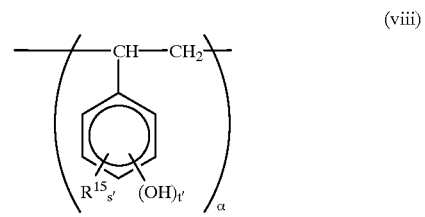

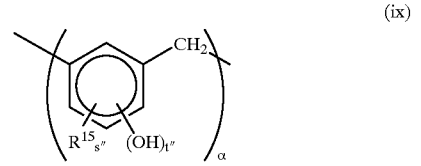

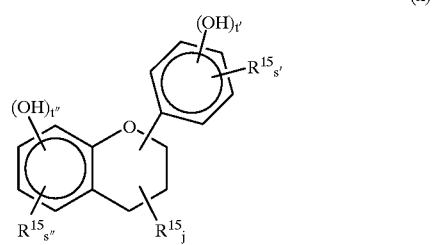

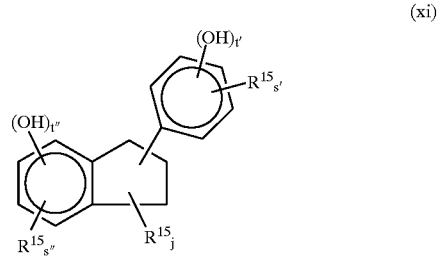

In the formulae, $R^{15}$ and $R^{16}$ are independently a hydrogen atom or normal or branched alkyl or alkenyl group having 1 to 8 carbon atoms. $R^{17}$ is a hydrogen atom, normal or branched alkyl or alkenyl group having 1 to 8 carbon atoms, or —$(R^{21})_h$—COOH. $R^{18}$ is a group —$(CH_2)_i$— wherein i is 2 to 10, arylene group having 6 to 10 carbon atoms, carbonyl group, sulfonyl group, oxygen atom or sulfur atom. $R^{19}$ is an alkylene group having 1 to 10 carbon atoms, arylene group having 6 to 10 carbon atoms, carbonyl group, sulfonyl group, oxygen atom or sulfur atom. $R^{20}$ is a hydrogen atom, normal or branched alkyl group having 1 to 8 carbon atoms, alkenyl group, hydroxyl-substituted phenyl group or hydroxyl-substituted naphthyl group. $R^{21}$ is a normal or branched alkylene group having 1 to 10 carbon atoms. Letter j is an integer of 0 to 5, u and h each are 0 or 1, and s, t, s', t', s", and t" are numbers satisfying s+t=8, s'+t'=5, and s"+t"=4 such that at least one hydroxyl group is attached to each phenyl skeleton. α is such a number that the compound of formula (viii) or (ix) may have a molecular weight of 100 to 1,000.

Exemplary groups represented by $R^{15}$ and $R^{16}$ are hydrogen, methyl, ethyl, propyl, butyl, ethynyl, and cyclohexyl groups. Exemplary groups represented by $R^{17}$ are as exemplified for $R^{15}$ and $R^{16}$ as well as —COOH and —$CH_2$COOH. Exemplary groups represented by $R^{18}$ are ethylene, phenylene, carbonyl, and sulfonyl groups, oxygen and sulfur atoms. Exemplary groups represented by $R^{19}$ are methylene and as exemplified for $R^{18}$. Exemplary groups represented by $R^{20}$ are hydrogen, methyl, ethyl, propyl, butyl, ethynyl, cyclohexyl, and hydroxyl-substituted phenyl and naphthyl groups.

The acid labile group in the dissolution regulator includes groups of formulae (5) and (6), tert-alkyl groups of 4 to 20 carbon atoms, trialkylsilyl groups whose alkyl groups each have 1 to 6 carbon atoms, and oxoalkyl groups of 4 to 20 carbon atoms.

The dissolution regulator in the form of a compound whose phenolic hydroxyl group is partially replaced by an acid labile group is preferably blended in the resist composition in an amount of 0 to about 50 parts, more preferably about 5 to 50 parts, most preferably 10 to 30 parts by weight per 100 parts by weight of the base resin. At least 5 parts of the dissolution regulator would be necessary to be effective for improving resolution whereas more than 50 parts would induce pattern thinning and detract from resolution.

The dissolution regulator mentioned above can be synthesized by chemically reacting an acid labile group with a compound having a phenolic hydroxyl group as in the preparation of the base resin.

As dissolution regulator (E), a compound having a weight average molecular weight of more than 1,000 to 3,000 and a phenolic hydroxyl group in a molecule wherein the hydrogen atom of the phenolic hydroxyl group being partially replaced by an acid labile group in an average proportion of 0% to 60% may be blended in addition to or instead of the above-mentioned compound. This compound is referred to as second compound or dissolution regulator.

The second compound in which the hydrogen atom of a phenolic hydroxyl group is partially replaced by an acid labile group is preferably selected from compounds comprising recurring units of the following general formula (11) and having a weight average molecular weight of more than 1,000 to 3,000.

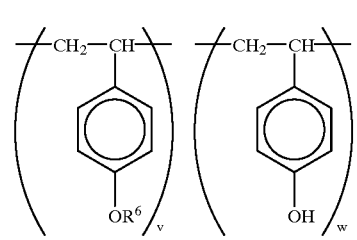

(11)

In formula (11), $R^6$ is an acid labile group, letters v and w are numbers satisfying $0 \leq v/(v+w) \leq 0.6$.

The acid labile group in the second dissolution regulator includes groups of formulae (5) and (6), tert-aklyl groups of 4 to 20 carbon atoms, trialkylsilyl groups whose alkyl groups each have 1 to 6 carbon atoms, and oxoalkyl groups of 4 to 20 carbon atoms.

The blending amount of the first and second dissolution regulator s combined is preferably 0 to 50 parts, more preferably 0 to 30 parts, especially 1 to 30 parts by weight per 100 parts by weight of the base resin.

The second dissolution regulator can be synthesized by chemically reacting an acid labile group with a compound having a phenolic hydroxyl group as in the preparation of the base resin.

In the resist composition of the invention, a basic compound (F) is blended. The basic compound is preferably a compound which can suppress the diffusion rate at which the acid generated from the photoacid generator diffuses into a resist coating. The blending of such a basic compound suppresses the diffusion rate of acid in a resist coating to improve resolution, suppresses a change of sensitivity after exposure, and mitigates substrate and environment dependency, achieving improvements in exposure margin and pattern profile.

Included in the basic compound are primary, secondary and tertiary aliphatic amines, hybrid amines, aromatic amines, heterocyclic amines, carboxyl-bearing nitrogenous compounds, sulfonyl-bearing nitrogenous compounds, hydroxyl-bearing nitrogenous compounds, hydroxyphenyl-bearing nitrogenous compounds, alcoholic nitrogenous compounds, amide derivatives, and imide derivatives.

Examples of the primary aliphatic amine include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of the secondary aliphatic amine include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of the tertiary aliphatic amine include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'- tetramethylethylenediamine, and N,N,N',N'-tetramethyltetraethylenepentamine.

Examples of the hybrid amine include dimethylethylamine, methylethylpropylamine, benzylamine, phenethylamine, and benzyldimethylamine. Examples of the aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazane derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinylpyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the carboxyl-bearing nitrogenous compound include aminobenzoic acid, indolecarboxylic acid, amino acid derivatives such as nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine. Examples of the sulfonyl-bearing nitrogenous compound include 3-pyridinesulfonic acid and pyridinium p-toluenesulfonate. Examples of the hydroxyl-bearing nitrogenous compound, hydroxyphenyl-bearing nitrogenous compound, and alcoholic nitrogenous compound include 2-hydroxypyridine, aminocresole, 2,4-quinoline diol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy) ethyl]piperazine, piperidine ethanol, 1-(2-hydroxyethyl)pyrrolidine, 1-(2-hydroxyethyl)-2-pyrrolidinone, 3-piperidino-1,2-propane diol, 3-pyrrolidino-1,2-propane diol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of the amide derivative include formamide, N-methylformamide, N,N-dimethylformamide, acetamide, N-methylacetamide, N,N-dimethylacetamide, propionamide, and benzamide. Exemplary imide derivatives are phthalimide, succinimide, and maleimide.

Also included are basic compounds of the following general formulae (12) and (13).

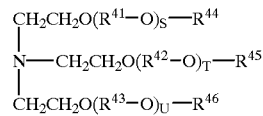

(12)

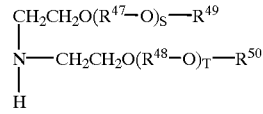

(13)

In formulae (12) and (13), $R^{41}$, $R^{42}$, $R^{43}$, $R^{47}$, and $R^{48}$ are independently normal, branched or cyclic alkylene groups of 1 to 20 carbon atoms. $R^{44}$, $R^{45}$, $R^{46}$, $R^{49}$, and $R^{50}$ are independently hydrogen, alkyl groups of 1 to 20 carbon atoms, or amino groups. Alternatively, $R^{44}$ and $R^{45}$, $R^{45}$ and $R^{46}$, $R^{44}$ and $R^{46}$, or $R^{44}$ and $R^{45}$ and $R^{46}$, and $R^{49}$ and $R^{50}$, taken together, may form a ring. S, T and U are integers of 0 to 20, with the proviso that hydrogen is excluded from $R^{44}$, $R^{45}$, $R^{46}$, $R^{49}$, and $R^{50}$ when S, T and U are equal to 0.

The alkylene groups represented by $R^{41}$, $R^{42}$, $R^{43}$, $R^{47}$, and $R^{48}$ are preferably those of 1 to 20 carbon atoms, more preferably 1 to 10 carbon atoms, most preferably 1 to 8 carbon atoms, such as methylene, ethylene, n-propylene, isopropylene, n-butylene, isobutylene, n-pentylene, isopentylene, hexylene, nonylene, decylene, cyclopentylene, and cyclohexylene. The alkyl groups represented by $R^{44}$, $R^{45}$, $R^{46}$, $R^{49}$, and $R^{50}$ are preferably those of 1 to 20 carbon atoms, more preferably 1 to 8 carbon atoms, most preferably 1 to 6 carbon atoms, while they may be normal, branched or cyclic. Exemplary alkyl groups are methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl. Where $R^{44}$ and $R^{45}$, $R^{45}$ and $R^{46}$, $R^{44}$ and $R^{46}$, $R^{44}$ and $R^{45}$ and $R^{46}$, or $R^{49}$ and $R^{50}$ form a ring, the ring preferably has 1 to 20 carbon atoms, more preferably 1 to 8 carbon atoms, most preferably 1 to 6 carbon atoms and may have branched therefrom an alkylene group of 1 to 6 carbon atoms, especially 1 to 4 carbon atoms. Each of S, T and U is an integer of 0 to 20, preferably 1 to 10, more preferably 1 to 8.

Illustrative examples of the compounds of formulae (12) and (13) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy) ethyl}amine, tris{2-(1-ethoxyethoxy)ethyl}amine, tris{2-(1-ethoxypropoxy)ethyl}amine, tris[2-{(2-hydroxyethoxy) ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16- diazabicyclooctadecane, 1-aza-12-crown-4, 1-aza-15-crown-5, and 1-aza-18-crown-6.

Especially preferred basic compounds are tertiary amines, aniline derivatives, pyrrolidine derivatives, pyridine derivatives, quinoline derivatives, amic acid derivatives, nitrogenous compounds having a hydroxyl group, nitrogenous compounds having a hydroxyphenyl group, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)methyl}ethyl]amine, and 1-aza-15-crown-5.

The above-mentioned basic compounds may be used alone or in admixture of two or more. Preferably the basic compound is blended in an amount of 0 to about 2 parts, especially about 0.01 to 1 part by weight per 100 parts by weight of the base resin. More than 2 parts of the basic compound would adversely affect sensitivity.

Optional component (G) blended in the resist composition of the invention is an aromatic compound having a group ≡C—COOH in a molecule. It may be at least one compound selected from the following classes I and II although the invention is not limited thereto.

Class I

Compounds of the following general formulae (14) to (23) wherein some or all of the hydrogen atoms of phenolic hydroxyl groups are replaced by —$R^{21}$—COOH wherein $R^{21}$ is a normal or branched alkylene group having 1 to 10 carbon atoms and the molar fraction of the phenolic hydroxyl group (C mol) in the molecule to the group ≡C—COOH (D mol) is C/(C+D)=0.1 to 1.0.

Class II

Compounds of the following general formulae (24) to (25)

Class I (14)

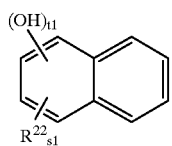

(15)

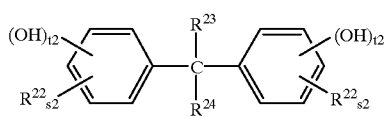

(16)

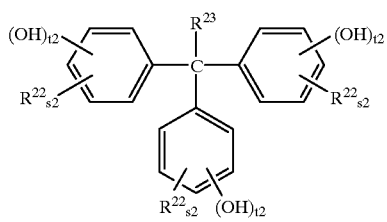

(17)

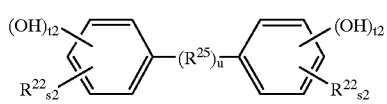

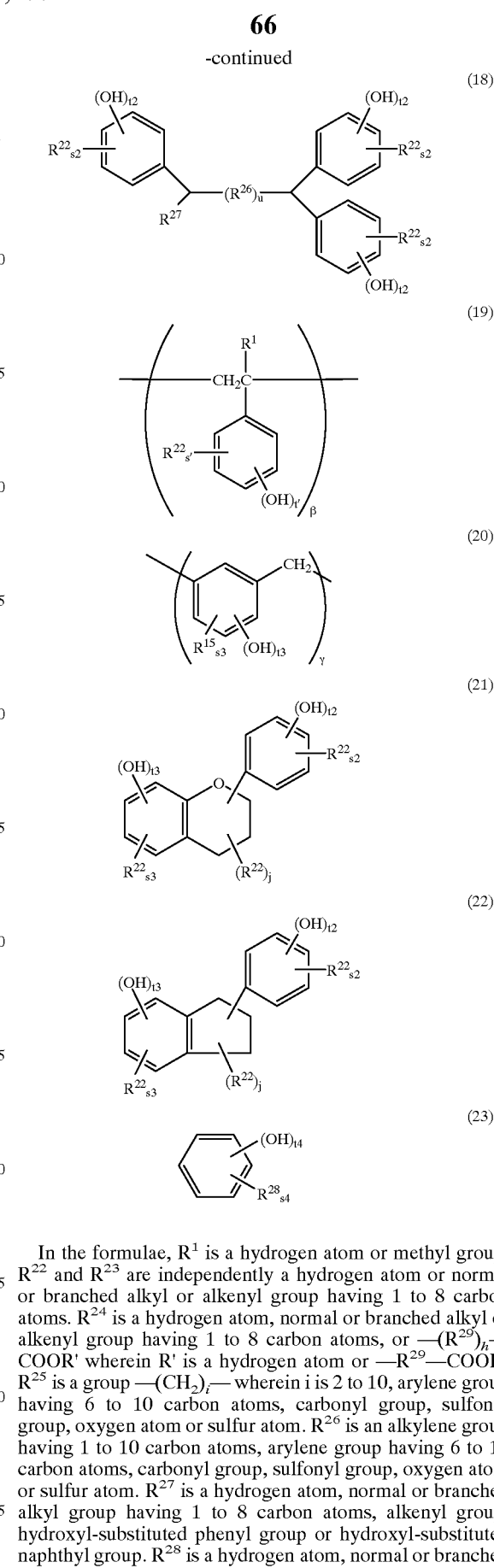

In the formulae, $R^1$ is a hydrogen atom or methyl group. $R^{22}$ and $R^{23}$ are independently a hydrogen atom or normal or branched alkyl or alkenyl group having 1 to 8 carbon atoms. $R^{24}$ is a hydrogen atom, normal or branched alkyl or alkenyl group having 1 to 8 carbon atoms, or —$(R^{29})_h$—COOR' wherein R' is a hydrogen atom or —$R^{29}$—COOH. $R^{25}$ is a group —$(CH_2)_i$— wherein i is 2 to 10, arylene group having 6 to 10 carbon atoms, carbonyl group, sulfonyl group, oxygen atom or sulfur atom. $R^{26}$ is an alkylene group having 1 to 10 carbon atoms, arylene group having 6 to 10 carbon atoms, carbonyl group, sulfonyl group, oxygen atom or sulfur atom. $R^{27}$ is a hydrogen atom, normal or branched alkyl group having 1 to 8 carbon atoms, alkenyl group, hydroxyl-substituted phenyl group or hydroxyl-substituted naphthyl group. $R^{28}$ is a hydrogen atom, normal or branched alkyl or alkenyl group having 1 to 8 carbon atoms, or —$R^{29}$—COOH. $R^{29}$ is a normal or branched alkylene group having 1 to 10 carbon atoms. Letter j is an integer of 0 to 5, u and h each are 0 or 1, and s1, t1, s2, t2, s3, t3, s4, and t4 are numbers satisfying s1+t1=8, s2+t2=5, s3+t3=4, and s4+t4=6 such that at least one hydroxyl group is attached to each phenyl skeleton. β is such a number that the compound of formula (19) may have a weight average molecular weight of 1,000 to 5,000. γ is such a number that the compound of formula (20) may have a weight average molecular weight of 1,000 to 10,000.

Class II

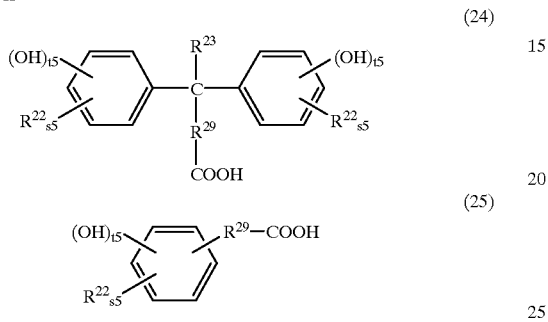

(24)

(25)

In the formulae, $R^{22}$, $R^{23}$, and $R^{29}$ are as defined above, and s5 and t5 are numbers satisfying s5≧0, t5≧0, and s5+t5=5.

Exemplary of component (G) are compounds of the following formulae VIII-1 to VIII-14 and IX-1 to IX-6.

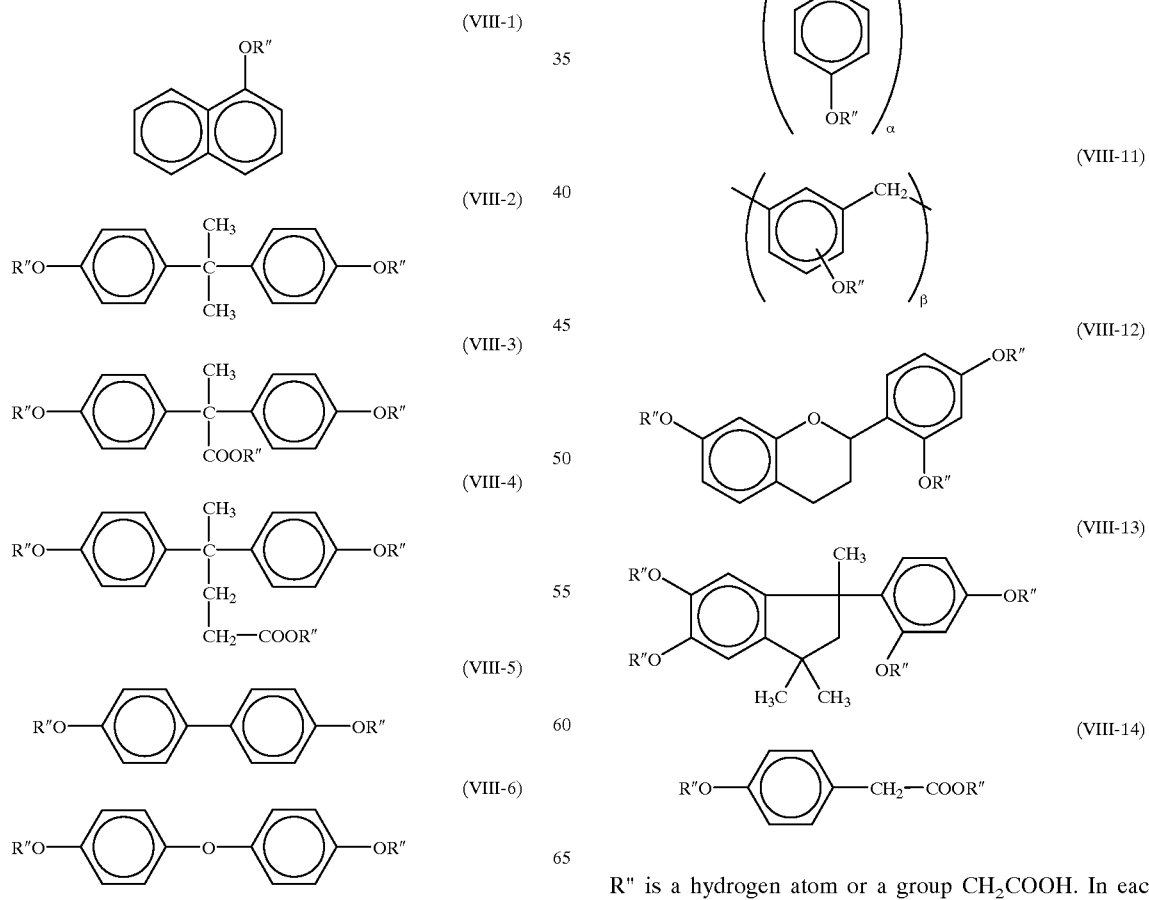

(VIII-1)
(VIII-2)
(VIII-3)
(VIII-4)
(VIII-5)
(VIII-6)
(VIII-7)
(VIII-8)
(VIII-9)
(VIII-10)
(VIII-11)
(VIII-12)
(VIII-13)
(VIII-14)

R″ is a hydrogen atom or a group $CH_2COOH$. In each compound, 10 to 100 mol % of R″ is $CH_2COOH$.

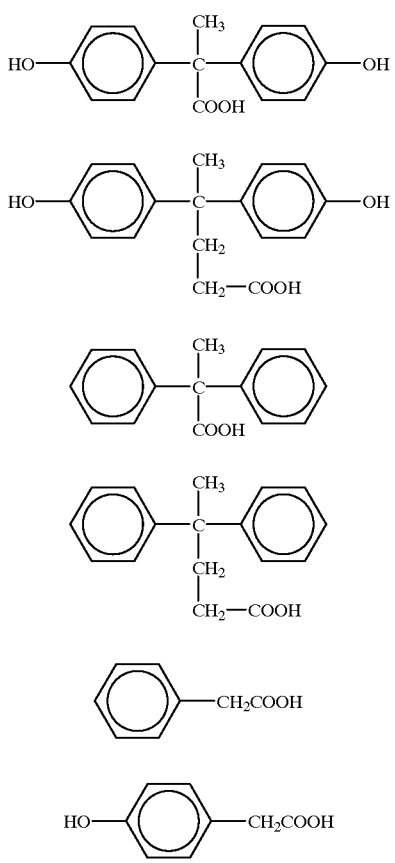

(IX-1)
(IX-2)
(IX-3)
(IX-4)
(IX-5)
(IX-6)

The aromatic compounds having a group ≡C—COOH in a molecule may be used alone or in admixture of two or more. It is preferably blended in the resist composition in an amount of 0 to about 5 parts, preferably about 0.1 to 5 parts, more preferably about 1 to 3 parts by weight per 100 parts by weight of the base resin. More than 5 parts of the aromatic compound would adversely affect resolution.

In the resist composition of the invention, a UV absorber may be added as component (H). It is a compound having a molar absorptivity of up to 10,000 at a wavelength of 248 nm.

Exemplary UV absorbers are fused polycyclic hydrocarbon derivatives such as pentalene, indene, naphthalene, azulene, heptalene, biphenylene, indacene, fluorene, phenalene, phenanthrene, anthracene, fluoranthene, acephenanthrylene, aceanthrylene, triphenylene, pyrene, chrysene, naphthalene, pleiadene, picene, perylene, pentaphene, pentacene, benzophenanthrene, anthraquinone, anthrobenzanthrone, 2,7-dimethoxynaphthalene, 2-ethyl-9,10-dimethoxyanthracene, 9,10-dimethylanthracene, 9-ethoxyanthracene, 1,2-naphthoquinone, 9-fluorene, and compounds of the following formulae (24) and (25); fused heterocyclic derivatives such as thioxanthen-9-one, thianthrene, and dibenzothiophene; benzophenone derivatives such as 2,3,4-trihydroxybenzophenone, 2,3,4,4'-tetrahydroxybenzophenone, 2,4-dihydroxybenzophenone, 3,5-dihydroxybenzophenone, 4,4'-dihydroxybenzophenone, and 4,4'-bis(dimethylamino)benzophenone; and squalic acid derivatives such as squalic acid and dimethyl squalate.

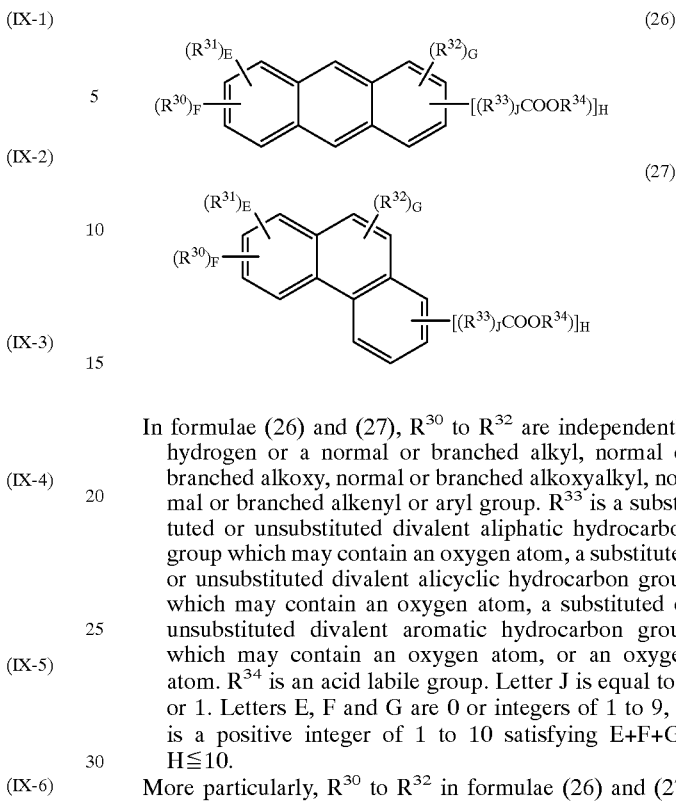

(26)
(27)

In formulae (26) and (27), $R^{30}$ to $R^{32}$ are independently hydrogen or a normal or branched alkyl, normal or branched alkoxy, normal or branched alkoxyalkyl, normal or branched alkenyl or aryl group. $R^{33}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom. $R^{34}$ is an acid labile group. Letter J is equal to 0 or 1. Letters E, F and G are 0 or integers of 1 to 9, H is a positive integer of 1 to 10 satisfying E+F+G+H≦10.

More particularly, $R^{30}$ to $R^{32}$ in formulae (26) and (27) are independently hydrogen or a normal or branched alkyl, normal or branched alkoxy, normal or branched alkoxyalkyl, normal or branched alkenyl or aryl group. The normal or branched alkyl groups are preferably those having 1 to 10 carbon atoms, for example, methyl, ethyl, n-propyl, isopropyl, n-butyl, sec-butyl, tert-butyl, hexyl, cyclohexyl and adamantyl groups, with the methyl, ethyl, isopropyl and tert-butyl groups being especially preferred. The normal or branched alkoxy groups are preferably those having 1 to 8 carbon atoms, for example, methoxy, ethoxy, propoxy, isopropoxy, n-butoxy, sec-butoxy, tert-butoxy, hexyloxy, and cyclohexyloxy groups, with the methoxy, ethoxy, isopropoxy, and tert-butoxy groups being especially preferred. The normal or branched alkoxyalkyl groups are preferably those having 2 to 10 carbon atoms, for example, methoxymethyl, 1-ethoxyethyl, 1-ethoxypropyl, 1-propoxyethyl, and 1-tert-butoxyethyl groups, with the methoxymethyl, 1-ethoxyethyl, 1-ethoxypropyl and 1-propoxyethyl groups being especially preferred. The normal or branched alkenyl groups are preferably those having 2 to 4 carbon atoms, for example, vinyl, propenyl, allyl, and butenyl groups. The aryl groups are preferably those having 6 to 14 carbon atoms, for example, phenyl, xylyl, toluyl, and cumenyl groups.

$R^{33}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom. Letter J is equal to 0 or 1. Where J=0, the —$R^{33}$— linkage is a valence bond. The substituted or unsubstituted divalent aliphatic hydrocarbon groups which may contain an oxygen atom are preferably those having 1 to 10 carbon atoms, for example, methylene, ethylene, n-propylene, isopropylene, n-butylene, sec-butylene, —$CH_2O$—, —$CH_2CH_2O$—, and —CH$_2$OCH$_2$— groups, with the methylene, ethylene, —CH$_2$O—, and —CH$_2$CH$_2$O— being especially preferred. The substituted or unsubstituted divalent alicyclic hydrocarbon groups which may contain an oxygen atom are preferably those having 5 to 10 carbon atoms, for example, 1,4-cyclohexylene, 2-oxacyclohexan-1,4-ylene, and 2-thiacyclohexan-1,4-ylene. The substituted or unsubstituted divalent aromatic hydrocarbon groups which may contain an oxygen atom include those having 6 to 14 carbon atoms, for example, o-phenylene, p-phenylene, 1,2-xylen-3,6-ylene, toluen-2,5-ylene, and 1-cumen-2,5-ylene groups, and arylalkylene groups having 6 to 14 carbon atoms, for example, —CH$_2$Ph—, —CH$_2$PhCH$_2$—, —OCH$_2$Ph—, and —OCH$_2$PhCH$_2$O— groups wherein Ph is phenylene.

R$^{34}$ is an acid labile group. The term acid labile group used herein is a carboxyl group which is replaced by at least one functional group decomposable in the presence of acid. The acid labile group is not particularly limited as long as it is decomposed in the presence of acid to release a functional group exhibiting alkali solubility. Preferred are groups of the following general formulae (28a), (28b), and (28c).

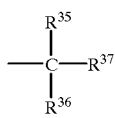
(28a)

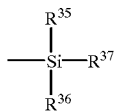
(28b)

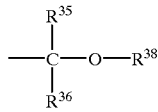
(28c)

In the formulae, R$^{35}$ to R$^{38}$ are independently hydrogen or a normal or branched alkyl, normal or branched alkoxy, normal or branched alkoxyalkyl, normal or branched alkenyl or aryl group, which may contain a carbonyl group in their chain. It is excluded that all of R$^{35}$ to R$^{38}$ are hydrogen. Alternatively, R$^{35}$ and R$^{36}$, taken together, may form a ring. R$^{38}$ is a normal or branched alkyl, normal or branched alkoxyalkyl, normal or branched alkenyl or aryl group, which may contain a carbonyl group in their chain. Alternatively, R$^{38}$ and R$^{35}$, taken together, may form a ring.

Examples of the normal or branched alkyl, normal or branched alkoxy, normal or branched alkoxyalkyl, normal or branched alkenyl, and aryl groups are as exemplified for R$^{30}$ to R$^{32}$.

The ring that R$^{35}$ forms with R$^{36}$ in formula (28a) includes those rings of 4 to 10 carbon atoms, for example, cyclohexylidene, cyclopentylidene, 3-oxycyclohexylidene, 3-oxo-4-oxacyclohexylidene, and 4-methylcyclohexylidene. The ring that R$^{35}$ forms with R$^{36}$ in formula (28b) includes those rings of 3 to 9 carbon atoms, for example, 1-silacyclohexylidene, 1-silacyclopentylidene, 3-oxo-1-silacyclopentylidene, and 4-methyl-1-silacyclopentylidene. The ring that R$^{38}$ forms with R$^{35}$ in formula (28c) includes those rings of 4 to 10 carbon atoms, for example, 2-oxacyclohexylidene, 2-oxacyclopentylidene, and 2-oxa-4-methylcyclohexylidene.

Examples of the group of formula (28a) include tertiary alkyl groups of 4 to 10 carbon atoms, such as tert-amyl, 1,1-dimethylethyl, 1,1-dimethylbutyl, 1-ethyl-1-methylpropyl, and 1,1-diethylpropyl, and 3-oxoalkyl groups such as 1,1-dimethyl-3-oxobutyl, 3-oxocyclohexyl, and 1-methyl-3-oxo-4-oxacyclohexyl groups.

Examples of the group of formula (28b) include trialkylsilyl groups of 3 to 10 carbon atoms, such as trimethylsilyl, ethyldimethylsilyl, dimethylpropylsilyl, diethylmethylsilyl, and triethylsilyl groups.

Examples of the group of formula (28c) include groups of 2 to 8 carbon atoms, such as 1-methoxymethyl, 1-methoxyethyl, 1-ethoxyethyl, 1-ethoxypropyl, 1-ethoxyisobutyl, 1-n-propoxyethyl, 1-tert-butoxyethyl, 1-n-butoxyethyl, 1-iso-butoxethyl, 1-tert-pentoxyethyl, 1-cyclohexyloxyethyl, 1-(2-n-butoxyethoxy)ethyl, 1-(2-ethylhexyl)oxyethyl, 1-{(4-acetoxymethyl)cyclohexylmethyloxy}ethyl, 1-{4-(tert-butoxycarbonyloxymethyl)cyclohexylmethyloxy}ethyl, 1-methoxy-1-methylethyl, 1-ethoxypropyl, dimethoxymethyl, diethoxymethyl, 2-tetrahydrofuranyl, and 2-tetrahydropyranyl groups.

In formulae (26) and (27), E, F and G are 0 or integers 1 to 9, H is a positive integer of 1 to 10 satisfying E+F+G+H≦10.

Preferred examples of the compounds of formulae (26) and (27) are compounds of the general formulae (29a) to (29j) shown below.

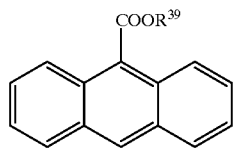
(29a)

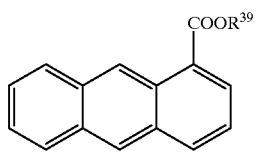
(29b)

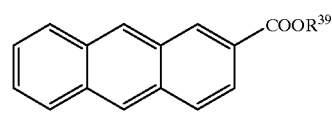
(29c)

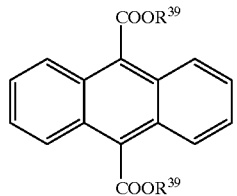
(29d)

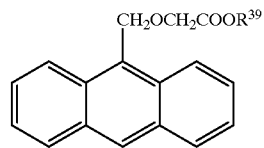
(29e)

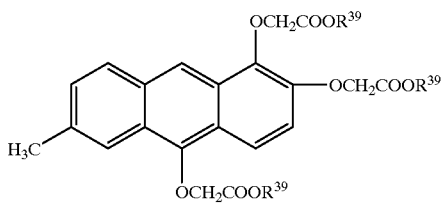
(29f)

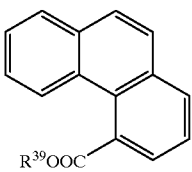
(29g)

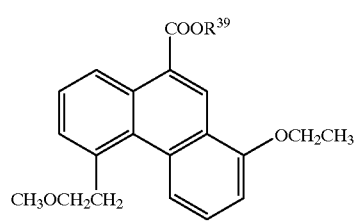
(29h)

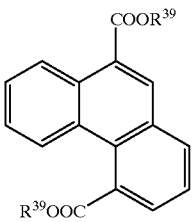
(29i)

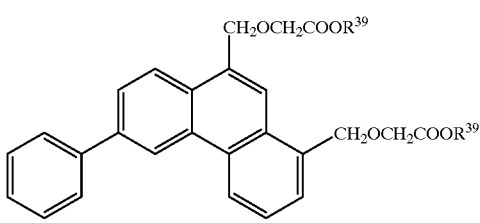
(29j)

In the formulae, $R^{39}$ is an acid labile group similar to $R^6$.

Other useful UV absorbers are diaryl sulfoxide derivatives such as bis(4-hydroxyphenyl)sulfoxide, bis(4-tert-butoxyphenyl)sulfoxide, bis(4-tert-butoxycarbonyloxyphenyl)sulfoxide, and bis[4-(1-ethoxyethoxy)phenyl]sulfoxide; diarylsulfone derivatives such as bis(4-hydroxyphenyl)sulfone, bis(4-tert-butoxyphenyl)sulfone, bis(4-tert-butoxycarbonyloxyphenyl)sulfone, bis[4-(1-ethoxyethoxy)phenyl]sulfone, and bis[4-(1-ethoxypropoxy)phenyl]sulfone; diazo compounds such as benzoquinonediazide, naphthoquinonediazide, anthraquinonediazide, diazofluorene, diazotetralone, and diazophenanthrone; and quinonediazide group-containing compounds such as complete or partial ester compounds between naphthoquinone-1,2-diazide-5-sulfonic acid chloride and 2,3,4-trihydroxybenzophenone and complete or partial ester compounds between naphthoquinone-1,2-diazide-4-sulfonic acid chloride and 2,4,4'-trihydroxybenzophenone.

Preferred UV absorbers are tert-butyl 9-anthracenecarboxylate, tert-amyl 9-anthracenecarboxylate, tert-methoxymethyl 9-anthracenecarboxylate, tert-ethoxyethyl 9-anthracenecarboxylate, tert-tetrahydropyranyl 9-anthracenecarboxylate, tert-tetrahydrofuranyl 9-anthracenecarboxylate, and partial ester compounds between naphthoquinone-1,2-diazide-5-sulfonic acid chloride and 2,3,4-trihydroxybenzophenone.

The amount of UV absorber (H) blended is preferably 0 to about 10 parts, more preferably about 0.5 to 10 parts, most preferably about 1 to 5 parts by weight per 100 parts by weight of the base resin.

In the resist composition of the invention, an acetylene alcohol derivative may be blended as component (I) for improving shelf stability. The acetylene alcohol derivative used herein is preferably selected from compounds of the following general formulae (30) and (31).

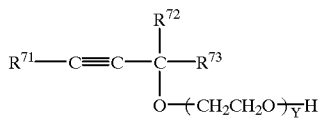
(30)

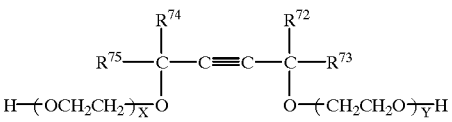
(31)

In formulae (30) and (31), $R^{71}$, $R^{72}$, $R^{73}$, $R^{74}$, and $R^{75}$ each are hydrogen or a normal, branched or cyclic alkyl group having 1 to 8 carbon atoms, X and Y are 0 or positive numbers satisfying $0 \leq X \leq 30$, $0 \leq Y \leq 30$, and $0 \leq X+Y23\ 40$.

Useful acetylene alcohol derivatives are commercially available under the trade name of Surfy-nol 61, Surfy-nol 82, Surfy-nol 104, Surfy-nol 104E, Surfy-nol 104H, Surfy-nol 104A, Surfy-nol TG, Surfy-nol PC, Surfy-nol 440, Surfy-nol 465, and Surfy-nol 485 from Air Products and Chemicals Inc. and Surfy-nol E1004 from Nisshin Chemical Industry K.K.

The acetylene alcohol derivative is preferably added in an amount of 0.01 to 2%, more preferably 0.02 to 1% by weight based on the resist composition. Less than 0.01% by weight of the acetylene alcohol derivative would be ineffective for improving coating and shelf stability whereas more than 2% by weight would result in a resist composition with low resolution.

The resist composition of the invention may further contain various additives, for example, a surface-active agent for facilitating coating. The amounts of such optional additives blended are conventional insofar as the objects of the invention are not impaired. Nonionic surfactants are preferred. Examples of the surfactant include perfluoroalkylpolyoxyethylene ethanols, fluorinated alkyl esters, perfluoroalkylamine oxides, and fluorinated organosiloxane compounds. Useful surfactants are commercially available under the trade name of Florade FC-430 and FC-431 from Sumitomo 3M K.K., Surflon S-141 and S-145 from Asahi Glass K.K., Unidine DS-401, DS-403 and DS-451 from Daikin Industry K.K., Megafac F-8151 from Dai-Nihon Ink Industry K.K., and X-70-092 and X-70-093 from Shin-Etsu Chemical Co., Ltd. Preferred surfactants are Florade FC-430 from Sumitomo 3M K.K. and X-70-093 from Shin-Etsu Chemical Co., Ltd.

Any well-known lithography may be used to form a resist pattern from a positive resist composition of the invention.

For example, the resist composition is spin coated onto a silicon wafer and prebaked on a hot plate at a temperature of 60 to 150° C. for about 1 to 10 minutes, preferably 80 to 120° C. for 1 to 5 minutes. The resulting resist film is generally 0.5 to 2.0 µm thick. With a mask having a desired pattern placed above the resist film, the resist film is then exposed to actinic radiation having a wavelength of up to 300 nm such as deep-UV, excimer laser light, and X-ray or electron beam in an exposure dose of about 1 to 200 mJ/cm$^2$, preferably about 10 to 100 mJ/cm$^2$. The film is further baked on a hot plate at 60 to 150° C. for 1 to 5 minutes, preferably 80 to 120° C. for 1 to 3 minutes (post-exposure baking= PEB). Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably ½ to 2 minutes by a conventional technique such as dipping, puddling or spraying. In this way, a desired positive resist pattern is formed on the substrate. The chemically amplified positive resist composition of the invention is best suited for fine patterning with actinic radiation, especially radiation having a wavelength of 254 to 193 nm such as deep-UV, excimer laser light, and X-ray and electron beam. Outside the range, a failure to provide the desired pattern can occur.

The chemically amplified positive resist composition using the polymer of the invention as a base resin is sensitive to actignic radiation, has improved sensitivity, resolution and plasma etching resistance, and produces a heat resistant resist pattern. The pattern is unlikely to overhang and dimensional control is improved. Owing to these advantages, the chemically amplified positive resist composition of the invention provides a resist material having less absorption, especially at the exposure wavelength of a KrF excimer laser. A fine pattern having a wall perpendicular to the substrate is easily formed. Thus the composition is suitable as a fine patterning material for the manufacture of ultra-LSIs.

EXAMPLE

Examples of the present invention are given below by way of illustration and not by way of limitation. The following abbreviations are used.

GPC: gel permeation chromatography

Mw: weight average molecular weight

Mn: number average molecular weight

P(HS/MMA): poly(p-hydroxystyrene-methyl methacrylate)

Synthesis Example 1

A 10-liter flask was charged with 3.5 liters of tetrahydrofuran as a solvent and 1×10$^{-2}$ mol of sec-butyllithium as a polymerization initiator. To the flask at −78° C., 145 grams of 4-tert-butoxystyrene was added. With stirring, polymerization was effected for one hour. Further, 20 grams of methyl methacrylate was added to the reaction solution, which was stirred for one hour for polymerization. Polymerization was stopped by adding methanol to the reaction solution.

The reaction solution was then poured into methanol whereupon the resulting polymer precipitated. The polymer was separated and dried, obtaining 155 grams of a white solid. Analysis by $^{13}$C-NMR showed that the product was a copolymer consisting of 20% methyl methacrylate and 80% 4-tert-butoxystyrene.

In 2500 ml of acetone was dissolved 150 grams of the copolymer of methyl methacrylate and 4-tert-butoxystyrene. A small amount of conc. hydrochloric acid was added to the solution at 60° C., which was stirred for 6 hours. The solution was poured into water whereupon the polymer precipitated. The polymer was washed and dried, collecting 105 grams of a solid. The thus obtained polymer was found to be a polymer possessing a structure shown by the following rational formula (Polym.1) and having a weight average molecular weight of 1.2×10$^4$ g/mol as measured by GPC and high monodispersity (Mw/Mn=1.10). On analysis by $^1$H-NMR, no peak attributable to a tert-butyl group was found, indicating that the polymer was a copolymer of methyl methacrylate and 4-hydroxystyrene having a narrow molecular weight distribution.

Synthesis Examples 2–3

Polymers represented by rational formulae (Polym.2) and (Polym.3) were obtained by the same procedure as in Synthesis Example 1.

Synthesis Example 4

A polymer represented by rational formula (Polym.4) was obtained by the same procedure as in Synthesis Example 1 using 4-tert-butoxystyrene and styrene as the monomer.

Synthesis Example 5

A polymer represented by rational formula (Polym.5) was obtained by the same procedure as in Synthesis Example 1 using 4-tert-butoxystyrene and tert-butyl methacrylate as the monomers.

Synthesis Example 6

In a 2-liter flask, 100 grams of the poly(p-hydroxystyrene-methyl methacrylate) obtained in Synthesis Example 1 was dissolved in 900 grams of tetrahydrofuran, and 3.9 grams of methanesulfonic acid was added. With stirring at 30° C., 20.3 grams of ethyl vinyl ether was added to the reaction solution which was stirred for one hour for reaction. Thereafter, 3.0 grams of triethylene glycol divinyl ether was added to the reaction solution, which was stirred for ½ hour for reaction. After neutralization with conc. aqueous ammonia, the reaction solution was subjected to solvent exchange with ethyl acetate. using a separatory funnel with pure water and a small amount of acetone, the reaction solution was purified 6 times. Solvent exchange with acetone and addition to 20 liters of pure water yielded white solids. The solids were filtered, washed two times with pure water, filtered again, and dried in vacuo. The resulting polymer had a structure shown by the following rational formula (Polym.6).

Synthesis Example 7

In a 2-liter flask, 100 grams of the poly(p-hydroxystyrene-methyl methacrylate) obtained in Synthesis Example 1 was dissolved in 900 grams of tetrahydrofuran, and 3.9 grams of methanesulfonic acid was added. With stirring at 30° C., 16.8 grams of ethyl vinyl ether was added to the reaction solution which was stirred for one hour for reaction. Thereafter, 2.1 grams of cyclohexane dimethanol divinyl ether was added to the reaction solution, which was stirred for ½ hour for reaction. After neutralization with conc. aqueous ammonia, the reaction solution was subjected to solvent exchange with ethyl acetate. Using a separatory funnel with pure water and a small amount of acetone, the reaction solution was purified 6 times. Solvent exchange with acetone and addition to 20 liters of pure water yielded white solids. The solids were filtered, washed two times with pure water, filtered again, and dried in vacuo.

In 300 grams of pyridine was dissolved 50 grams of the partially crosslinked ethoxyethylated poly(p-hydroxystyrene-methyl methacrylate) thus obtained. With stirring at 40° C., 5.1 grams of di-tert-butyl dicarbonate was added to the solution, which was stirred for one hour for reaction. The reaction solution was poured into 10 liters of water, obtaining white solids. The solids were filtered, dissolved in 200 ml of acetone and then added dropwise to 2 liters of water. Filtration and drying in vacuo yielded a polymer. The resulting polymer had a structure shown by the following rational formula (Polym.7).

Synthesis Examples 8–16 and 26

Polymers represented by rational formulae (Polym.8) to (Polym.16) and (Polym.26) were obtained by the same procedure as in Synthesis Examples 6 and 7.

Synthesis Example 17

A polymer represented by rational formula (Polym.17) was obtained by reacting the poly(p-hydroxystyrene-methyl methacrylate) obtained in Synthesis Example 1 with 1,4-butanediol divinyl ether and di-tert-butyl dicarbonate.

Synthesis Example 18

A polymer represented by rational formula (Polym.18) was obtained by reacting the poly(p-hydroxystyrene-methyl methacrylate) obtained in Synthesis Example 1 with ethyl vinyl ether.

Synthesis Example 19

A polymer represented by rational formula (Polym.19) was obtained by reacting the poly(p-hydroxystyrene-methyl methacrylate) obtained in Synthesis Example 1 with di-tert-butyl dicarbonate.

Synthesis Examples 20–23

Polymers represented by rational formulae (Polym.20) to (Polym.23) were obtained by reacting the respective polymers obtained in Synthesis Examples 2 to 5 with ethyl-1-propenyl ether, 1,4-butanediol divinyl ether and di-tert-butyl dicarbonate.

Synthesis Example 24

A polymer represented by rational formula (Polym.24) was obtained by reacting the poly(p-hydroxystyrene-methyl methacrylate) obtained in Synthesis Example 1 with ethyl vinyl ether and di-tert-butyl dicarbonate.

Synthesis Example 25

A polymer represented by rational formula (Polym.25) was obtained by reacting the poly(p-hydroxystyrene-methyl methacrylate) obtained in Synthesis Example 1 with cyclohexane dimethanol divinyl ether.

The thus obtained polymers had structures as shown by the following rational formulae, with percent substitutions shown in Table 1. In the following formulae, R represents a group providing intermolecular or intramolecular crosslinking of units $U_1$, $U_2$ or $U_3$ and (R) represents the attachment of the crosslinking group R.

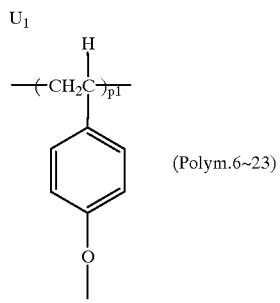

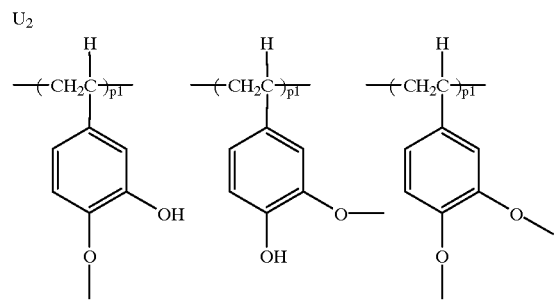

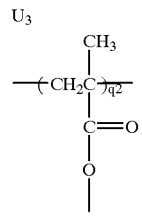

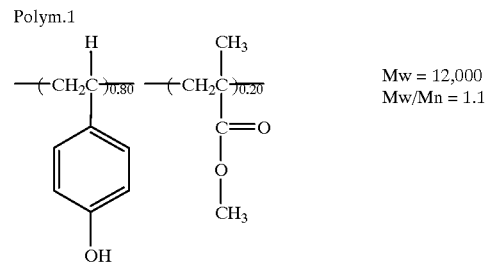

-continued
Polym.2
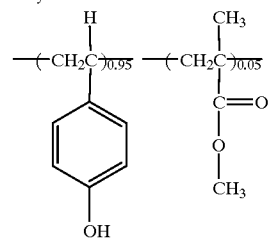
Mw = 11,000
Mw/Mn = 1.5
Polym.3
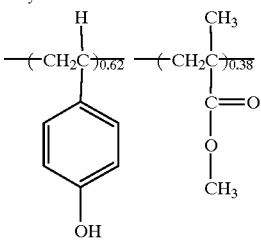
Mw = 7,000
Mw/Mn = 1.1
Polym.4
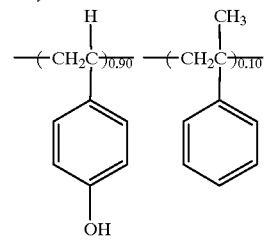
Mw = 13,000
Mw/Mn = 1.2
Polym.5
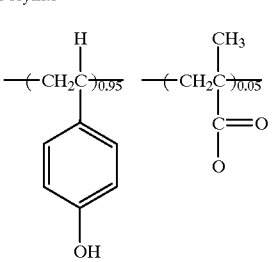
Mw = 12,000
Mw/Mn = 1.2
Polym.6
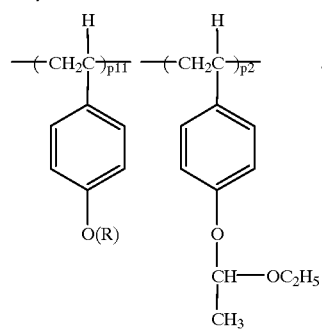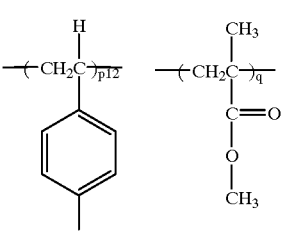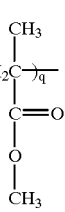
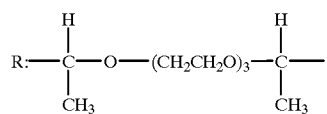
Polym.7
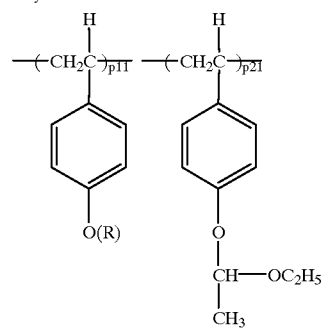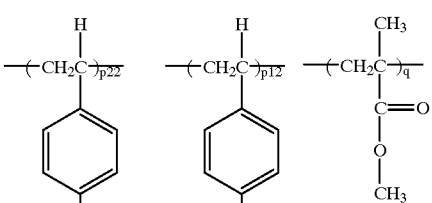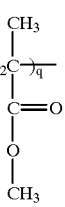
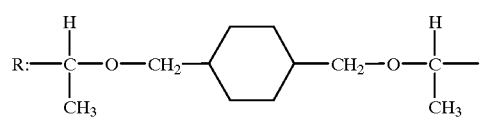

-continued
Polym.8
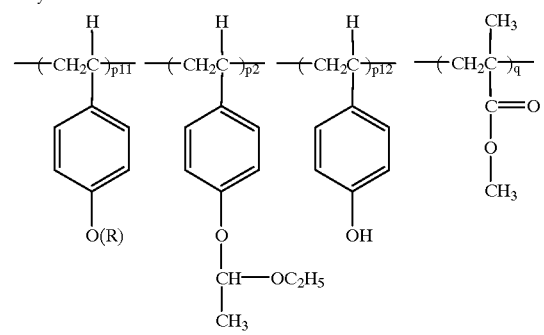
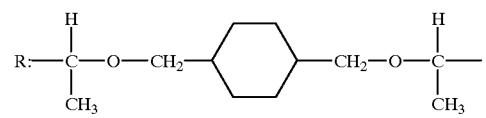
Polym.9
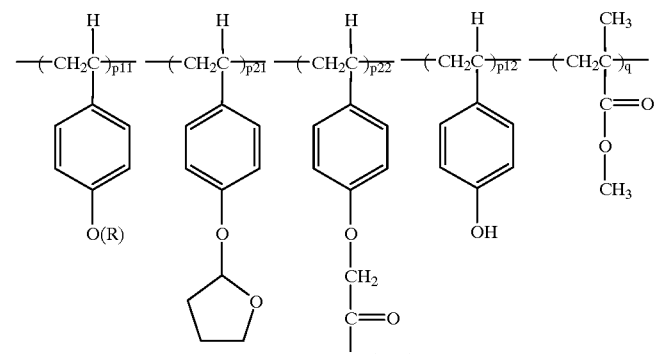
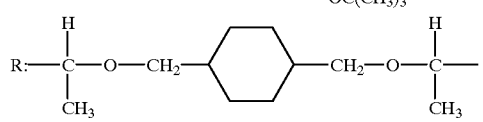
Polym.10
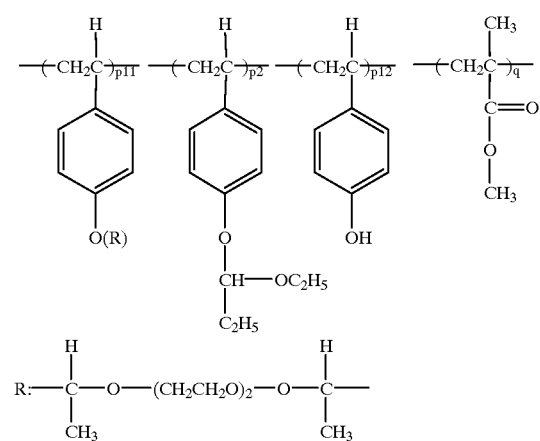
Polym.11
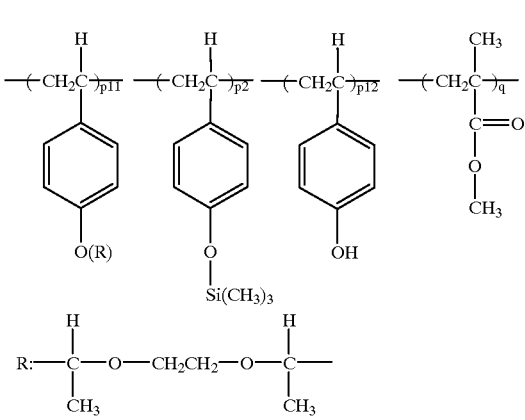

-continued
Polym.12
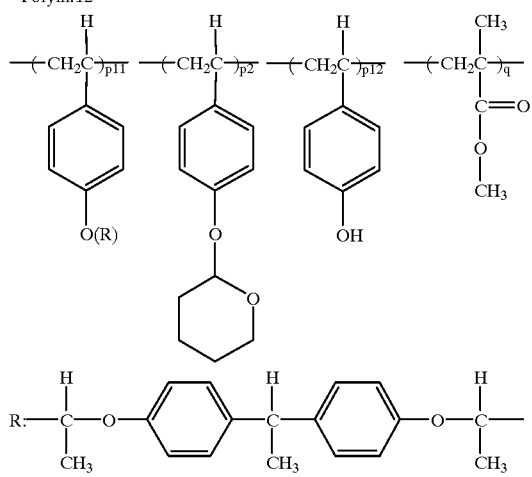
Polym.13
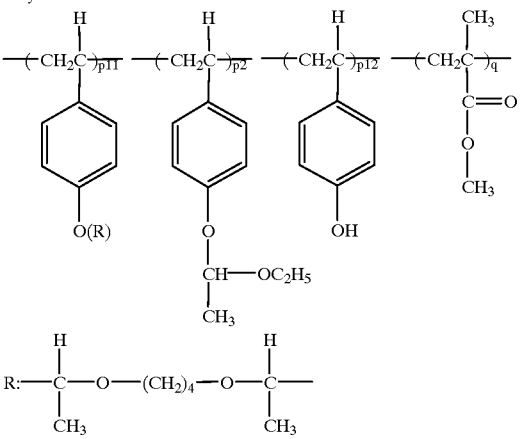
Polym.14
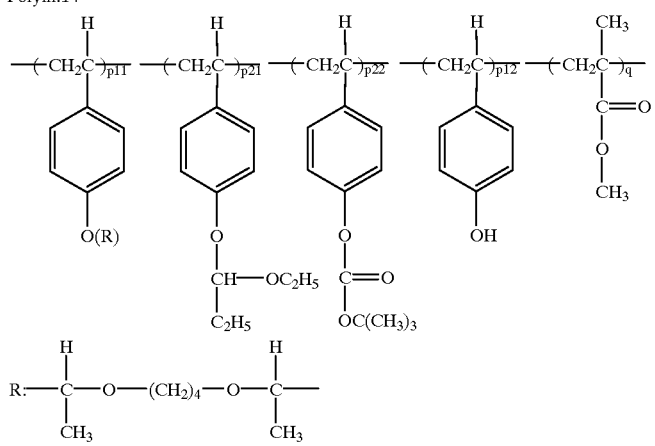
Polym.15
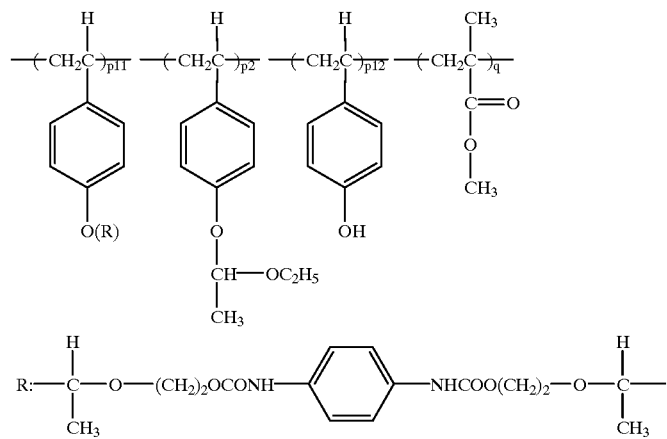

Polym.16
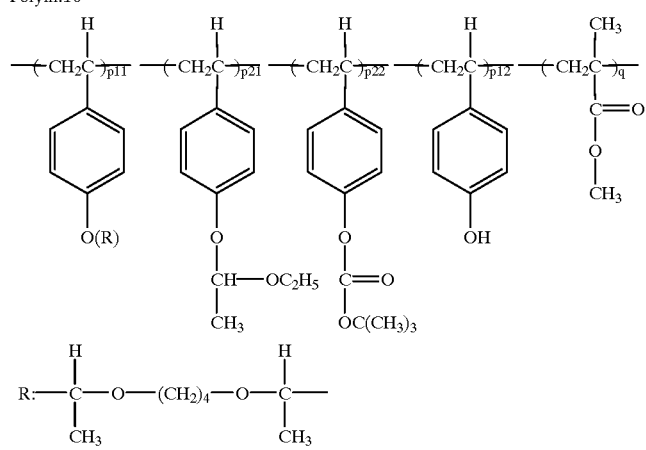
Polym.17
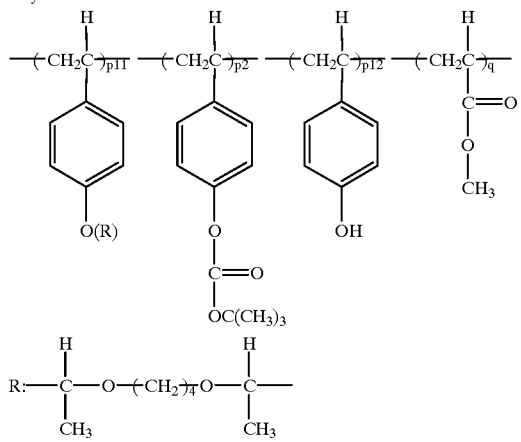
Polym.18
Mw = 14,000
Mw/Mn = 1.1
p2/(p2 + p1) = 0.35
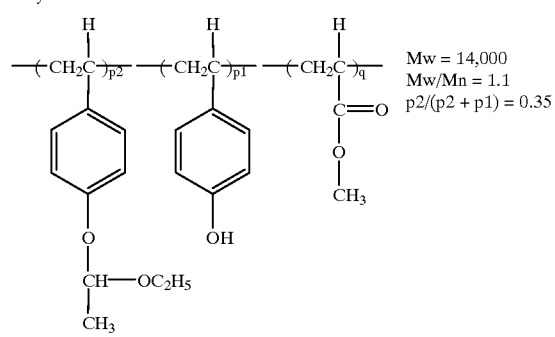
Polym.19
Mw = 14,000
Mw/Mn = 1.1
p2/(p2 + p1) = 0.20
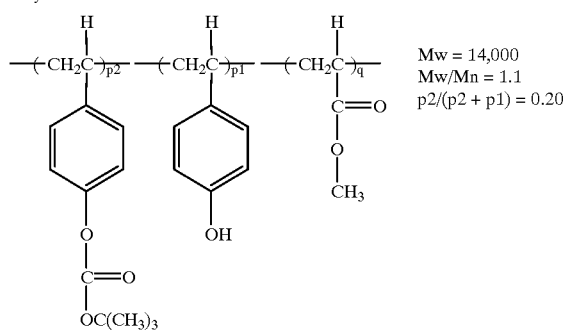

Polym.20
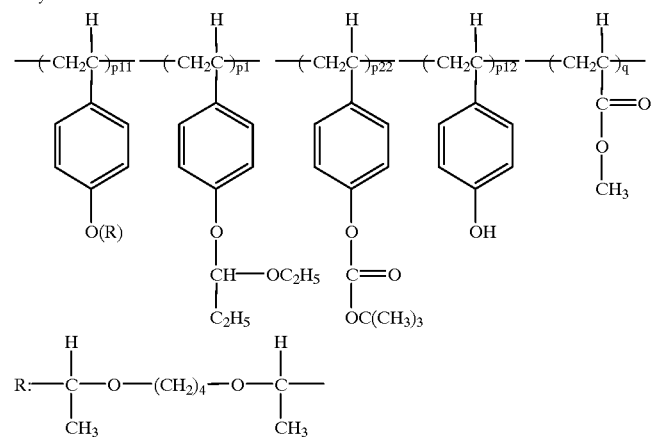
Polym.21
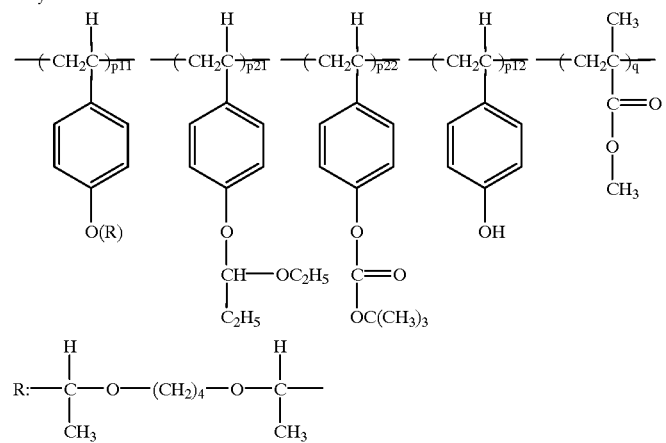
Polym.22
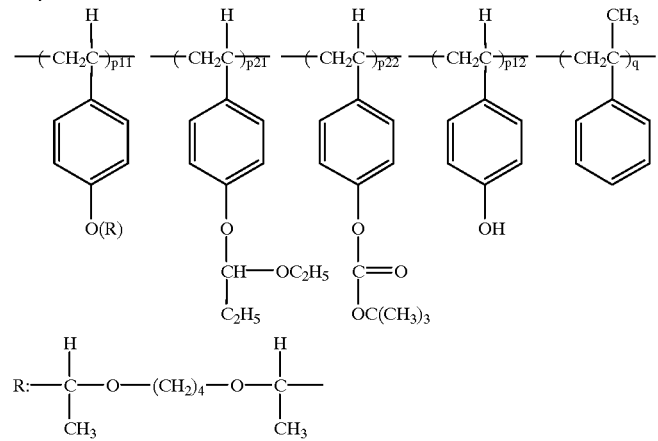

-continued
Polym.23
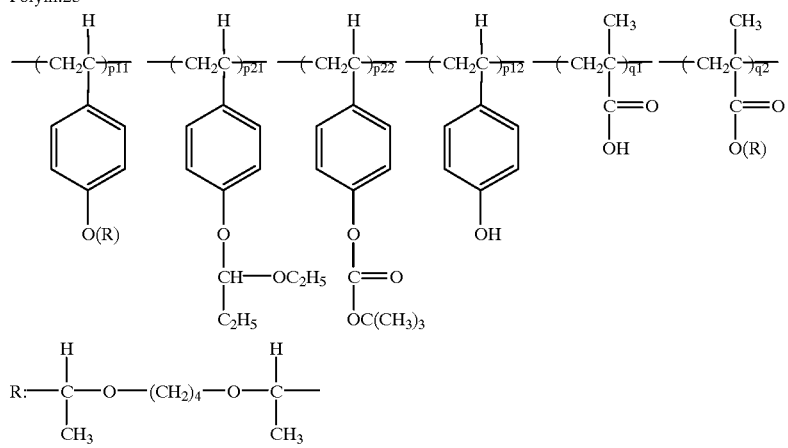
Polym.24
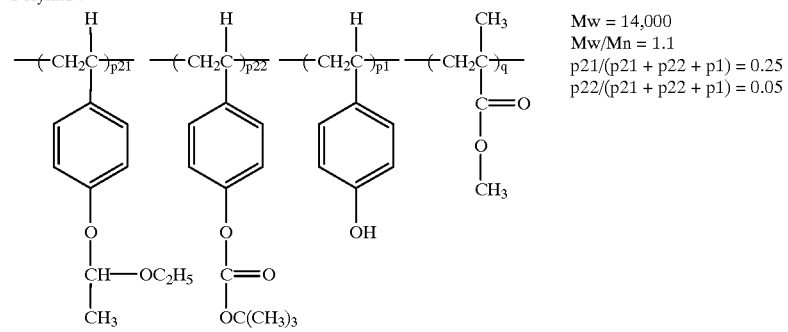
Mw = 14,000
Mw/Mn = 1.1
p21/(p21 + p22 + p1) = 0.25
p22/(p21 + p22 + p1) = 0.05
Polym.25
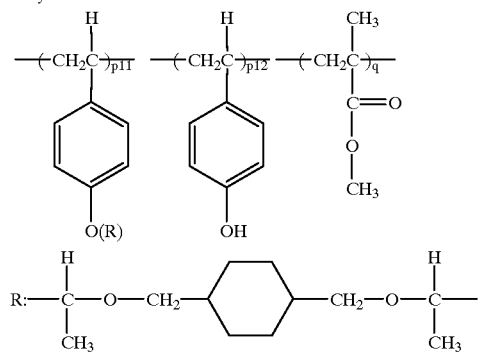

-continued
Polym. 26
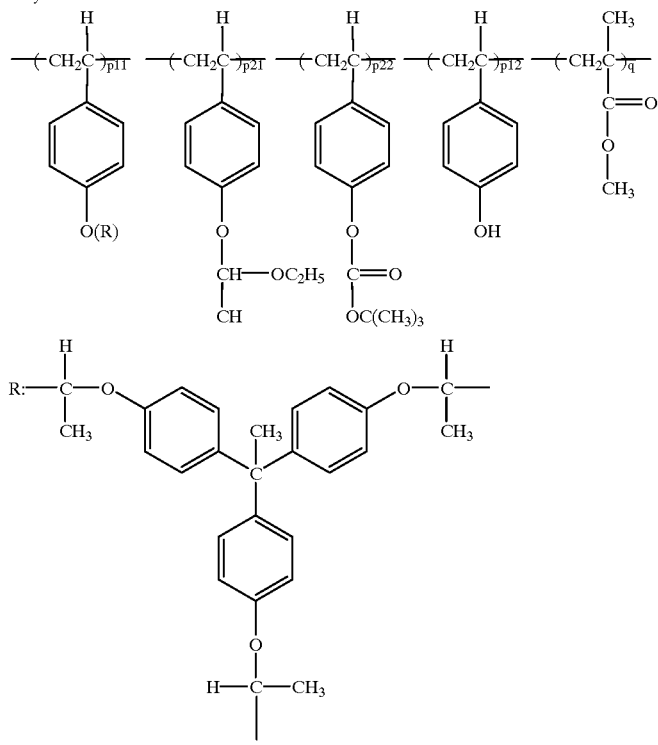
TABLE 1
| Synthesis Example | Compositional ratio | | | | | | Mw of P(HS/MMA) | Mw/Mn of P(HS/MMA) | Mw of polymer |
|---|---|---|---|---|---|---|---|---|---|
| | p1 | | p2 | | q | | | | |
| | p11 | p12 | p21 | p22 | q1 | q2 | | | |
| 6 [Polym. 6] | 2.4 | 56 | 21.6 | | 20 | 0 | 12,000 | 1.1 | 18,000 |
| 7 ]Polym. 7] | 2.4 | 49.6 | 21.6 | 6.4 | 20 | 0 | 12,000 | 1.1 | 19,000 |
| 8 ]Polym. 8] | 8 | 52.8 | 19.2 | | 20 | 0 | 12,000 | 1.1 | 35,000 |
| 9 ]Polym. 9] | 5.6 | 62.4 | 8 | 4 | 20 | 0 | 12,000 | 1.1 | 27,000 |
| 10 ]Polym. 10] | 3.2 | 48.8 | 28 | | 20 | 0 | 12,000 | 1.1 | 21,000 |
| 11 ]Polym. 11] | 5.6 | 54.4 | 20 | | 20 | 0 | 12,000 | 1.1 | 28,000 |
| 12 ]Polym. 12] | 8 | 56 | 16 | | 20 | 0 | 12,000 | 1.1 | 36,000 |
| 13 ]Polym. 13] | 4.4 | 54.8 | 20.8 | | 20 | 0 | 12,000 | 1.1 | 25,000 |
| 14 ]Polym. 14] | 4.4 | 54.2 | 16.8 | 4 | 20 | 0 | 12,000 | 1.1 | 25,000 |
| 15 ]Polym. 15] | 1.0 | 54.2 | 24.8 | | 20 | 0 | 12,000 | 1.1 | 16,000 |
| 16 ]Polym. 16] | 4.4 | 57.2 | 14.4 | 4 | 20 | 0 | 12,000 | 1.1 | 24,000 |
| 17 ]Polym. 17] | 3.2 | 62.4 | 14.4 | | 20 | 0 | 12,000 | 1.1 | 20,000 |
| 18 ]Polym. 18] | 0 | 52 | 28 | | 20 | 0 | 12,000 | 1.1 | 14,000 |
| 19 ]Polym. 19] | 0 | 64 | 16 | | 20 | 0 | 12,000 | 1.1 | 14,000 |
| 20 ]Polym. 20] | 5 | 70 | 16 | 4 | 5 | 0 | 11,000 | 1.5 | 25,000 |
| 21 ]Polym. 21] | 5 | 37 | 17 | 3 | 38 | 0 | 7,000 | 1.2 | 20,000 |
| 22 | 4 | 65 | 16 | 5 | 10 | 0 | 13,000 | 1.2 | 21,000 |

TABLE 1-continued

| Synthesis Example | Compositional ratio | | | | | | Mw of P(HS/MMA) | Mw/Mn of P(HS/MMA) | Mw of polymer |
|---|---|---|---|---|---|---|---|---|---|
| | p1 | | p2 | | q | | | | |
| | p11 | p12 | p21 | p22 | q1 | q2 | | | |
| 23 [Polym. 22] | 5 | 64 | 20 | 6 | 4 | 1 | 12,000 | 1.2 | 26,000 |
| 24 [Polym. 23] | 0 | 56 | 20 | 4 | 20 | 0 | 12,000 | 1.1 | 14,000 |
| 25 [Polym. 24] | 12 | 68 | 0 | 0 | 20 | 0 | 12,000 | 1.1 | 48,000 |
| 26 [Polym. 25] | 2 | 50 | 22 | 6 | 20 | 0 | 12,000 | 1.1 | 25,000 |
| [Polym. 26] | | | | | | | | | |

Examples 1–26 & Comparative Example 1–4

Liquid resist compositions were prepared by dissolving a polymer designated (Polym.6–17, 20–23 or 26) as a base resin, a photoacid generator designated PAG.1 to PAG.12, a dissolution regulator designated DRR.1 to DRR.4, a basic compound as shown in Tables 2 and 3, an aromatic compound having a group ≡C—COOH within a molecule designated ACC.1 or ACC.2, and a UV absorber designated DYE.1 or DYE.2 in a solvent in accordance with the formulation shown in Tables 2 and 3. If necessary, 0.1 part of a surfactant Florade FC-430 by Sumitomo 3M K.K. was added for facilitating film formation.

For comparison purposes, liquid resist compositions were similarly prepared in accordance with the formulation shown in Table 4 using a polymer designated (Polym.18, 19, 24 or 25) as the base resin.

Each of the compositions was passed through a 0.1-μm Teflon® filter. The liquid resist composition was then spin coated onto a silicon wafer. With the silicon wafer rested on a hot plate at 100° C., the coating was pre-baked for 90 seconds. The film was exposed to light by means of an excimer laser stepper model NSR-2005EX (manufactured by Nikon K.K., numerical aperture NA=0.5) through a mask having a desired pattern, baked at 110° C. for 90 seconds, and developed with an aqueous solution of 2.38% tetramethylammonium hydroxide, obtaining a positive pattern.

The resulting resist pattern was evaluated as follows. First, a sensitivity (Eth value) was determined. Provided that the exposure dose with which the top and bottom of a 0.24μm line-and-space pattern were resolved at 1:1 was the optimum exposure dose (sensitivity Eop), the minimum line width of a line-and-space pattern which was recognized separate at this exposure dose was the resolution of a test resist. The resolution was also determined under the same conditions except that the post-exposure delay (PED) time from exposure to heat treatment was 2 hours. The profile of the resist pattern resolved was observed under a scanning electron microscope.

In a heat resistance test, each resist pattern was heated on a hot plate at 130° C. for 10 minutes to observe any change of pattern shape before and after heating. The resist pattern was rated "O" (passed) for no change of pattern shape before and after heating and "X" (rejected) when the pattern was degraded by sagging after heating.

Tables 2 and 4 show the formulation of resist compositions. The test results of Examples and Comparative Examples are shown in Tables 5 and 6, respectively.

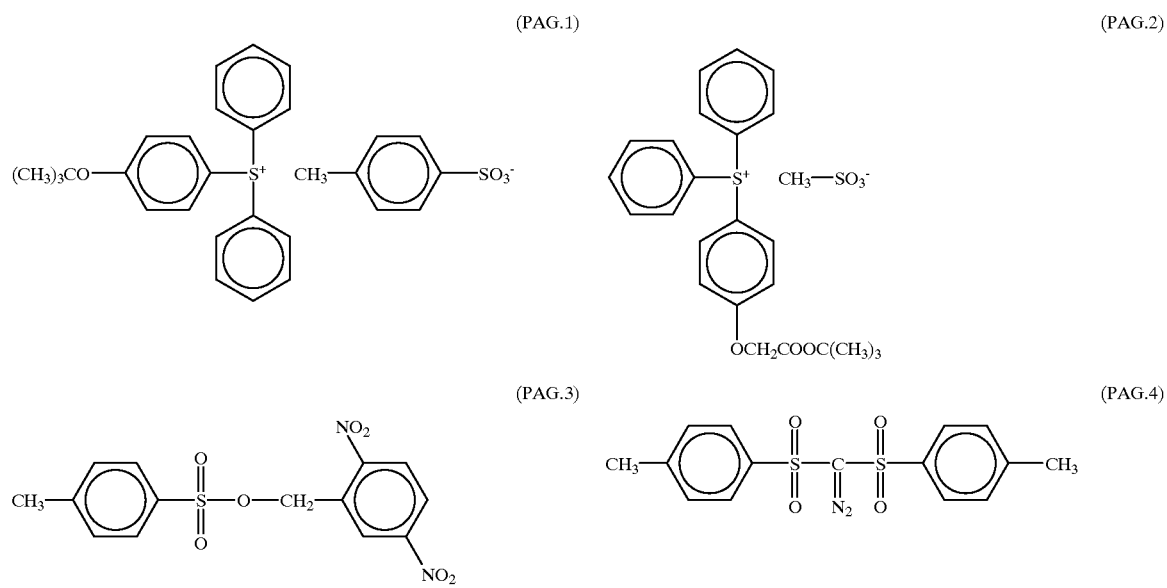

-continued
(PAG.5)
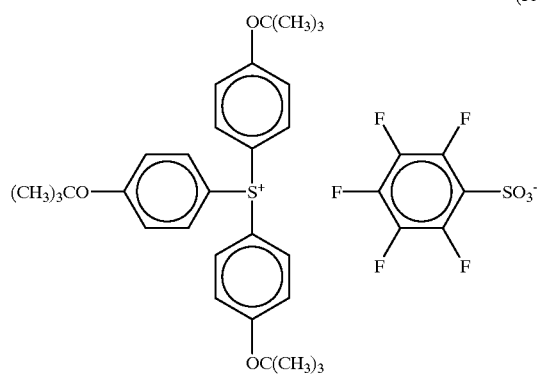
(PAG.6)
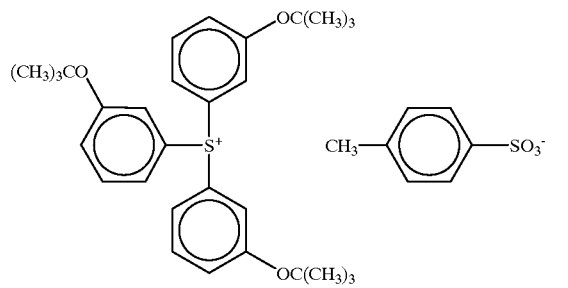
(PAG.7)
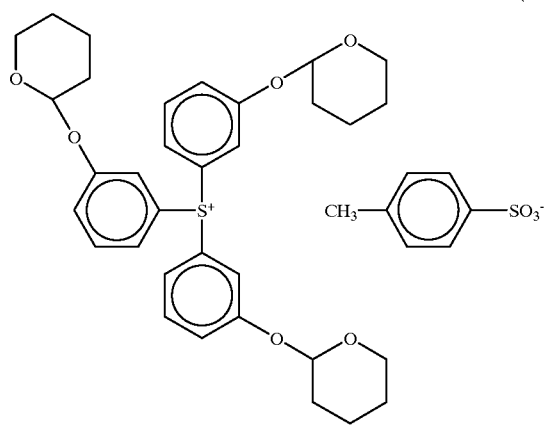
(PAG.8)
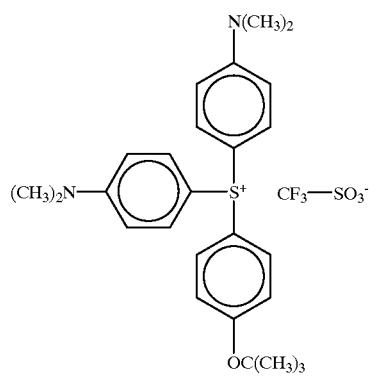
(PAG.9)
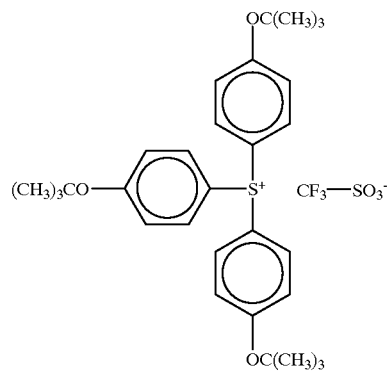
(PAG.10)
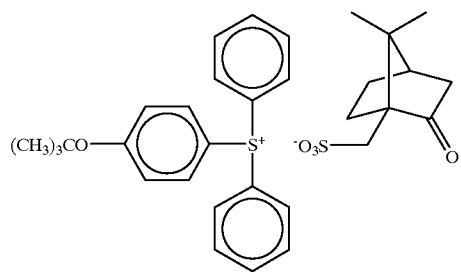
(PAG.11)
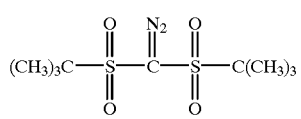
(PAG.12)
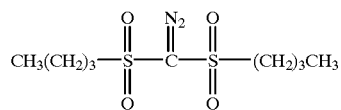
(PAG.13)
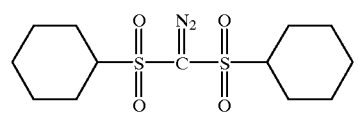
(PAG.14)
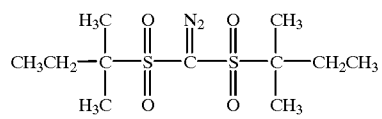

-continued
(PAG.15)
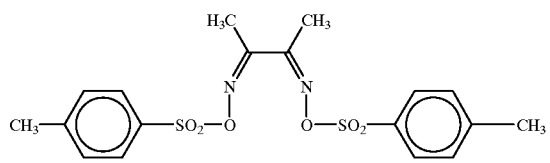
(DRR.1)
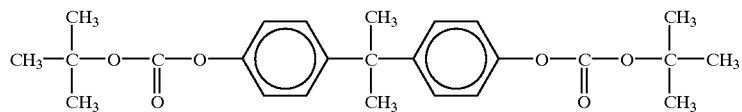
(DRR.2)
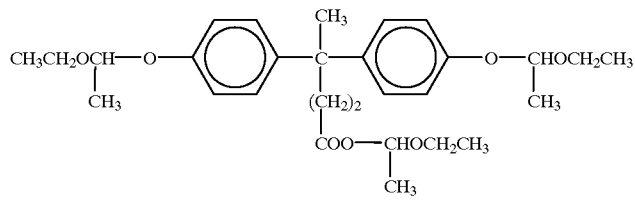
(DRR.3)
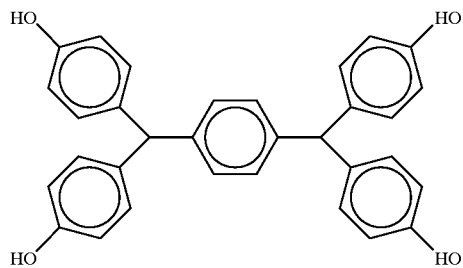
acid labile group: tert-butoxycarbonyl
average substitution: 50%
(DRR.4)
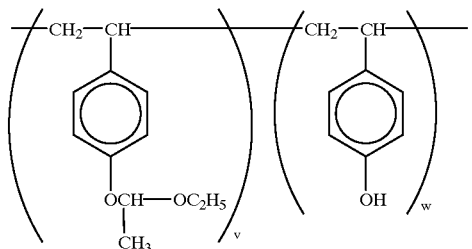
$v/(v + w) = 0.09$
weight average molecular weight: 3,000
ACC.1
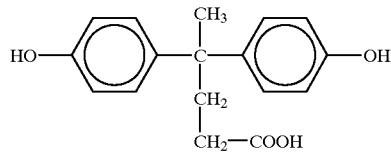
ACC.2
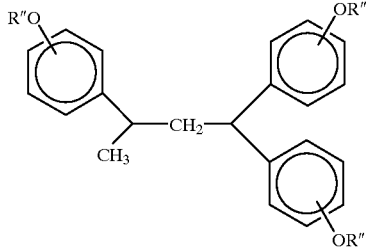
$$R'' = H \text{ or } CH_2COOH$$
$$\frac{[CH_2COOH]}{[H] + [CH_2COOH]} = 0.5$$
DYE.1
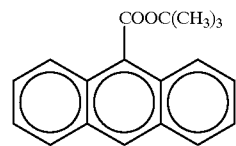
DYE.2
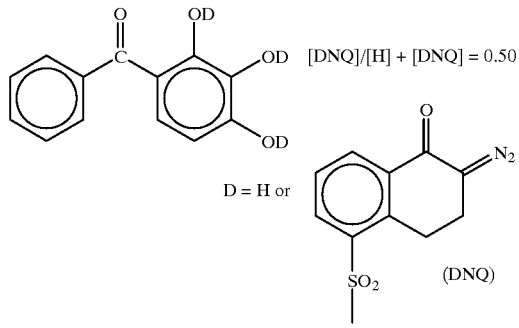
$[DNQ]/[H] + [DNQ] = 0.50$
$D = H$ or (DNQ)

TABLE 2

| No. | Base resin | Photoacid generator | Dissolution regulator | Basic compound | Other additive | Organic solvent |
|---|---|---|---|---|---|---|
| E1 | Polym. 6 (80) | PAG. 1 (3) | — | — | — | PGMEA (530) |
| E2 | Polym. 7 (80) | PAG. 2 (3) | — | — | — | PGMEA (530) |
| E3 | Polym. 8 (80) | PAG. 3 (3) | — | — | — | DGLM (300) |
| E4 | Polym. 9 (80) | PAG. 4 (3) | — | triethanolamine (0.1) | — | PGMEA (530) |
| E5 | Polym. 10 (80) | PAG. 5 (3) | — | 2-hydroxypyridine (0.11) | — | PGMEA (530) |
| E6 | Polym. 11 (80) | PAG. 6 (3) | DRR. 1 (16) | tetraethylenediamine (0.09) | — | PGMEA (530) |
| E7 | Polym. 12 (80) | PAG. 1 (3.5) PAG. 8 (0.5) | DRR. 3 (16) | quinoline (0.09) | — | EIPA (580) |
| E8 | Polym. 13 (80) | PAG. 1 (1) PAG. 11 (2) | — | N-ethyldiethanolamine (0.1) piperdine ethanol (0.05) | ACC. 1 (0.2) | PGMEA (530) |
| E9 | Polym. 14 (80) | PAG. 1 (1) PAG. 12 (2) | — | triethanolamine (0.1) 1,8-diazabicycloundecene (0.05) | ACC. 1 (0.5) | PGMEA (530) |
| E10 | Polym. 15 (80) | PAG. 9 (2) PAG. 7 (1) | — | — | — | EL/BA (510) |
| E11 | Polym. 16 (80) | PAG. 9 (2) PAG. 10 (1) | DRR. 4 (8) | N,N-dimethylacetamide (5.0) | — | EL/BA (510) |
| E12 | Polym. 15 (50) Polym. 17 (30) | PAG. 1 (4) | — | tributylamine (0.03) | — | PGMEA (530) |
| E13 | Polym. 14 (35) Polym. 19 (45) | PAG. 9 (4) | — | N,N-diethylethanolamine (0.1) | ACC. 1 (1) | PGMEA/EL (530) |

TABLE 3

| No. | Base resin | Photoacid generator | Dissolution regulator | Basic compound | Other additive | Organic solvent |
|---|---|---|---|---|---|---|
| E14 | Polym. 13 (80) | PAG. 1 (1) PAG. 11 (2) | — | N,N,N',N'-tetramethylethylenediamine (0.05) | DYE. 1 (1.2) | PGMEA (530) |
| E15 | Polym. 14 (80) | PAG. 1 (1) PAG. 11 (2) | — | piperidine ethanol (0.05) | DYE. 2 (4) | PGMEA (530) |
| E16 | Polym. 15 (80) | PAG. 1 (1) PAG. 12 (2) | — | — | ACC. 1 (0.2) | PGMEA (530) |
| E17 | Polym. 16 (80) | PAG. 1 (1) PAG. 12 (2) | — | piperidine ethanol (0.05) | DYE. 2 (4) ACC. 1 (0.2) | PGMEA (530) |
| E18 | Polym. 6 (80) | PAG. 1 (1) PAG. 13 (1) | DRR. 1 (4) DRR. 3 (4) | N-methylpyrrolidone (0.05) | — | PGMEA/EP (530) |
| E19 | Polym. 6 (80) | PAG. 1 (1) PAG. 14 (1) | DRR. 2 (4) DRR. 4 (4) | N-methylpyrrolidone (0.05) | — | PGMEA/CH (530) |
| E20 | Polym. 26 (80) | PAG. 1 (2) | — | tris{2-(2-methoxymethoxy)ethyl}amine (0.1) | — | PGMEA (530) |
| E21 | Polym. 7 (80) | PAG. 1 (2) | — | N-methylpyrrolidone (0.05) | — | PGMEA (530) |
| E22 | Polym. 17 (80) | PAG. 1 (1.5) | — | triethanolamine (0.08) | — | PGMEA (530) |
| E23 | Polym. 20 (80) | PAG. 1 (1) PAG. 11 (2) | — | piperidine ethanol (0.05) | DYE. 2 (4) | PGMEA (530) |
| E24 | Polym. 21 (80) | PAG. 1 (1) PAG. 11 (2) | — | piperidine ethanol (0.05) | DYE. 2 (4) | PGMEA (530) |
| E25 | Polym. 22 (80) | PAG. 1 (1) PAG. 11 (2) | — | piperidine ethanol (0.05) | DYE. 2 (4) | PGMEA (530) |
| E26 | Polym. 23 (80) | PAG. 1 (1) PAG. 11 (2) | — | piperidine ethanol (0.05) | DYE. 2 (4) | PGMEA (530) |

TABLE 4

| No. | Base resin | Photoacid generator | Dissolution regulator | Basic compound | Other additive | Organic solvent |
|---|---|---|---|---|---|---|
| CE1 | Polym. 18 (80) | PAG. 1 (2) | — | N-methylpyrrolidone (0.05) | — | PGMEA (530) |
| CE2 | Polym. 19 (80) | PAG. 1 (2) | — | N-methylpyrrolidone (0.05) | — | PGMEA (530) |
| CE3 | Polym. 24 (80) | PAG. 1 (2) | — | N-methylpyrrolidone (0.05) | — | PGMEA (530) |
| CE4 | Polym. 25 (80) | PAG. 1 (2) | — | N-methylpyrrolidone (0.05) | — | PGMEA (530) |

TABLE 5

| Example | Sensitivity Eop (mJ/cm$^2$) | Resolution ($\mu$m) Instant | Resolution ($\mu$m) PED 2 hr. | Profile Instant/PED 2 hr. | Heat resistance |
|---|---|---|---|---|---|
| 1 | 6.0 | 0.20 | 0.20 | rectangular | ◯ |
| 2 | 7.0 | 0.20 | 0.20 | rectangular | ◯ |
| 3 | 8.0 | 0.20 | 0.20 | rectangular | ◯ |
| 4 | 30.0 | 0.18 | 0.20 | rectangular | ◯ |
| 5 | 35.0 | 0.18 | 0.20 | rectangular | ◯ |
| 6 | 25.0 | 0.18 | 0.18 | rectangular | ◯ |
| 7 | 18.0 | 0.18 | 0.18 | rectangular | ◯ |
| 8 | 31.0 | 0.18 | 0.18 | rectangular | ◯ |
| 9 | 30.0 | 0.18 | 0.18 | rectangular | ◯ |
| 10 | 26.0 | 0.18 | 0.18 | rectangular | ◯ |
| 11 | 20.0 | 0.18 | 0.18 | rectangular | ◯ |
| 12 | 24.0 | 0.18 | 0.18 | rectangular | ◯ |
| 13 | 22.0 | 0.18 | 0.18 | rectangular | ◯ |
| 14 | 23.0 | 0.20 | 0.20 | sl. forward tapered | ◯ |
| 15 | 24.0 | 0.20 | 0.20 | sl. forward tapered | ◯ |
| 16 | 23.0 | 0.20 | 0.20 | sl. forward tapered | ◯ |
| 17 | 24.0 | 0.20 | 0.20 | sl. forward tapered | ◯ |
| 18 | 19.0 | 0.18 | 0.18 | rectangular | ◯ |
| 19 | 20.0 | 0.18 | 0.18 | rectangular | ◯ |
| 20 | 20.0 | 0.18 | 0.18 | rectangular | ◯ |
| 21 | 21.0 | 0.18 | 0.18 | rectangular | ◯ |
| 22 | 28.0 | 0.20 | 0.20 | rectangular | ◯ |
| 23 | 24.0 | 0.18 | 0.18 | rectangular | ◯ |
| 24 | 20.0 | 0.18 | 0.18 | rectangular | ◯ |
| 25 | 24.0 | 0.20 | 0.20 | rectangular | ◯ |
| 26 | 18.0 | 0.18 | 0.18 | rectangular | ◯ |

TABLE 6

| Comparative Example | Sensitivity Eop (mJ/cm$^2$) | Resolution ($\mu$m) Instant | Resolution ($\mu$m) PED 2 hr. | Profile Instant/PED 2 hr. | Heat resistance |
|---|---|---|---|---|---|
| 1 | 20.0 | 0.22 | 0.20 | rectangular/ reverse tapered | X |
| 2 | 22.0 | 0.22 | not resolved | rectangular/ not resolved | X |
| 3 | 21.0 | 0.22 | 0.26 | rectangular/ T-top | X |
| 4 | 17.0 | 0.36 | 0.24 | rectangular/ reverse tapered | ◯ |

Additionally, an acetylene alcohol derivative, Surfy-nol E1004 (Nisshin Chemical Industry K.K.) of the structural formula shown below was added to the resist compositions of Examples 1, 4, 11 and 14 in an amount of 0.05% by weight of the composition. The Surfy-nol-containing compositions and Surfy-nol-free compositions were allowed to stand and observed whether or not particles (foreign matter) increased as a rating of storage stability. The test was an accelerated test of storage at 40° C. for 4 months. Using a counter KL-20A (Rion K.K.) for counting the number of particles in liquid, particles having a particle size of more than 0.3 $\mu$m were monitored. The results are shown in Table 7.

Surfy-nol E1004

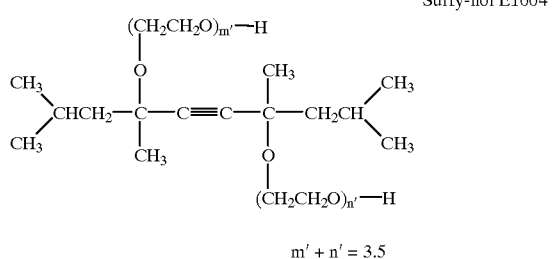

m' + n' = 3.5

TABLE 7

| | Count of particles per ml | | |
|---|---|---|---|
| | As filtered | Surfy-nol-free After 4 months | Surfy-nol added After 4 months |
| Example 1 | 4 | 25 | 6 |
| Example 4 | 5 | 23 | 8 |
| Example 11 | 4 | 18 | 4 |
| Example 14 | 4 | 22 | 5 |

Although some preferred embodiments have been described, many modifications and variations may be made thereto in the light of the above teachings. It is therefore to be understood that within the scope of the appended claims, the invention may be practiced otherwise than as specifically described.

What is claimed is:

1. A polymer comprising recurring units of formula (1), wherein at least one of the hydrogen atoms of phenolic hydroxyl and/or carboxyl is independently replaced by an acid labile group, the polymer is crosslinked within a molecule and/or between molecules with a crosslinking group having a C—O—C linkage resulting from reaction of some of the remaining phenolic hydroxyls and/or carboxyls with an alkenyl ether or halogenated alkyl ether, the amount of the acid labile group and the crosslinking group combined is on the average from more than 0 mol % to 80 mol % of the entirety of the phenolic hydroxyl and carboxyl in formula (I), and the polymer has a weight average molecular weight of 1,000 to 500,000, wherein formula (1) is

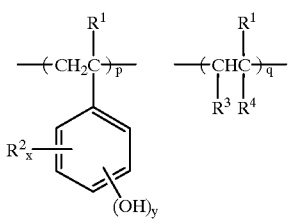

(1)

wherein $R^1$ is hydrogen or methyl, $R^2$ is a normal, branched or cyclic alkyl of 1 to 8 carbon atoms, $R^3$ is hydrogen, $R^4$ is —COOR$^5$, $R^5$ is hydrogen or normal, branched or cyclic alkyl of 1 to 8 carbon atoms, x is 0 or a positive integer, y is a positive integer, the sum of x+y is up to 5, p and q are positive numbers satisfying p+q=1 and 0<q/(p+q)≦0.9.

2. The polymer of claim 1 comprising recurring units of formula (2), wherein the polymer is crosslinked within a molecule and/or between molecules with a crosslinking group having a C—O—C linkage resulting from reaction of some of the phenolic hydroxyls and/or carboxyls represented by R with an alkenyl ether or halogenated alkyl ether, the amount of the acid labile group and the crosslinking group combined is on the average from more than 0 mol % to 80 mol % of the entirety of the phenolic hydroxyl and carboxyl in a formula (1), and the polymer has a weight average molecular weight of 1,000 to 500,000, wherein formula (2) is

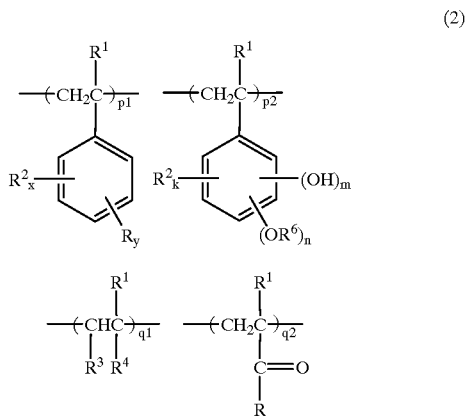

(2)

wherein R is hydroxyl or OR$^6$, at least one R is hydroxyl, $R^1$ is hydrogen or methyl, $R^2$ is normal, branched or cyclic alkyl of 1 to 8 carbon atoms, $R^3$ is hydrogen, $R^4$ is —COOR$^5$, $R^5$ is hydrogen or normal, branched or cyclic alkyl of 1 to 8 carbon atoms, $R^6$ is an acid labile group, x is 0 or a positive integer, y is a positive integer, the sum of x+y is up to 5, k and m are 0 or positive integers, n is a positive integer, the sum of k+m+n is up to 5, p1 and p2 are positive numbers, q1 and q2 are 0 or positive numbers, q1 and q2 are not equal to 0 at the same time, and p1, p2, q1 and q2 satisfy 0<p1/(p1+p2+q1+q2)<0.8, 0<p2/(p1+p2+q1+q2)<0.8, 0<(p1+q2)/(p1+p2+q1+q2)<0.8, and p1+p2+q1+q2=1.

3. The polymer of claim 2 comprising recurring units of formula (3), some hydrogen atoms being eliminated from phenolic hydroxyls and/or carboxyls represented by R to leave oxygen atoms which are crosslinked with a crosslinking group having a C—O—C linkage of formula (4a) or (4b) within a molecule and/or between molecules, the amount of the acid labile group and the crosslinking group combined being on the average from more then 0 mol % to 80 mol % of the entirety of the phenolic hydroxyl and carboxyl in formula (1), and the polymer having a weight average molecular weight of 1,000 to 500,000, wherein formula (3) is

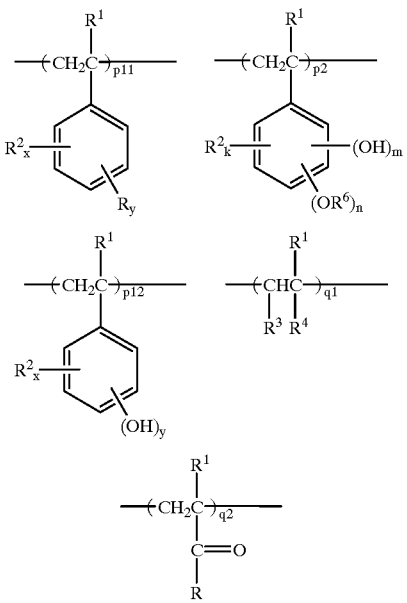

wherein R is hydroxyl or $OR^6$, $R^1$ is hydrogen or methyl, $R^2$ is normal, branched or cyclic alkyl of 1 to 8 carbon atoms, $R^3$ is hydrogen, $R^4$ is $-COOR^5$, $R^5$ is hydrogen or normal, branched or cyclic alkyl of 1 to 8 carbon atoms, $R^6$ is of formula (5) or (6), tertiary alkyl of 4 to 20 carbon atoms, trialkylsilyl whose alkyl groups each have 1 to 6 carbon atoms or oxoalkyl of 4 to 20 carbon atoms, p11, p12 and p2 are positive numbers, q1 and q2 are 0 or positive numbers, q1 and q2 are not equal to 0 at the same time, and p11, p12, p2, q1 and q2 satisfy $0<p11/(p11+p12+p2+q1+q2)<0.8$, $0<p2/(p11+p12+p2+q1+q2)<0.8$, $0(p11+p12+q2)/(p11+p12+p2+q1+q2)<0.8$, and $p11+p12+p2+q1+q2=1$, x is 0 or a positive integer, y is a positive integer, the sum of x+y is up to 5, k and m are 0 or positive integers, n is a positive integer, the sum of k+m+n is up to 5,
wherein formula (4a) and (4b) are

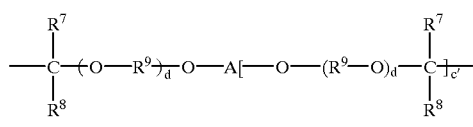

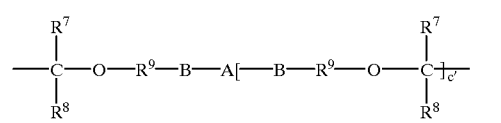

wherein $R^7$ and $R^8$ each are hydrogen or normal, branched or cyclic alkyl of 1 to 8 carbon atoms, or $R^7$ and $R^8$, taken together, form a ring, with the proviso that each of $R^7$ and $R^8$ is normal or branched alkylene of 1 to 8 carbon atoms when they form a ring, $R^9$ is normal or branched alkylene of 1 to 10 carbon atoms, d is 0 or an integer of 1 to 10, A is a c-valent aliphatic or alicyclic saturated hydrocarbon, aromatic hydrocarbon or heterocycle of 1 to 50 carbon atoms, which may have an intervening hetero atom and in which the hydrogen atom attached to a carbon atom may be partially replaced by hydroxyl, carboxyl, acyl or fluorine, B is —CO—O—, —NHCO—O or —NHCON—, c is an integer of 2 to 8, and c' is an integer of 1 to 7,
and wherein formula (5) and (6) are

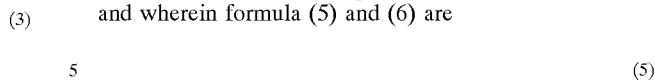

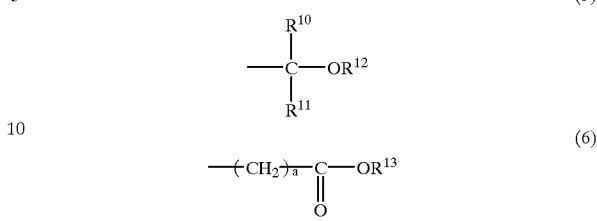

wherein $R^{10}$ and $R^{11}$ each are hydrogen or normal, branched or cyclic alkyl of 1 to 8 carbon atoms, $R^{12}$ is monovalent hydrocarbon of 1 to 18 carbon atoms which may have a hetero atom, or $R^{10}$ and $R^{11}$, and $R^{10}$ and $R^{12}$, or $R^{11}$ and $R^{12}$, taken together, form a ring, with the proviso that each of $R^{10}$, $R^{11}$ and $R^{12}$ is normal or branched alkylene of 1 to 18 carbon atoms when the form a ring, $R^{13}$ is tertiary alkyl, of 4 to 20 carbon atoms, trialkylsilyl whose alkyls each have 1 to 6 carbon atoms, oxoalkyl of 4 to 20 carbon atoms or a group of formula (5), and a is an integer of 0 to 6.

4. The polymer of claim 3 wherein the crosslinking group having a C—O—C linkage of formula (4a) or (4b) is represented by formula (4a''') or (4b'''):

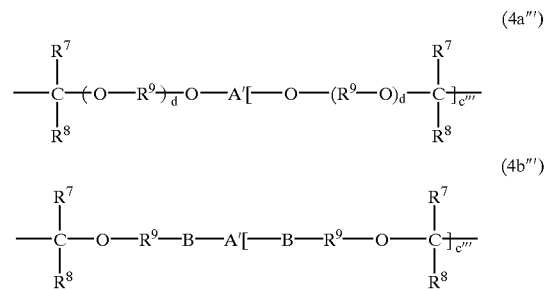

wherein $R^7$ and $R^8$ each are hydrogen or normal, branched or cyclic alkyl of 1 to 8 carbon atoms, or $R^7$ and $R^8$, taken together, form a ring, with the proviso that each of $R^7$ and $R^8$ is normal or branched alkylene of 1 to 8 carbon atoms when they form a ring, $R^9$ is normal or branched alkylene of 1 to 10 carbon atoms, d is 0 or an integer of 1 to 5, A' is c''-valent normal or branched alkylene, alkyltriyl or alkyltetrayl of 1 to 20 carbon atoms or arylene of 6 to 30 carbon atoms, which may have an intervening hetero atom and in which the hydrogen atom attached to a carbon atom may be partially replaced by hydroxyl, carboxyl, acyl or fluorine, B is —CO—O—, —NHCO—O— or —NHCONH—, c'' is an integer of 2 to 4, and c''' is an integer of 1 to 3.

5. A chemically amplified positive resist composition comprising
(A) an organic solvent,
(B) a base resin in the form of the polymer of claim 1, and
(C) a photoacid generator.

6. The resist composition of claim 5 further comprising
(D) another base resin in the form of a polymer comprising recurring units of formula (1), some of the hydrogen atoms of phenolic hydroxyls and/or carboxyls being replaced independently by an acid labile group in an average proportion of 0 mol % to 80 mol % of the entirety, said polymer having a weight average molecular weight of 3,000 to 300,000, wherein formula (1) is (1)

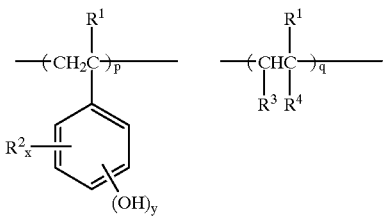

wherein $R^1$ is hydrogen or methyl, $R^2$ is normal, branched or cyclic alkyl of 1 to 8 carbon atoms, $R^3$ is hydrogen, $R^4$ is —$COOR^5$, $R^5$ is hydrogen or normal, branched or cyclic alkyl of 1 to 8 carbon atoms, x is 0 or a positive integer, y is a positive integer, the sum of x+y is up to 5, p and q are positive numbers satisfying p+q=1 and 0<q/(p+q)≦0.9.

7. The resist composition of claim 5 further comprising (E) a dissolution regulator.

8. The resist composition of claim 5 further comprising (F) a basic compound.

9. The resist composition of claim 5 further comprising (G) an aromatic compound having ≡C—COOH.

10. The resist composition of claim 5 further comprising (H) a UV absorber.

11. The resist composition of claim 5 further comprising (I) an acetylene alcohol compound.

12. A chemically amplified positive resist composition comprising (A) an organic solvent, (B) a base resin in the form of the polymer of claim 2, and (C) a photoacid generator.

13. A chemically amplified positive resist composition comprising (A) an organic solvent, (B) a base resin in the form of the polymer of claim 3, and (C) a photoacid generator.

14. A chemically amplified positive resist composition comprising (A) an organic solvent, (B) a base resin in the form of the polymer of claim 4, and (C) a photoacid generator.

15. A method of making a polymer of formula (1) according to claim 1, comprising performing radical polymerization or living anion polymerization of monomers of formula (i), and/or (iii)

(i)

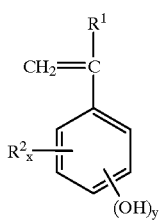

(iii)

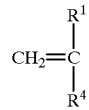

wherein $R^1$, $R^2$, $R^4$, x and y are as defined in claim 1.

16. A method of making a polymer of formula (2) according to claim 2, comprising performing radical polymerization or living anion polymerization of monomers of formula (i), (ii) and/or (iii)

(i)

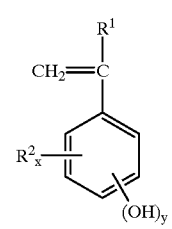

(ii)

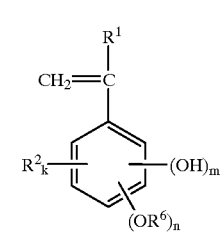

(iii)

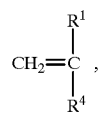

wherein $R^1$, $R^2$, $R^4$, $R^6$, x, y, k, m and n are as defined in claim 2.

17. The polymer of claim 1, wherein $R^2$ is an alkyl having 1–3 carbon atoms, said halogen of $R^4$ is Cl, Br, I or F, and y is 1 or 2.

18. The polymer of claim 2, wherein $R^6$ is a molecule of formula (5) or (6)

(5)

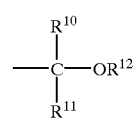

(6)

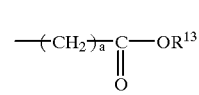

wherein $R^{10}$ and $R^{11}$ each are hydrogen or normal, branched or cyclic alkyl of 1 to 8 carbon atoms, $R^{12}$ is monovalent hydrocarbon of 1 to 18 carbon atoms which may have a hetero atom, or $R^{10}$ and $R^{11}$, $R^{10}$ and $R^{12}$, or $R^{11}$ and $R^{12}$, taken together, form a ring, with the proviso that each of $R^{10}$, $R^{11}$ and $R^{12}$ is normal or branched alkylene of 1 to 18 carbon atoms when the form a ring, $R^{13}$ is tertiary alkyl of 4 to 20 carbon atoms, trialkylsilyl whose alkyls each have 1 to 6 carbon atoms, oxoalkyl of 4 to 20 carbon atoms or a group of formula (5), and a is an integer of 0 to 6, and wherein $R^6$ is of formula (5) or (6), tertiary alkyl of 4 to 20 carbon atoms, trialkylsilyl whose alkyl groups each have 1 to 6 carbon atoms or oxoalkyl of 4 to 20 carbon atoms.

19. The polymer of claim 2, wherein n=1 or 2, m=0 or 1, $R^{10}$ and $R^{11}$ are each alkyl having 1 to 5 carbon atoms, $R^{12}$ has 1 to 8 carbon atoms, $R^{10}, R^{11}, R^{12}$ are each alkylene group having 1 to 8 carbon atoms when they form a ring, and $R^{13}$ has 4 to 10 carbon atoms.

20. The polymer of claim 1, wherein said crosslinking group has a C—O—C linkage of formula (4a) or (4b) with a molecule and/or between molecules

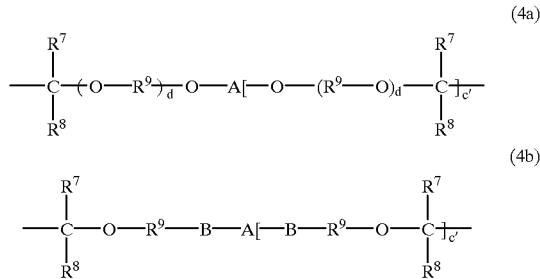

wherein $R^7$ and $R^8$ each are hydrogen or normal, branched or cyclic alkyl of 1 to 8 carbon atoms, or $R^7$ and $R^8$, taken together, form a ring, with the proviso that each of $R^7$ and $R^8$ is normal or branched alkylene of 1 to 8 carbon atoms when they form a ring, $R^9$ is normal or branched alkylene of 1 to 10 carbon atoms, d is 0 or an integer of 1 to 10, A is a c-valent aliphatic or alicyclic saturated hydrocarbon, aromatic hydrocarbon or heterocycle of 1 to 50 carbon atoms, which may have an intervening hetero atom and in which the hydrogen atom attached to a carbon atom may be partially replaced by hydroxyl, carboxyl, acyl or fluorine, B is —CO—O—, —NHCO—O or —NHCONH—, c is an integer of 2 to 8, and c' is an integer of 1 to 7.

21. The polymer of claim 2, wherein said crosslinking group has a C—O—C linkage of formula (4a) or (4b) with a molecule and/or between molecules

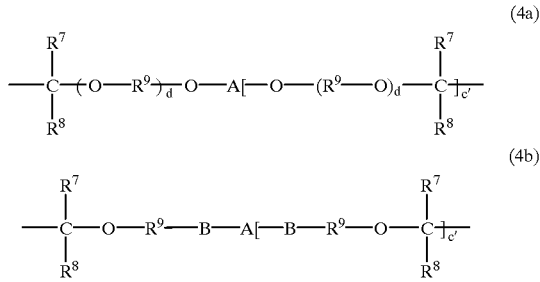

wherein $R^7$ and $R^8$ each are hydrogen or normal, branched or cyclic alkyl of 1 to 8 carbon atoms, or $R^7$ and $R^8$, taken together, form a ring, with the proviso that each of $R^7$ and $R^8$ is normal or branched alkylene of 1 to 8 carbon atoms when they form a ring, $R^9$ is normal or branched alkylene of 1 to 10 carbon atoms, d is 0 or an integer of 1 to 10, A is a c-valent aliphatic or alicyclic saturated hydrocarbon, aromatic hydrocarbon or heterocycle of 1 to 50 carbon atoms, which may have an intervening hetero atom and in which the hydrogen atom attached to a carbon atom may be partially replaced by hydroxyl, carboxyl, acyl or fluorine, B is —CO—O—, —NHCO—O or —NHCONH—, c is an integer of 2 to 8, and c' is an integer of 1 to 7.

22. The polymer of claim 1 wherein the amount of the acid labile group and the crosslinking group combined is from 2 to 50 mol % of the entirety of the phenolic hydroxyl and carboxyl groups in formula (1), and the weight average molecular weight of the polymer is 3,000 to 30,000.

23. The polymer of claim 3, wherein said intervening hetero atom of $R^9$ is O, NH, N(CH$_3$), S or SO$_2$, and wherein said hetero atom of $R^{12}$ is O.

24. The polymer of claim 4, wherein said intervening hetero atom of $R^9$ is O, NH, N(CH$_3$), S or SO$_2$.

\* \* \* \* \*